(12) United States Patent
Thomas et al.

(10) Patent No.: US 10,475,912 B2
(45) Date of Patent: *Nov. 12, 2019

(54) GATE ARRANGEMENTS IN QUANTUM DOT DEVICES

(71) Applicant: Intel Corporation, Santa Clara, CA (US)

(72) Inventors: Nicole K. Thomas, Portland, OR (US); Ravi Pillarisetty, Portland, OR (US); Kanwaljit Singh, Rotterdam (NL); Hubert C. George, Portland, OR (US); Jeanette M. Roberts, North Plains, OR (US); David J. Michalak, Portland, OR (US); Roman Caudillo, Portland, OR (US); Zachary R. Yoscovits, Beaverton, OR (US); Lester Lampert, Portland, OR (US); James S. Clarke, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/900,655

(22) Filed: Feb. 20, 2018

(65) Prior Publication Data

US 2019/0043974 A1 Feb. 7, 2019

(51) Int. Cl.
*H01L 39/00* (2006.01)
*H01L 29/778* (2006.01)
(Continued)

(52) U.S. Cl.
CPC .......... *H01L 29/778* (2013.01); *G06N 10/00* (2019.01); *H01L 29/51* (2013.01); *H01L 29/518* (2013.01);
(Continued)

(58) Field of Classification Search
None
See application file for complete search history.

(56) References Cited

U.S. PATENT DOCUMENTS

2013/0221330 A1* 8/2013 Choi .................. B82Y 10/00
257/39
2013/0264617 A1 10/2013 Joshi et al.
(Continued)

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
(Continued)

*Primary Examiner* — Benjamin P Sandvik
(74) *Attorney, Agent, or Firm* — Patent Capital Group

(57) ABSTRACT

Disclosed herein are quantum dot devices, as well as related computing devices and methods. For example, in some embodiments, a quantum dot device may include: a quantum well stack; a layer of gate dielectric above the quantum well stack; a first gate metal and a second gate metal above the layer of gate dielectric; and a gate wall between the first gate metal and the second gate metal, wherein the gate wall is above the layer of gate dielectric, and the gate wall includes a first dielectric material and a second dielectric material different from the first dielectric material.

21 Claims, 38 Drawing Sheets

(51) Int. Cl.
| | |
|---|---|
| H01L 29/78 | (2006.01) |
| H01L 29/51 | (2006.01) |
| H01L 29/66 | (2006.01) |
| G06N 10/00 | (2019.01) |
| H01L 39/02 | (2006.01) |
| H01L 29/82 | (2006.01) |

(52) U.S. Cl.
CPC .. H01L 29/66545 (2013.01); H01L 29/66977 (2013.01); H01L 29/7851 (2013.01); H01L 29/66431 (2013.01); H01L 29/7782 (2013.01); H01L 29/7786 (2013.01); H01L 29/785 (2013.01); H01L 29/82 (2013.01); H01L 39/02 (2013.01)

(56) References Cited

U.S. PATENT DOCUMENTS

| | | | | |
|---|---|---|---|---|
| 2016/0300155 | A1* | 10/2016 | Betz | H01L 39/025 |
| 2019/0043955 | A1* | 2/2019 | George | H01L 29/157 |
| 2019/0044049 | A1* | 2/2019 | Thomas | H01L 39/223 |
| 2019/0058117 | A1* | 2/2019 | Li | G11C 13/0007 |

OTHER PUBLICATIONS

"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.

"Platinum single-electron transistors with tunnel barriers made by atomic layer deposition", George et al., Department of Electrical Engineering, University of Notre Dame, Received Jul. 7, 2010:Published Nov. 5, 2010, 3 pages.
"Surface loss simulations of superconducting coplanar waveguide resonators," Wenner et al, Applied Physics Letters 99, 113513 (2011), pp. 113513-1 through 3.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 3.
"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).
"Radio frequency measurements of tunnel couplings and singlet-triplet spin states in Si:P quantum dots," House et al., Nature Communications, 6:884, DOI: 10.1038/ncomms9848, pp. 1-6.
"Detecting big-flip errors in a logical qubit using stabilizer measurements," Riste et al., Nature Communications, 6:6983, DOI: 10.1038/ncomms7983, pp. 1-6.
"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"Single-shot read-out of an individual electron spin in a quantum dot," Elzerman et al., Nature, vol. 430, Jul. 22, 2004, pp. 431-435.
"Suspending superconducting qubits by silicon micromachining," Chu et al., Department of Applied Physics, Yale University, Jun. 10, 2016, 10 pages.
"Single-charge tunneling in ambipolar silicon quantum dots," Müller, Filipp, Dissertation, University of Twente, Jun. 19, 2015, 148 pages.
"An addressable quantum dot qubit with fault-tolerant control-fidelity," Veldhorst et al., Nature Nanotechnology vol. 9, Dec. 2014, pp. 981-985.
"A two-quibit logic gate in silicon," Veldhorst et al., Nature, vol. 526, Dec. 15, 2015, pp. 410-414.

(56) References Cited

OTHER PUBLICATIONS

U.S. Appl. No. 15/900,674, filed Feb. 20, 2018, 93 pages.
U.S. Appl. No. 15/900,674, filed Feb. 20, 2018, Gate Arrangements in Quantum Dot Devices.
PCT/US2016/036830, Jun. 10, 2016, Gate Patterning for Quantum Dot Devices.
Non Final Office Action in U.S. Appl. No. 15/900,674 dated Mar. 22, 2019, 8 pages.

* cited by examiner

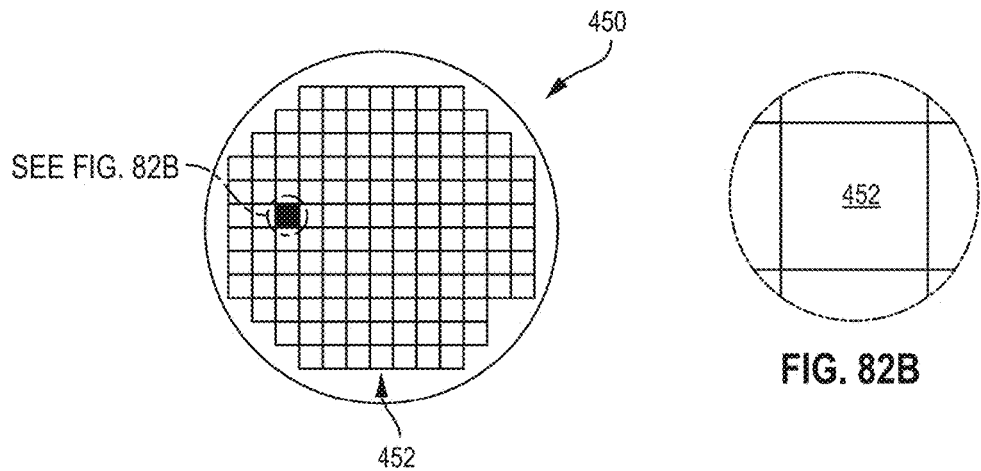
FIG. 82A
FIG. 82B
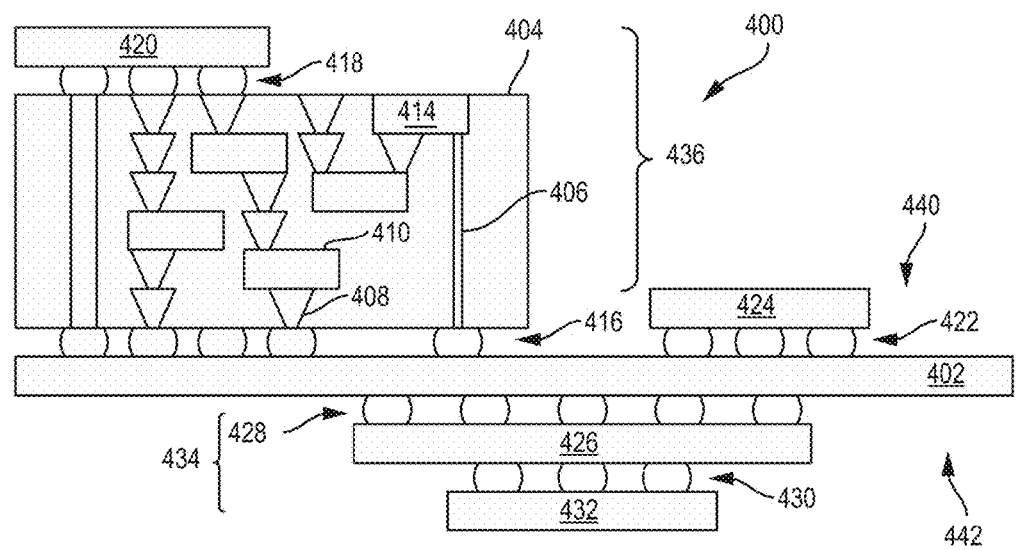
FIG. 83

GATE ARRANGEMENTS IN QUANTUM DOT DEVICES

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 82A and 82B are top views of a wafer and dies that may include any of the quantum dot devices disclosed herein.

FIG. 83 is a cross-sectional side view of a device assembly that may include any of the quantum dot devices disclosed herein.

DETAILED DESCRIPTION

Figure 1:
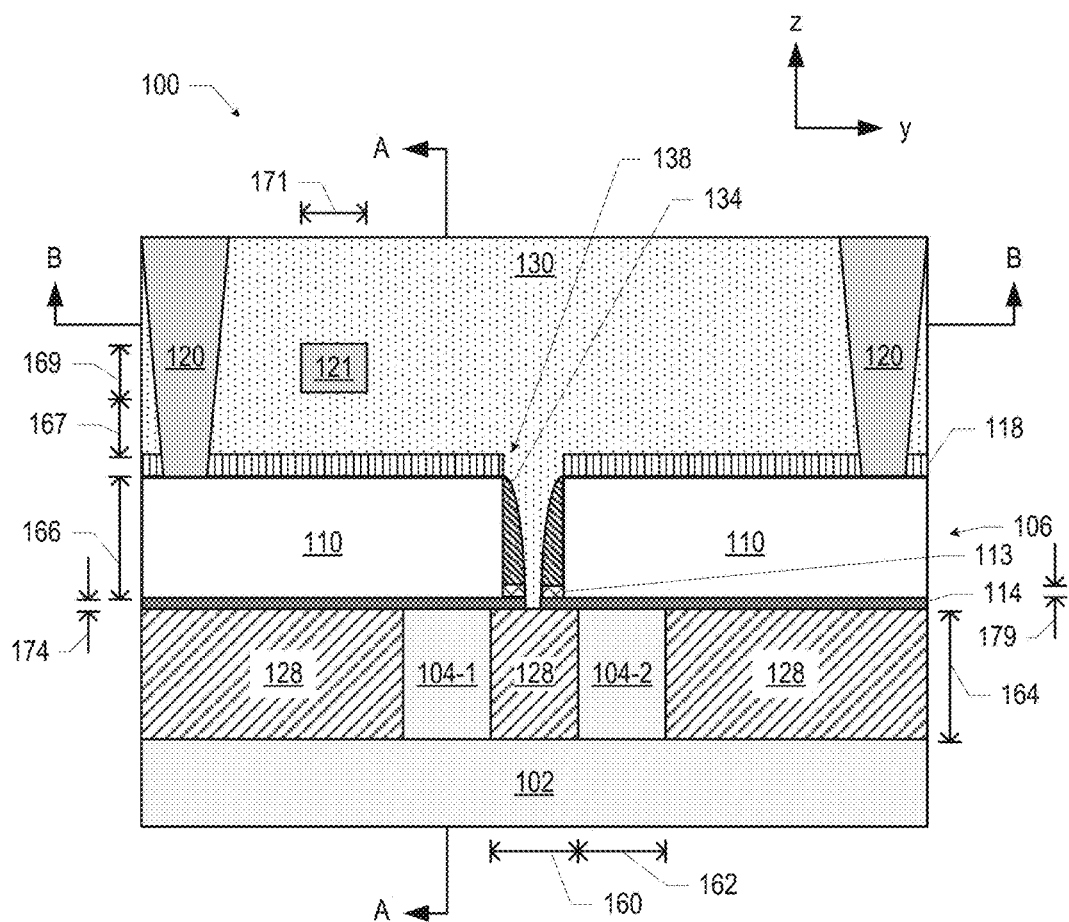
FIGS. 1-3 are cross-sectional views of a quantum dot device, in accordance with various embodiments.

Disclosed herein are quantum dot devices, as well as related computing devices and methods. For example, in some embodiments, a quantum dot device may include: a quantum well stack; a layer of gate dielectric above the quantum well stack; a first gate metal and a second gate metal above the layer of gate dielectric; and a gate wall between the first gate metal and the second gate metal, wherein the gate wall is above the layer of gate dielectric, and the gate wall includes a first dielectric material and a second dielectric material different from the first dielectric material.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "under," "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide. As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Figure 2:
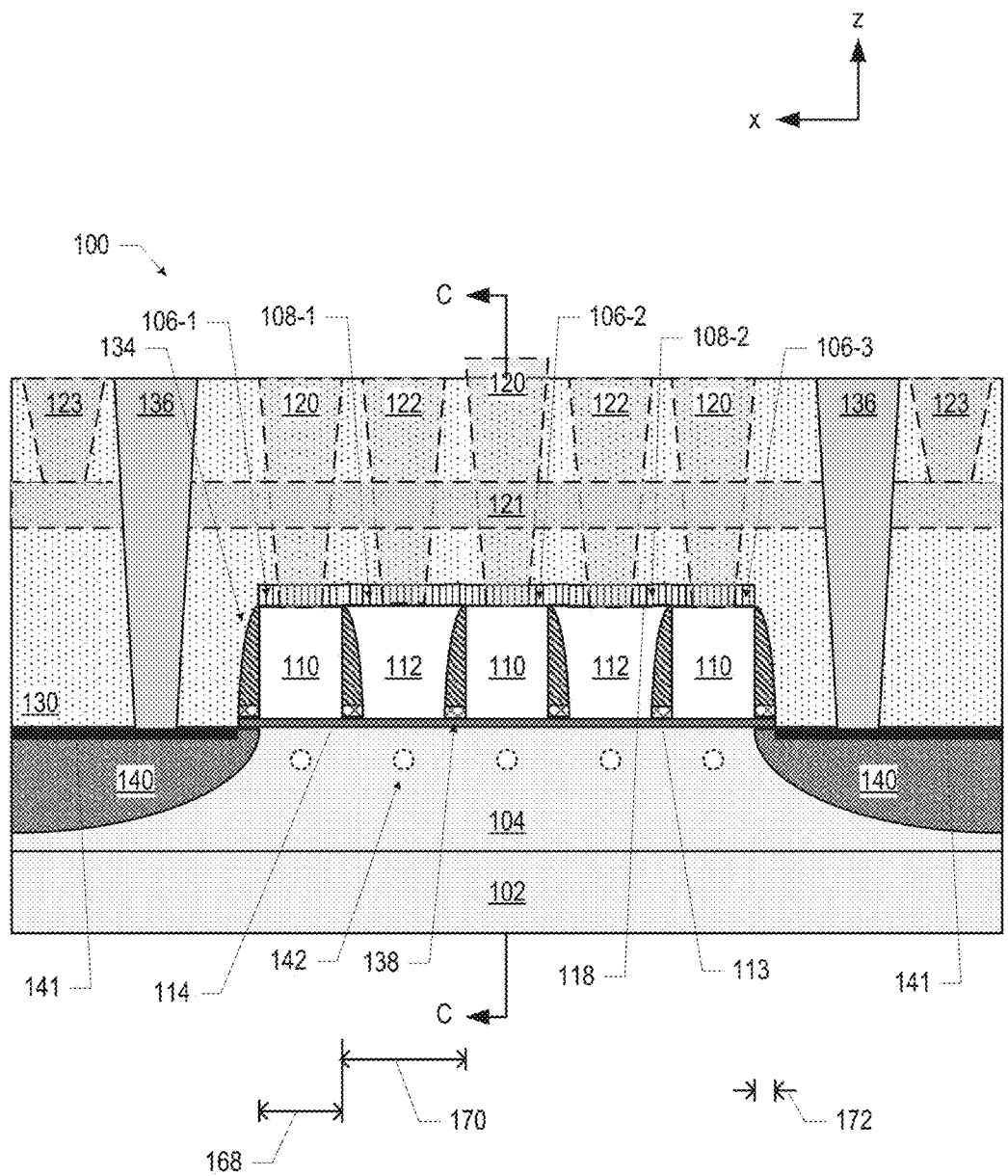
Figure 3:
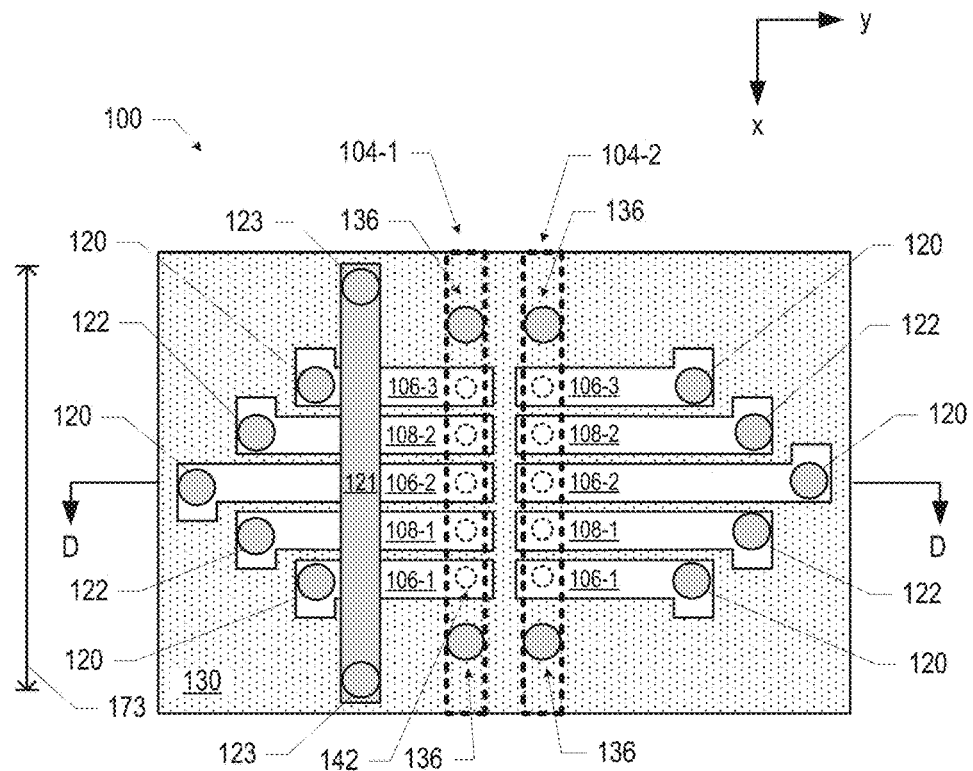

FIGS. 1-3 are cross-sectional views of a quantum dot device 100, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), and FIG. 3 illustrates the quantum dot device 100 taken along the section B-B of FIG. 1 with a number of components not shown to more readily illustrate how the gates 106/108 and the magnet line 121 may be patterned (while FIG. 1 illustrates a quantum dot device 100 taken along the section D-D of FIG. 3). Although FIG. 1 indicates that the cross-section illustrated in FIG. 2 is taken through the fin 104-1, an analogous cross-section taken through the fin 104-2 may be identical, and thus the discussion of FIG. 2 refers generally to the "fin 104."

The quantum dot device 100 may include a base 102 and multiple fins 104 extending away from the base 102. The base 102 and the fins 104 may include a substrate and a quantum well stack (not shown in FIGS. 1-3, but discussed below with reference to the substrate 144 and the quantum well stack 146), distributed in any of a number of ways between the base 102 and the fins 104. The base 102 may include at least some of the substrate, and the fins 104 may each include a quantum well layer of the quantum well stack (discussed below with reference to the quantum well layer 152). Examples of base/fin arrangements are discussed below with reference to the base fin arrangements 158 of FIGS. 45-51.

Although only two fins, 104-1 and 104-2, are shown in FIGS. 1-3, this is simply for ease of illustration, and more than two fins 104 may be included in the quantum dot device 100. In some embodiments, the total number of fins 104 included in the quantum dot device 100 is an even number, with the fins 104 organized into pairs including one active fin 104 and one read fin 104, as discussed in detail below. When the quantum dot device 100 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 104 for ease of illustration, but all the teachings of the present disclosure apply to quantum dot devices 100 with more fins 104.

As noted above, each of the fins 104 may include a quantum well layer (not shown in FIGS. 1-3, but discussed below with reference to the quantum well layer 152). The quantum well layer included in the fins 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 10 nanometers and 30 nanometers. In some embodiments, the fins 104 may each have a vertical dimension 164 between 200 nanometers and 400 nanometers (e.g., between 250 nanometers and 350 nanometers, or equal to 300 nanometers).

The fins 104 may be arranged in parallel, as illustrated in FIGS. 1 and 3, and may be spaced apart by an insulating material 128, which may be disposed on opposite faces of the fins 104. The insulating material 128 may be a dielectric material, such as silicon oxide, silicon nitride, silicon carbide, silicon oxynitride, or silicon oxycarbide. For example, in some embodiments, the fins 104 may be spaced apart by a distance 160 between 100 nanometers and 250 nanometers. Although FIG. 1 depicts a layer of gate dielectric 114 (discussed further below) on the insulating material 128, this need not be the case. For example, in some embodiments, the gate dielectric 114 may be grown thermally on the fins 102; in such embodiments, no layer of gate dielectric 114 may be present on the insulating material 128, or a layer of a material like the gate dielectric 114 may be present but may have a different material composition than the gate dielectric 114. In some embodiments, the gate dielectric 114 may be deposited by atomic layer deposition (ALD) or another technique; in such embodiments, the gate dielectric 114 may extend onto the insulating material 128 as well as the fins 104.

Multiple gates may be disposed on each of the fins 104. In the embodiment illustrated in FIG. 2, three gates 106 and two gates 108 are shown as distributed on the top of the fin 104. This particular number of gates is simply illustrative, and any suitable number of gates may be used. Additionally, as discussed below with reference to FIG. 55, multiple groups of gates (like the gates illustrated in FIG. 2) may be disposed on the fin 104.

As shown in FIG. 2, the gate 108-1 may be disposed between the gates 106-1 and 106-2, and the gate 108-2 may be disposed between the gates 106-2 and 106-3. The gates 106 may include a gate metal 110, and the gates 108 may include a gate metal 112. A layer of gate dielectric 114 may be shared between multiple ones of the gates 106 and 108, as shown. The gate metal 110 of a gate 106 may be spaced apart from the gate metal 112 of an adjacent gate 108 by a gate wall 138. The gate walls 138 may include two different dielectric materials. For example, a gate wall 138 may include a shield dielectric 113 and a spacer 134. The shield dielectric 113 may be disposed between the gate dielectric 114 and the spacer 134. As illustrated in FIG. 2, the spacers 134 may be thicker closer to the fin 104 and thinner farther away from the fin 104. In some embodiments, the spacers 134 may have a convex shape.

The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The shield dielectric 113 may be formed of any suitable material (different from the spacers 134), such as silicon carbide, silicon nitride, an interlayer dielectric material, or any suitable etch stop material.

Each of the gates 106/108 may include a gate dielectric 114; as noted above, the gate dielectric 114 for all of the gates 106/108 on a fin 104 may be provided by a common layer of gate dielectric material. In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114. In some embodiments, the gate dielectric 114 may include an isotopically purified material (as discussed below). For example, the gate dielectric 114 may be an oxide grown thermally on an isotopically purified material (as discussed below).

Each of the gates 106 may include a gate metal 110. The gate metal 110 may be disposed on the gate dielectric 114, and the gate dielectric 114 may be disposed between the gate metal 110 and the fin 104. In some embodiments, the gate metal 110 may be a superconductor, such as aluminum, titanium nitride (e.g., deposited via ALD), or niobium titanium nitride. The sides of the gate metal 110 may be substantially parallel, as shown in FIG. 2, and gate walls 138 may be disposed on the sides of the gate metal 110. The gate metal 110 may contact the spacers 134 and the shield dielectric 113 of adjacent gate walls 138.

Each of the gates 108 may include a gate metal 112. The gate metal 112 may be disposed on the gate dielectric 114, and the gate dielectric 114 may be disposed between the gate metal 112 and the fin 104. The gate metal 112 may contact the spacers 134 and the shield dielectric 113 of adjacent gate walls 138.

In some embodiments, a hardmask 118 may extend over the gates 106/108. The hardmask 118 may be formed of silicon nitride, silicon carbide, or another suitable material. In some embodiments, the hardmask 118 may not be present in the quantum dot device 100 (e.g., a hardmask like the hardmask 118 may be removed during processing, as discussed below).

In some embodiments, the gate metal 112 may be a different metal from the gate metal 110; in other embodiments, the gate metal 112 and the gate metal 110 may have the same material composition.

The gate metal 112 of the gate 108-1 may extend between the proximate gate walls 138 on the sides of the gate metals 110 of the gate 106-1 and the gate 106-2, as shown in FIG. 2. Thus, the gate metal 112 of the gate 108-1 may have a shape that is substantially complementary to the shape of the adjacent gate walls 138, as shown. Similarly, the gate metal 112 of the gate 108-2 may extend between the proximate gate walls 138 on the sides of the gate metals 110 of the gate 106-2 and the gate 106-3.

The dimensions of the gates 106/108 may take any suitable values. For example, in some embodiments, the z-height 166 of the gate metal 110 may be between 40 nanometers and 150 nanometers (e.g., approximately 50 nanometers); the z-height of the gate metal 112 may be in the same range. In some embodiments, the length 168 of the gate metal 110 (i.e., in the x-direction) may be between 20 nanometers and 60 nanometers (e.g., 30 nanometers). In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 50 nanometers and 150 nanometers (e.g., 100 nanometers). In some embodiments, the thickness 172 of the spacers 134 may be between 1 nanometer and 10 nanometers (e.g., between 3 nanometers and 5 nanometers, between 4 nanometers and 6 nanometers, or between 4 nanometers and 7 nanometers). In some embodiments, the thickness 179 of the shield dielectric 113 may be between 1 nanometer and 8 nanometers (e.g., between 3 nanometers and 8 nanometers). In some embodiments, the thickness 174 of the gate dielectric 114 may be between 2 nanometers and 20 nanometers. The length of the gate metal 112 (i.e., in the x-direction) may depend on the dimensions of the gates 106 and the gate walls 138, as illustrated in FIG. 2. As indicated in FIG. 1, the gates 106/108 on one fin 104 may extend over the insulating material 128 beyond their respective fins 104 and towards the other fin 104, but may be isolated from their counterpart gates by the intervening insulating material 130 (and gate walls 138 for the gates 106).

Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 2) may have a greater length 168 than the "inner" gates 106 (e.g., the gate 106-2 in the embodiment illustrated in FIG. 2). For example, in some embodiments, the outermost gates 106 may have a length 168 between 100 nanometers and 500 nanometers. Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140. In some embodiments, during operation of the quantum dot device 100, a 2DEG may form under the outermost gates 106; this 2DEG may separate the "active" device region (under the gates 106/108) from the doped region 140 (which has a large density of implanted charge carriers).

As shown in FIG. 2, the gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 2 and 3 for ease of illustration, but five are indicated as dotted circles in each fin 104. The location of the quantum dots 142 in FIG. 2 is not intended to indicate a particular geometric positioning of the quantum dots 142. The gate walls 138 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide (e.g., as discussed below with reference to FIGS. 27-28). In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarities of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under a gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-3, the gates 106 may extend away from the fins 104, and conductive vias 120 may contact the gates 106 (and are drawn in dashed lines in FIG. 2 to indicate their location behind the plane of the drawing). The conductive vias 120 may extend through the hardmask 118 to contact the gate metal 110 of the gates 106. The gates 108 may extend away from the fins 104, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by chemical vapor deposition (CVD)), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The quantum dot device 100 may include one or more magnet lines 121. For example, a single magnet line 121 is illustrated in FIGS. 1-3 proximate to the fin 104-1. The magnet line 121 may be formed of a conductive material, and may be used to conduct current pulses that generate magnetic fields to influence the spin states of one or more of the quantum dots 142 that may form in the fins 104. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnetic field to which the spin of a qubit may couple. The magnet line 121 may provide any suitable combination of these embodiments, or any other appropriate functionality.

In some embodiments, the magnet line 121 may be formed of copper. In some embodiments, the magnet line 121 may be formed of a superconductor, such as aluminum. The magnet line 121 illustrated in FIGS. 1-3 is non-coplanar with the fins 104, and is also non-coplanar with the gates 106/108. In some embodiments, the magnet line 121 may be spaced apart from the gates 106/108 by a distance 167. The distance 167 may take any suitable value (e.g., based on the desired strength of magnetic field interaction with the quantum dots 142); in some embodiments, the distance 167 may be between 25 nanometers and 1 micron (e.g., between 50 nanometers and 200 nanometers).

In some embodiments, the magnet line 121 may be formed of a magnetic material. For example, a magnetic material (such as cobalt) may be deposited in a trench in the insulating material 130 to provide a permanent magnetic field in the quantum dot device 100.

The magnet line 121 may have any suitable dimensions. For example, the magnet line 121 may have a thickness 169 between 25 nanometers and 100 nanometers. The magnet line 121 may have a width 171 between 25 nanometers and 100 nanometers. In some embodiments, the width 171 and thickness 169 of a magnet line 121 may be equal to the width and thickness, respectively, of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIGS. 1-3 (and the magnet lines 121 illustrated in FIGS. 39-41 below) are substantially linear, but this need not be the case; the magnet lines 121 disclosed herein may take any suitable shape. Conductive vias 123 may contact the magnet line 121.

The conductive vias 120, 122, 136, and 123 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of integrated circuit manufacturing, conductive vias and lines may be formed in an iterative process in which layers of structures are formed on top of each other. In some embodiments, the conductive vias 120/122/136/123 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-3 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 100 enables both quantum computation and the ability to read the results of a quantum computation.

The quantum dot devices 100 disclosed herein may be manufactured using any suitable techniques. FIGS. 4-38 illustrate various example stages in the manufacture of the quantum dot device 100 of FIGS. 1-3, in accordance with various embodiments. Although the particular manufacturing operations discussed below with reference to FIGS. 4-38 are illustrated as manufacturing a particular embodiment of the quantum dot device 100, these operations may be applied to manufacture many different embodiments of the quantum dot device 100, as discussed herein. Any of the elements discussed below with reference to FIGS. 4-38 may take the form of any of the embodiments of those elements discussed above (or otherwise disclosed herein).

Figure 4:
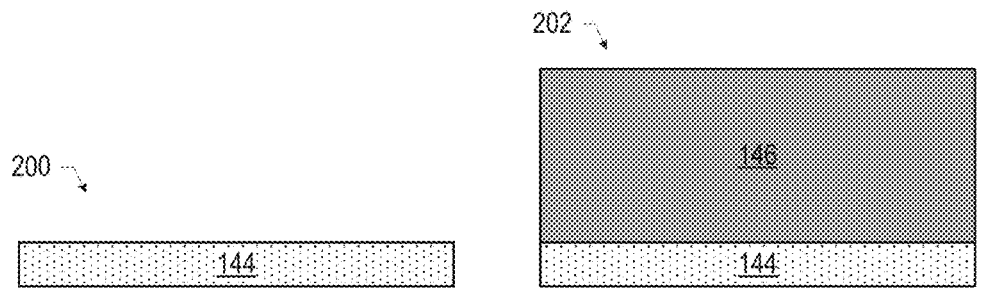
FIGS. 4-38 illustrate various example stages in the manufacture of a quantum dot device, in accordance with various embodiments.

FIG. 4 illustrates a cross-sectional view of an assembly 200 including a substrate 144. The substrate 144 may include any suitable semiconductor material or materials. In some embodiments, the substrate 144 may include a semiconductor material. For example, the substrate 144 may include silicon (e.g., may be formed from a silicon wafer). Various embodiments of the substrate 144 are discussed below with reference to FIGS. 42-44.

Figure 5:
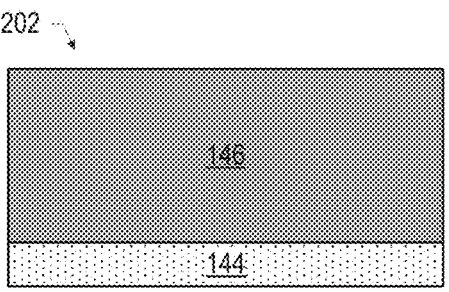

FIG. 5 illustrates a cross-sectional view of an assembly 202 subsequent to providing a quantum well stack 146 on the substrate 144 of the assembly 200 (FIG. 4). The quantum well stack 146 may include a quantum well layer (not shown) in which a 2DEG may form during operation of the quantum dot device 100. Various embodiments of the quantum well stack 146 are discussed below with reference to FIGS. 42-44.

Figure 6:
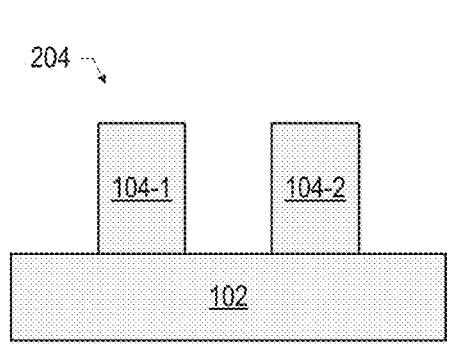

FIG. 6 illustrates a cross-sectional view of an assembly 204 subsequent to forming fins 104 in the assembly 202 (FIG. 5). The fins 104 may extend from a base 102, and may be formed in the assembly 202 by patterning and then etching the assembly 202, as known in the art. For example, a combination of dry and wet etch chemistry may be used to form the fins 104, and the appropriate chemistry may depend on the materials included in the assembly 202, as known in the art. At least some of the substrate 144 may be included in the base 102, and at least some of the quantum well stack 146 may be included in the fins 104. In particular, the quantum well layer (not shown) of the quantum well stack 146 may be included in the fins 104. Example arrangements in which the quantum well stack 146 and the substrate 144 are differently included in the base 102 and the fins 104 are discussed below with reference to FIGS. 45-51.

Figure 7:
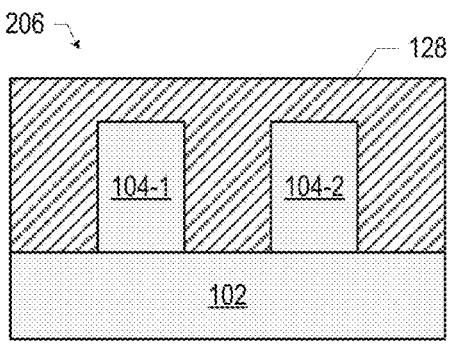

FIG. 7 illustrates a cross-sectional view of an assembly 206 subsequent to providing an insulating material 128 to the assembly 204 (FIG. 6). Any suitable material may be used as the insulating material 128 to electrically insulate the fins 104 from each other. As noted above, in some embodiments, the insulating material 128 may be a dielectric material, such as silicon oxide.

Figure 8:
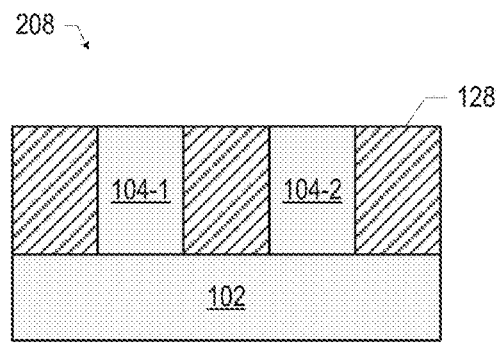

FIG. 8 illustrates a cross-sectional view of an assembly 208 subsequent to planarizing the assembly 206 (FIG. 7) to remove the insulating material 128 above the fins 104. In some embodiments, the assembly 206 may be planarized using a chemical mechanical polishing (CMP) technique.

Figure 9:
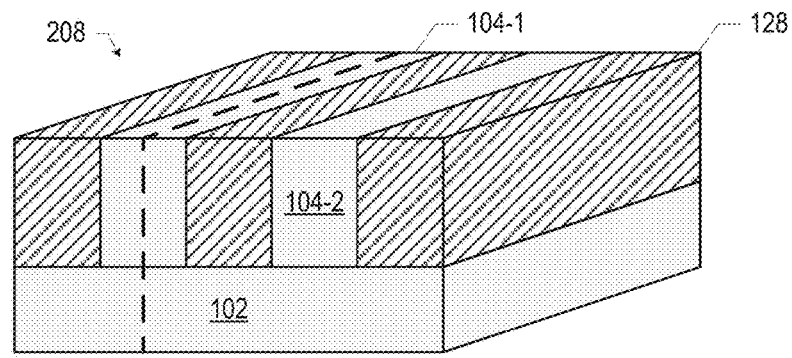
Figure 10:
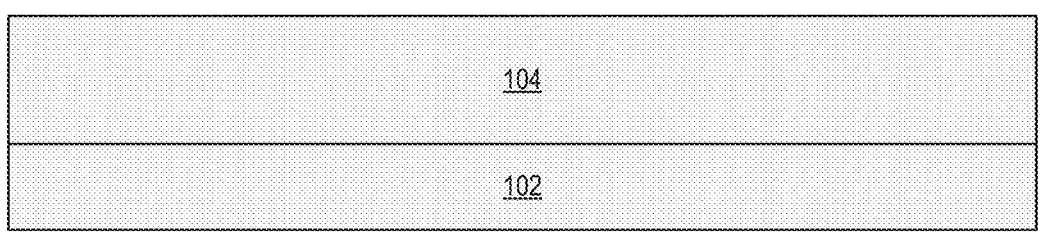

FIG. 9 is a perspective view of at least a portion of the assembly 208, showing the fins 104 extending from the base 102 and separated by the insulating material 128. The cross-sectional views of FIGS. 4-8 are taken parallel to the plane of the page of the perspective view of FIG. 9. FIG. 10 is another cross-sectional view of the assembly 208, taken along the dashed line along the fin 104-1 in FIG. 9. The cross-sectional views illustrated in FIGS. 11-29, 31, 33, 35, and 37 are taken along the same cross-section as FIG. 10. The cross-sectional views illustrated in FIGS. 30, 32, 34, 36, and 38 are taken along the same cross-section as FIG. 8.

Figure 11:
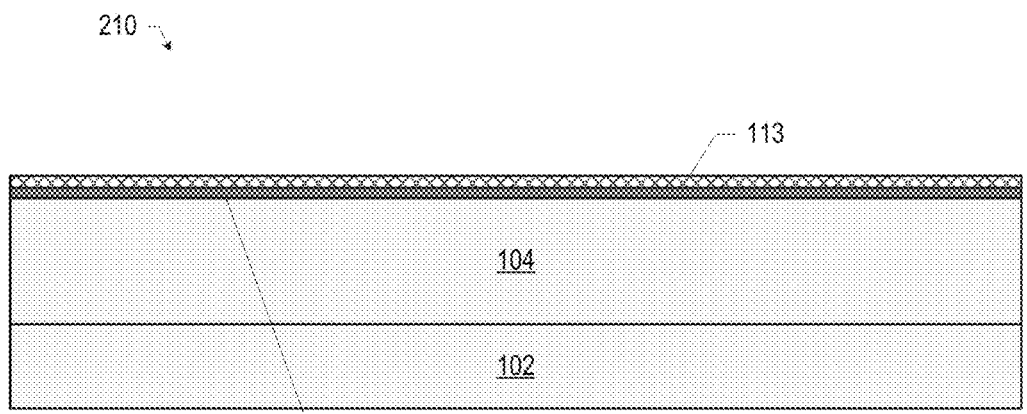

FIG. 11 is a cross-sectional view of an assembly 210 subsequent to forming a gate dielectric 114 and a shield dielectric 113 on the fins 104 of the assembly 208 (FIGS. 8-10). The shield dielectric 113 may help protect the gate dielectric 114 from damage during subsequent manufacturing operations. The shield dielectric 113 may be particularly advantageous when the gate dielectric 114 is a fragile material that may be easily damaged during processing. For example, the shield dielectric 113 may be particularly advantageous when the gate dielectric 114 is a thermally grown dielectric material. Some thermally grown dielectric materials may have higher quality than dielectric materials fabricated using other techniques (e.g., CVD, ALD, or physical vapor deposition (PVD), but may be more susceptible to damage. When a high-quality gate dielectric 114 is isotopically purified (as discussed further below), the concentration of nuclear spin near the quantum well stack 146 may be low, improving performance. Utilizing a shield dielectric 113 may allow the use of a higher quality gate dielectric 114 in a quantum dot device 100 than conventional approaches.

Figure 12:
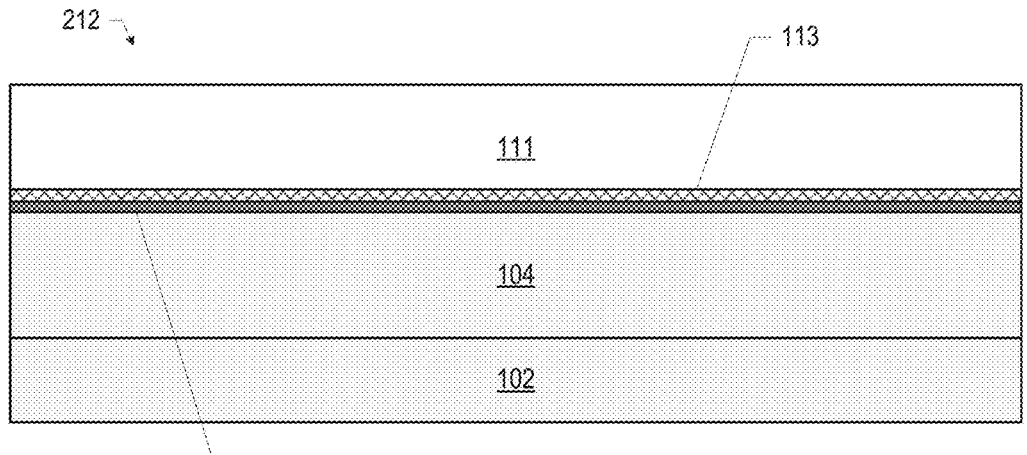

FIG. 12 is a cross-sectional view of an assembly 212 subsequent to depositing a dummy material 111 on the assembly 210 (FIG. 11). The dummy material 111 may include any material that may be selectively etched without etching the shield dielectric 113, the spacers 134, or the dummy material 109 (discussed below). In some embodiments, the dummy material 111 may include polysilicon.

Figure 13:
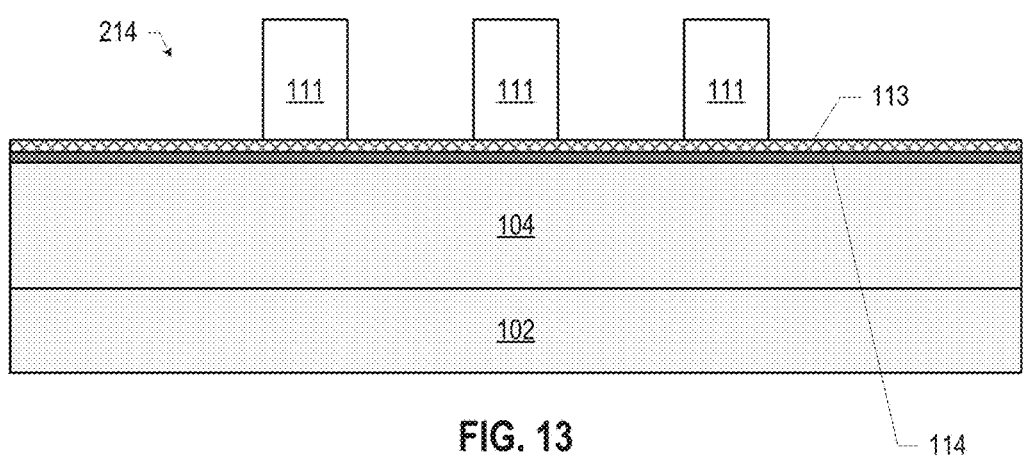

FIG. 13 is a cross-sectional view of an assembly 214 subsequent to patterning the dummy material 111 of the assembly 212 (FIG. 12). The pattern applied to the dummy material 111 may correspond to the locations for the gates 106, as discussed below. The dummy material 111 may be patterned by applying a resist, patterning the resist using lithography, and then etching the dummy material 111 (using dry etching or any appropriate technique). As illustrated in FIG. 13, the shield dielectric 113 and the gate dielectric 114 may remain after the dummy material 111 is patterned.

Figure 14:
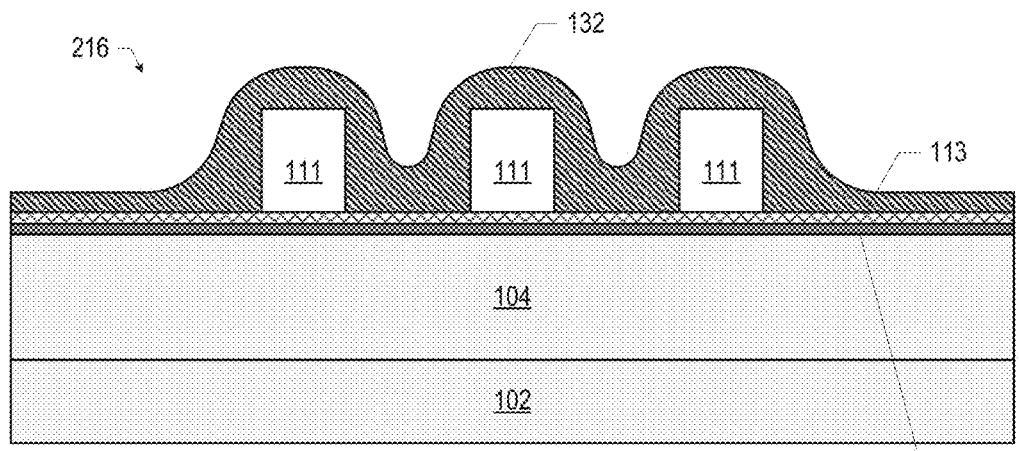

FIG. 14 is a cross-sectional view of an assembly 216 subsequent to providing spacer material 132 on the assembly 214 (FIG. 13). The spacer material 132 may include any of the materials discussed above with reference to the spacers 134, for example, and may be deposited using any suitable technique. For example, the spacer material 132 may be a nitride material (e.g., silicon nitride) deposited by sputtering.

Figure 15:
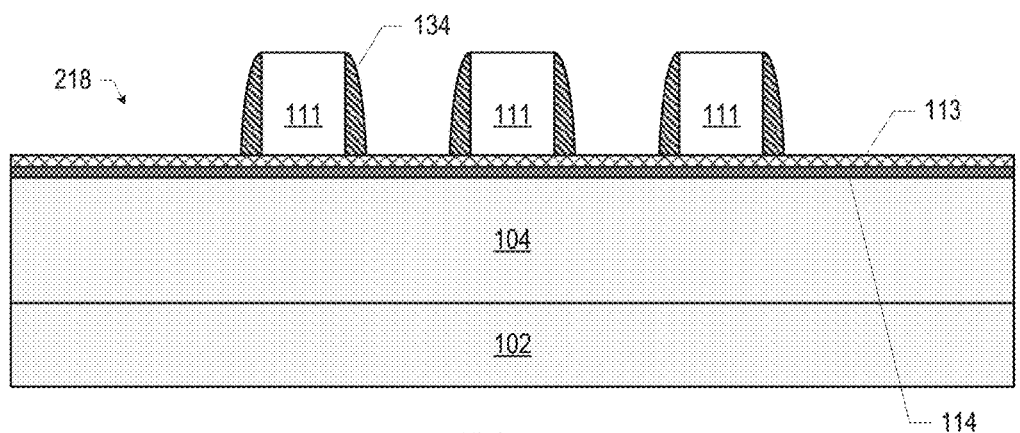

FIG. 15 is a cross-sectional view of an assembly 218 subsequent to etching the spacer material 132 of the assembly 216 (FIG. 14), leaving spacers 134 formed of the spacer material 132 on the side faces of the dummy material 111. The etching of the spacer material 132 may be an anisotropic etch, etching the spacer material 132 "downward" to remove the spacer material 132 on top of the dummy material 111 and in some of the area between the dummy material 111, while leaving the spacers 134 on the sides of the dummy material 111. In some embodiments, the anisotropic etch may be a dry etch, and may be selective to the spacer material 132 so as to not significantly etch the shield dielectric 113. In some embodiments, the etch of the spacer material 132 may be controlled so as to "overetch" into the shield dielectric 113, causing recesses in the shield dielectric 113, to help ensure that the spacer material 132 has been fully removed as desired.

Figure 16:
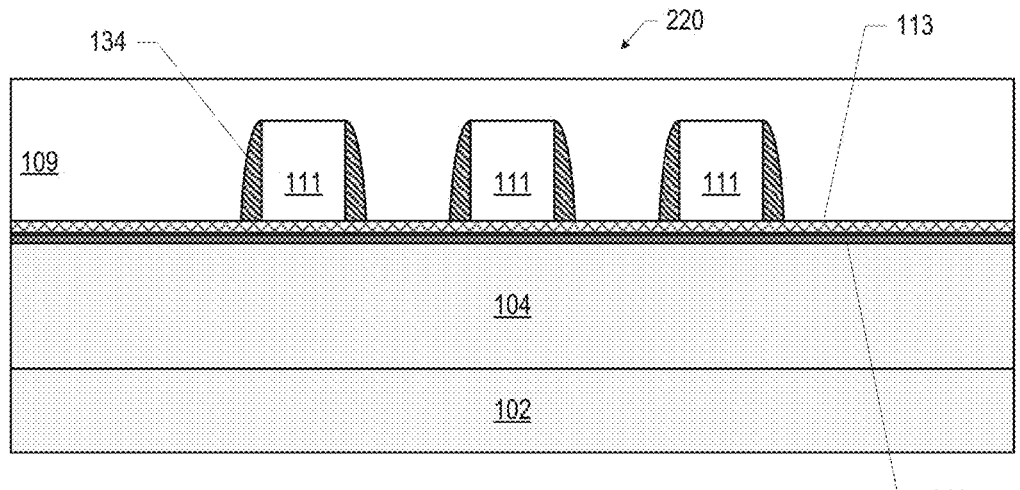

FIG. 16 is a cross-sectional view of an assembly 220 subsequent to providing another dummy material 109 on the assembly 218 (FIG. 15). The dummy material 109 may include any material that may be selectively etched without etching the shield dielectric 113, the spacers 134, or the dummy material 111. In some embodiments, the dummy material 109 may include silicon oxide. The dummy material 109 may fill the areas between adjacent ones of the portions of dummy material 111, and may extend over the top of the dummy material 111, as shown. In some embodiments, the dummy material 109 may be an insulating material, and may remain in the quantum dot device 100 as an insulating material in an area away from the gates 106/108.

Figure 17:
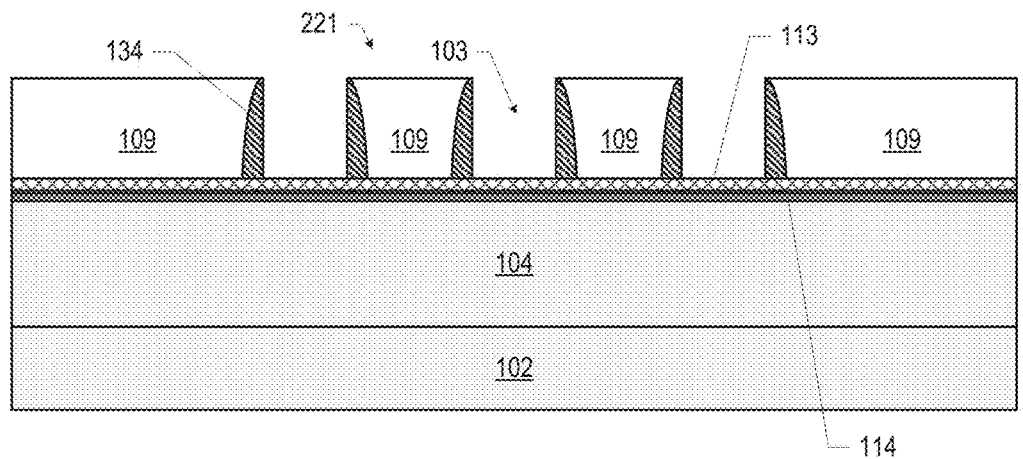

FIG. 17 is a cross-sectional view of an assembly 221 subsequent to planarizing the assembly 220 (FIG. 16) to remove the dummy material 109 above the dummy material 111, and then removing the dummy material 111 to form cavities 103. In some embodiments, the dummy material 109 may be planarized using a CMP technique. Any suitable technique may be used to remove the dummy material 111, such as an etch technique that is selective to the dummy material 111 while leaving the shield dielectric 113, the spacers 134, and the dummy material 109 in place. As illustrated in FIG. 17, the spacers 134 may provide the sidewalls of the cavities 103, and the shield dielectric 113 may provide the bottom of the cavities 103.

Figure 18:
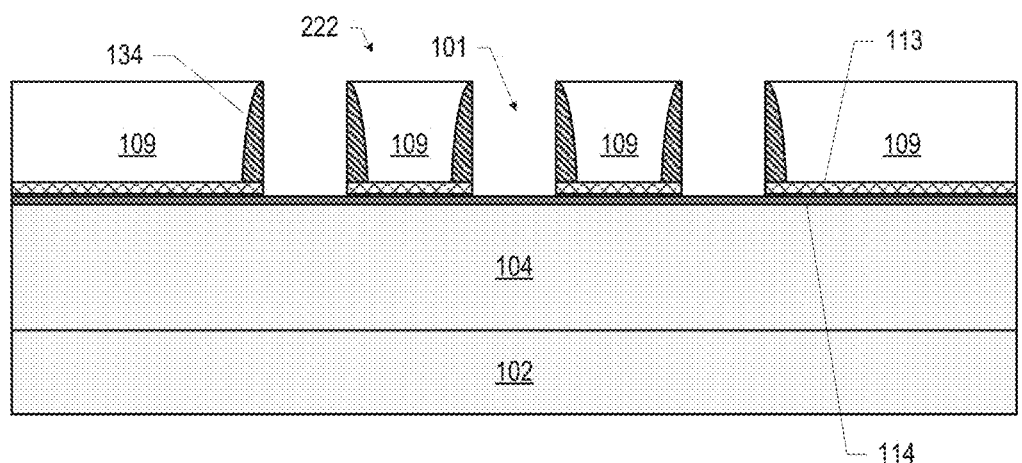

FIG. 18 is a cross-sectional view of an assembly 222 subsequent to removing the shield dielectric 113 exposed at the bottoms of the cavities 103 in the assembly 221 (FIG. 17), forming cavities 101. In some embodiments, the shield dielectric 113 may be removed using a highly anisotropic etch. The gate dielectric 114 may provide the bottoms of the cavities 101 after the shield dielectric 113 is removed. In some embodiments, the gate dielectric 114 may not be etched, while in other embodiments, as discussed below with reference to FIG. 77, some portion of the gate dielectric 114 may be removed to form recesses 176.

Figure 19:
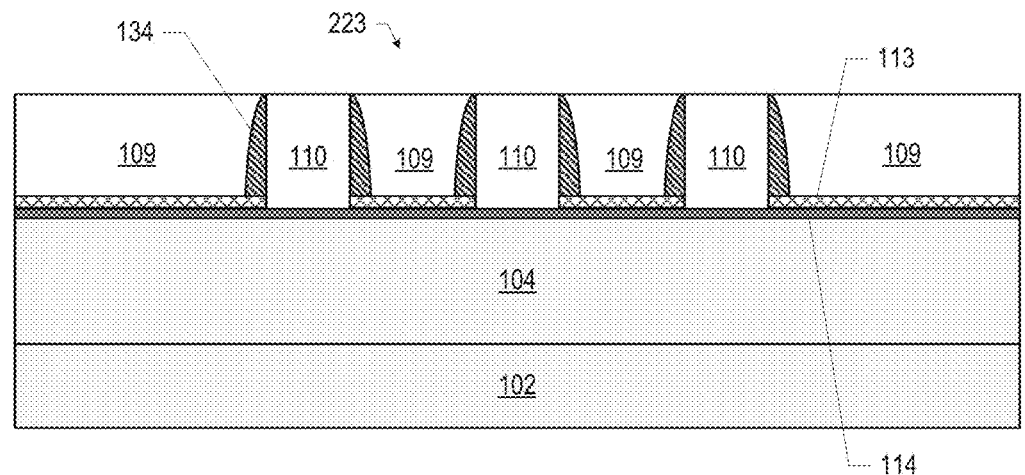

FIG. 19 is a cross-sectional view of an assembly 223 subsequent to depositing the gate metal 110 on the assembly 222 (FIG. 18), and then planarizing the gate metal 110 to remove the gate metal 110 over the dummy material 109 and expose the dummy material 109. The gate metal 110 may fill the cavities 101 of the assembly 222, as shown. The gate metal 110 along with the adjacent gate dielectric 114 may provide the gates 106, as discussed above with reference to FIGS. 1-3.

Figure 20:
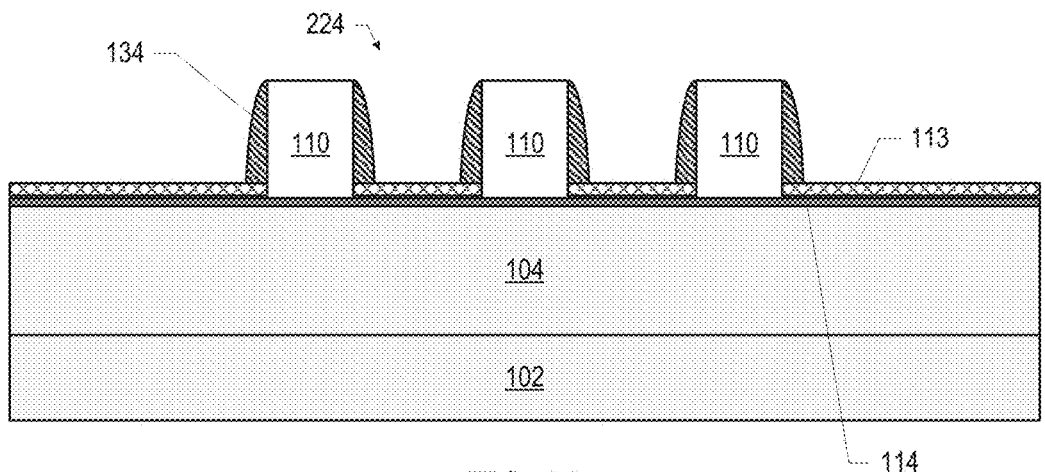

FIG. 20 is a cross-sectional view of an assembly 224 subsequent to removing the dummy material 109 from the assembly 223 (FIG. 19). Any suitable technique may be used to remove the dummy material 109, such as an etch technique that is selective to the dummy material 109 while leaving the shield dielectric 113, the spacers 134, the gate dielectric 114, and the gate metal 110 in place.

Figure 21:
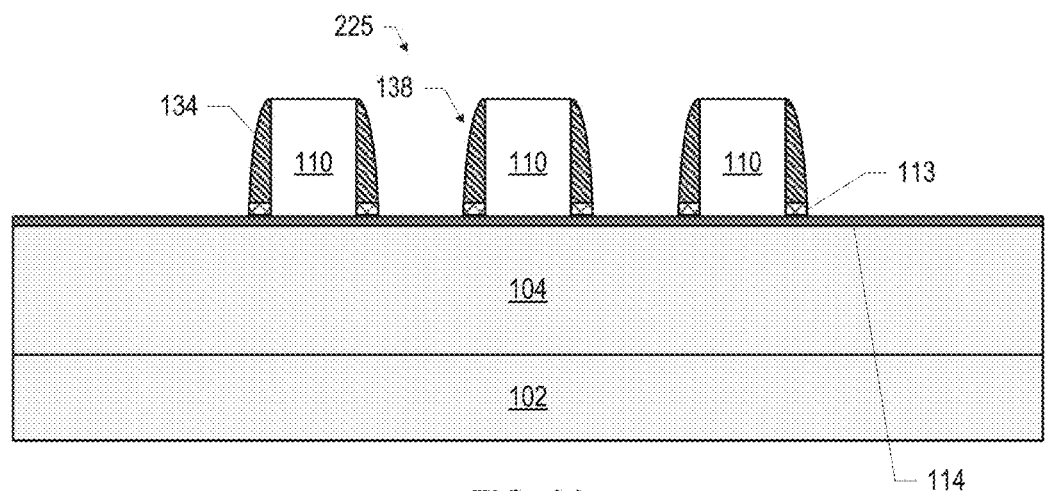

FIG. 21 is a cross-sectional view of an assembly 225 subsequent to removing the shield dielectric 113 that is exposed on the fin 104 from the assembly 224 (FIG. 20), forming the gate walls 138. The shield dielectric 113 that is part of the gate walls 138 (between the spacers 134 and the gate dielectric 114) remains in the assembly 225. In some embodiments, the shield dielectric 113 that is exposed on the fin 104 may be removed by a highly anisotropic etch.

Figure 22:
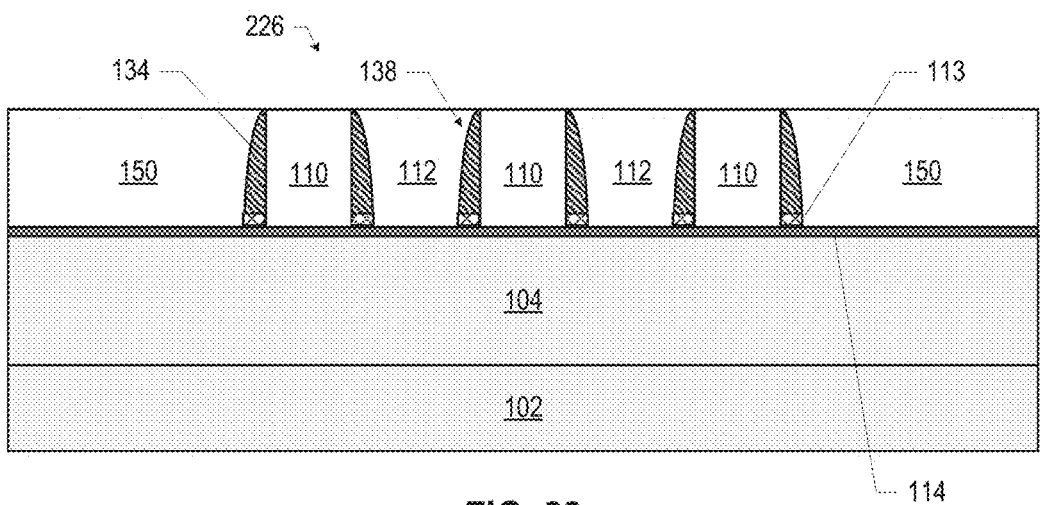

FIG. 22 is a cross-sectional view of an assembly 226 subsequent to depositing the gate metal 112 on the assembly 225 (FIG. 21), and planarizing the gate metal 112 above the gates 106. In some embodiments, the assembly 220 may be planarized using a CMP technique. Some of the remaining gate metal 112 may fill the areas between adjacent ones of the gates 106, providing the gates 108, while other portions 150 of the remaining gate metal 112 may be located "outside" of the gates 106.

Figure 23:
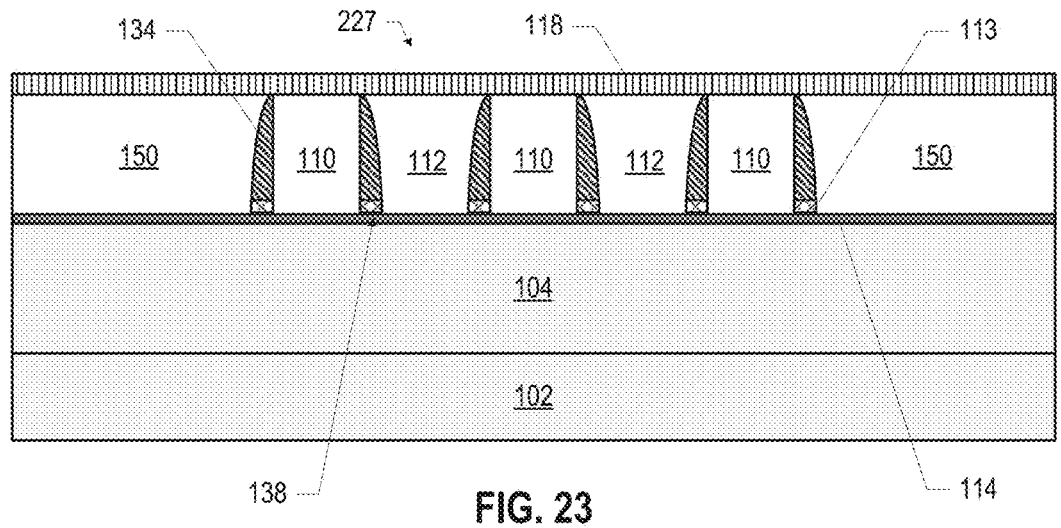

FIG. 23 is a cross-sectional view of an assembly 227 subsequent to providing a hardmask 118 on the planarized surface of the assembly 226 (FIG. 22). The hardmask 118 may be formed of an electrically insulating material, such as silicon nitride or carbon-doped nitride.

Figure 24:
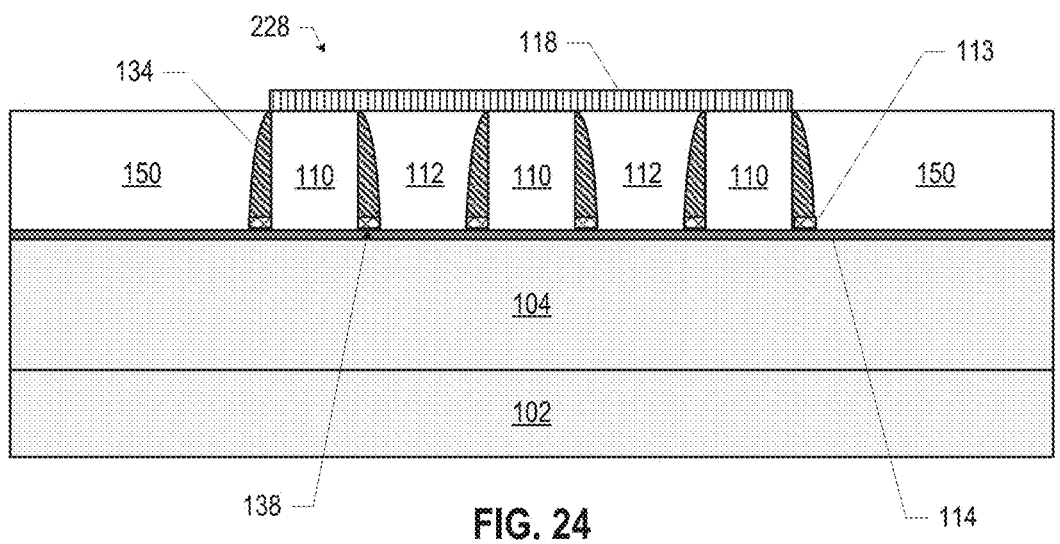

FIG. 24 is a cross-sectional view of an assembly 228 subsequent to patterning the hardmask 118 of the assembly 227 (FIG. 23). The pattern applied to the hardmask 118 may extend over the hardmask 116, over the gate metal 110 of the gates 106, and over the locations for the gates 108 (as illustrated in FIG. 2). The hardmask 118 may be patterned by applying a resist, patterning the resist using lithography, and then etching the hardmask (using dry etching or any appropriate technique).

Figure 25:
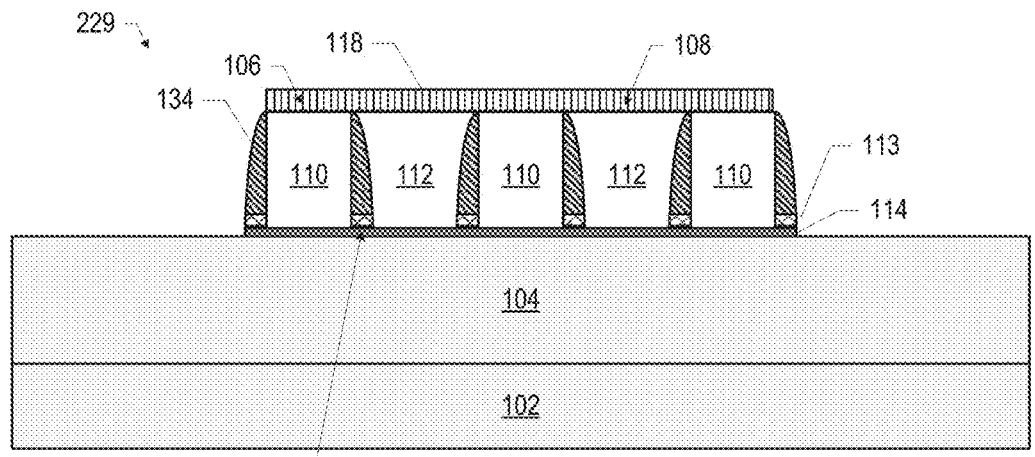

FIG. 25 is a cross-sectional view of an assembly 229 subsequent to etching the assembly 228 (FIG. 24) to remove the portions 150 that are not protected by the patterned hardmask 118. The operations performed on the assembly 226 may include removing any gate dielectric 114 that is "exposed" on the fin 104, as shown. The excess gate dielectric 114 may be removed using any suitable technique, such as chemical etching or silicon bombardment. In some embodiments, the excess gate dielectric 114 may not be fully removed before doping the fins 104 (discussed below with reference to FIG. 26), but may be patterned after doping the fins 104 (e.g., prior to forming the conductive vias 136).

Figure 26:
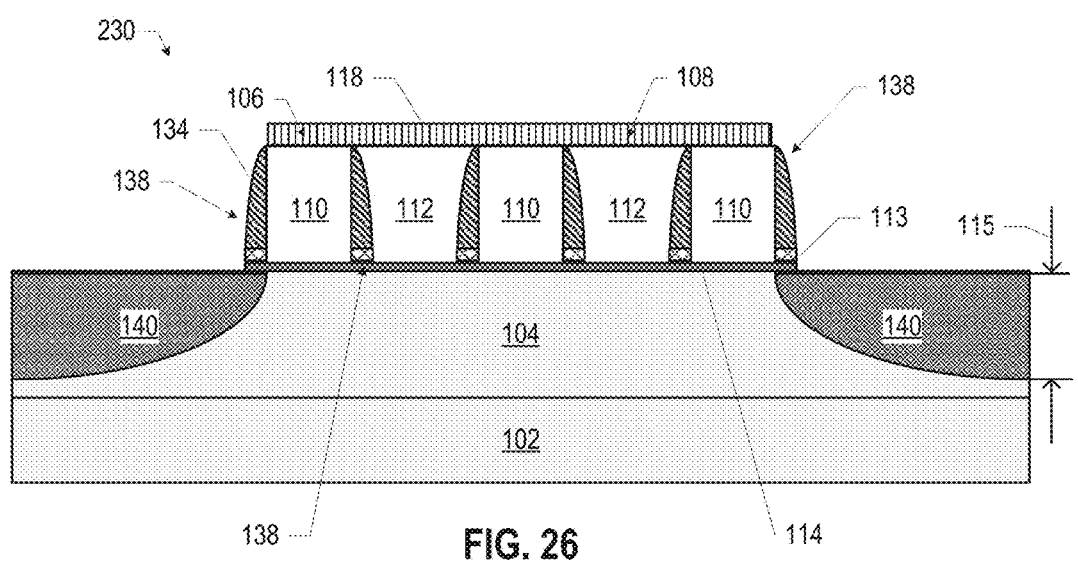

FIG. 26 is a cross-sectional view of an assembly 230 subsequent to doping the fins 104 of the assembly 228 (FIG. 25) to form doped regions 140 in the portions of the fins 104 "outside" of the gates 106/108. The type of dopant used to form the doped regions 140 may depend on the type of quantum dot desired, as discussed above. In some embodiments, the doping may be performed by ion implantation. For example, when the quantum dot 142 is to be an electron-type quantum dot 142, the doped regions 140 may be formed by ion implantation of phosphorous, arsenic, or another n-type material. When the quantum dot 142 is to be a hole-type quantum dot 142, the doped regions 140 may be formed by ion implantation of boron or another p-type material. An annealing process that activates the dopants and causes them to diffuse farther into the fins 104 may follow the ion implantation process. The depth of the doped regions 140 may take any suitable value; for example, in some embodiments, the doped regions 140 may extend into the fin 104 to a depth 115 between 500 Angstroms and 1000 Angstroms.

The "outermost" gate walls 138 may provide a doping boundary, limiting diffusion of the dopant from the doped regions 140 into the area under the gates 106/108. As shown, the doped regions 140 may extend under the adjacent gate walls 138. In some embodiments, the doped regions 140 may extend past the outer gate walls 138 and under the gate metal 110 of the outer gates 106, may extend only to the boundary between the outer gate walls 138 and the adjacent gate metal 110, or may terminate under the outer gate walls 138 and not reach the boundary between the outer gate walls 138 and the adjacent gate metal 110. The doping concentration of the doped regions 140 may, in some embodiments, be between $10^{17}/cm^3$ and $10^{20}/cm^3$.

Figure 27:
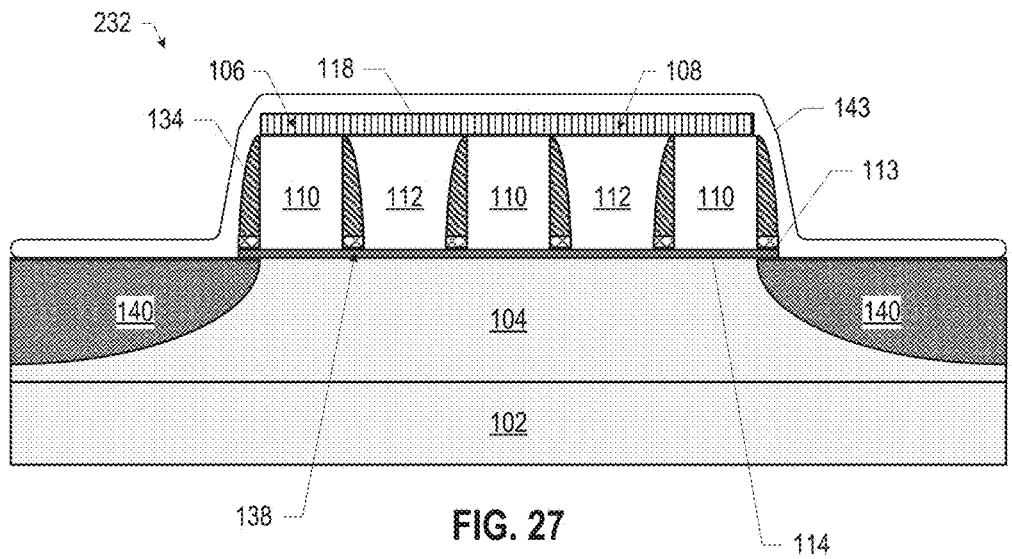

FIG. 27 is a cross-sectional side view of an assembly 232 subsequent to providing a layer of nickel or other material 143 over the assembly 230 (FIG. 26). The nickel or other material 143 may be deposited on the assembly 230 using any suitable technique (e.g., a plating technique, CVD, or ALD).

Figure 28:
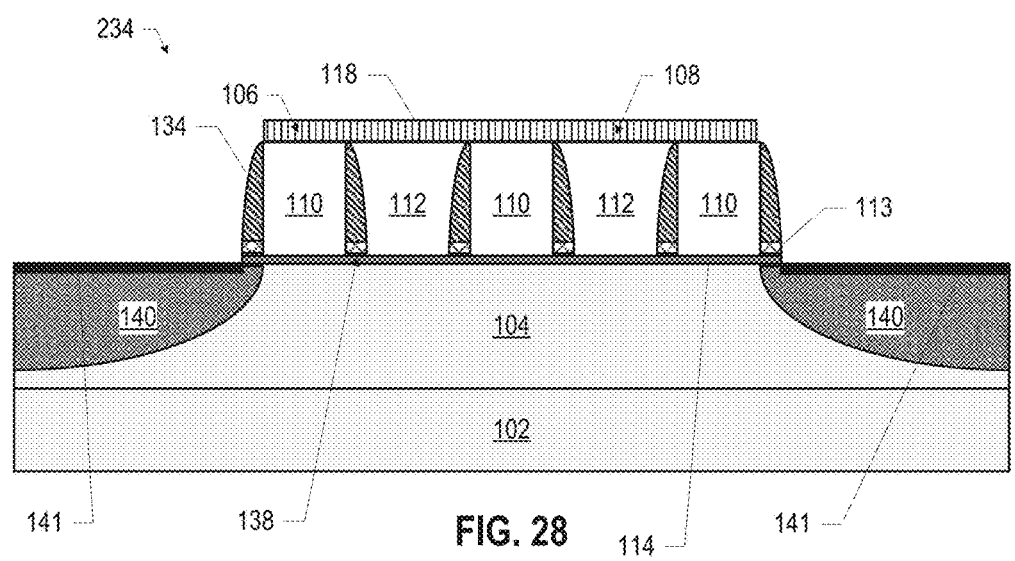

FIG. 28 is a cross-sectional side view of an assembly 234 subsequent to annealing the assembly 232 (FIG. 27) to cause the material 143 to interact with the doped regions 140 to form the interface material 141, then removing the unreacted material 143. When the doped regions 140 include silicon and the material 143 includes nickel, for example, the interface material 141 may be nickel silicide. Materials other than nickel may be deposited in the operations discussed above with reference to FIG. 27 in order to form other interface materials 141, including titanium, aluminum, molybdenum, cobalt, tungsten, or platinum, for example. More generally, the interface material 141 of the assembly 234 may include any of the materials discussed herein with reference to the interface material 141.

Figure 29:
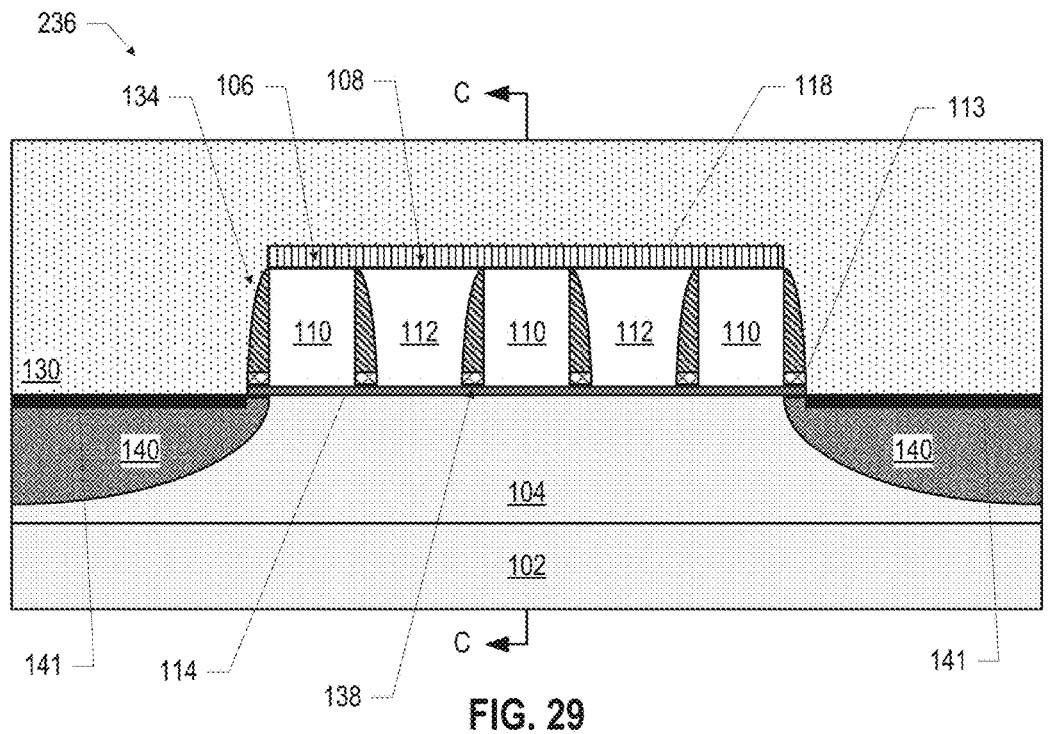
Figure 30:
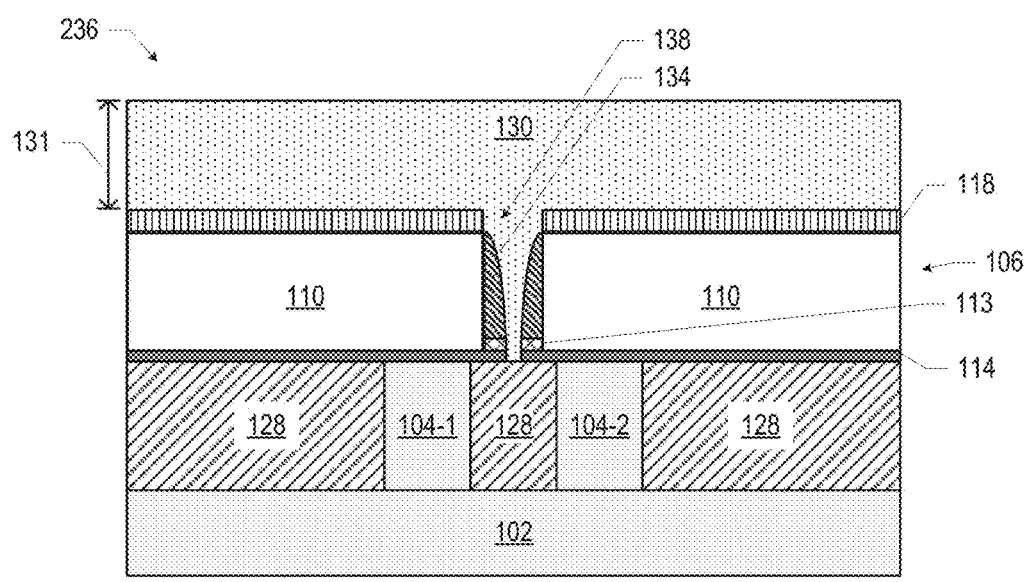

FIG. 29 is a cross-sectional view of an assembly 236 subsequent to providing an insulating material 130 on the assembly 234 (FIG. 28). The insulating material 130 may take any of the forms discussed above. For example, the insulating material 130 may be a dielectric material, such as silicon oxide. The insulating material 130 may be provided on the assembly 234 using any suitable technique, such as spin coating, CVD, or plasma-enhanced CVD (PECVD). In some embodiments, the insulating material 130 may be polished back after deposition, and before further processing. In some embodiments, the thickness 131 of the insulating material 130 provided on the assembly 236 (as measured from the hardmask 118, as indicated in FIG. 29) may be between 50 nanometers and 1.2 microns (e.g., between 50 nanometers and 300 nanometers). FIG. 30 is another cross-sectional view of the assembly 236, taken along the section C-C of FIG. 29.

Figure 31:
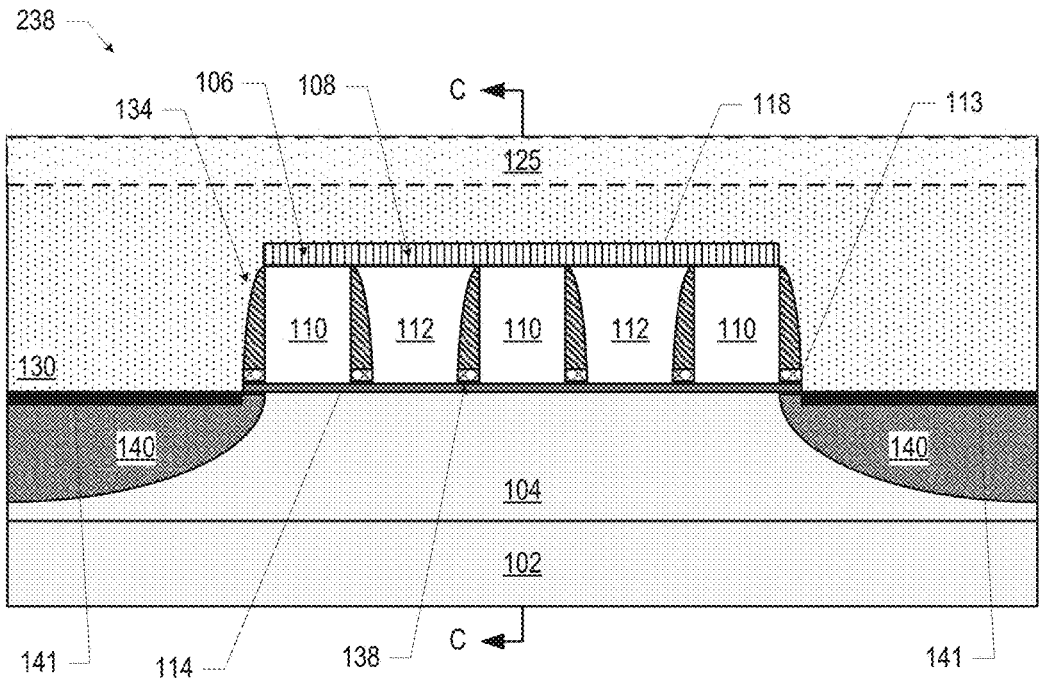
Figure 32:
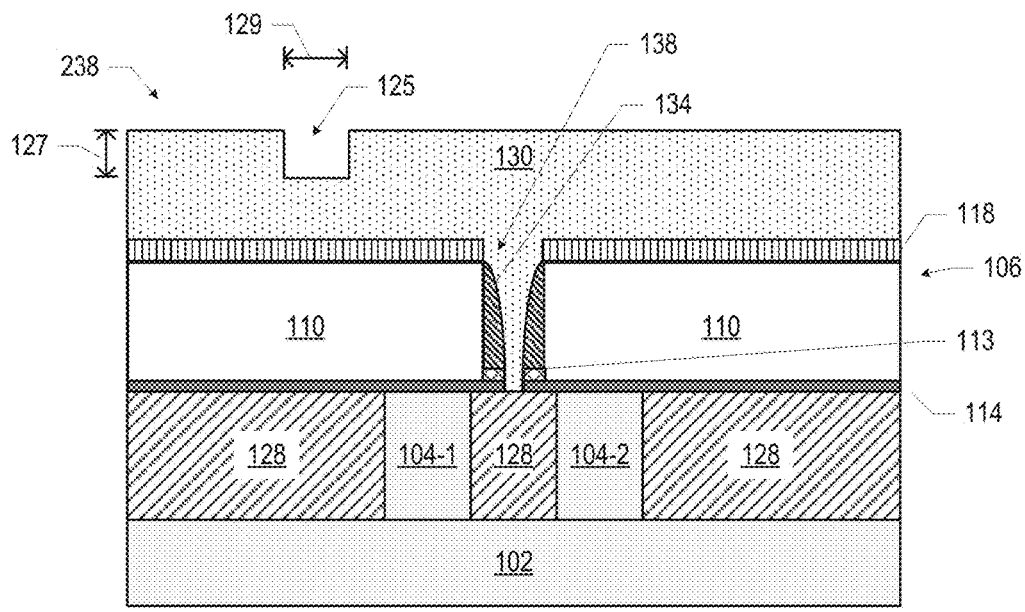

FIG. 31 is a cross-sectional view of an assembly 238 subsequent to forming a trench 125 in the insulating material 130 of the assembly 236 (FIGS. 29 and 30). The trench 125 may be formed using any desired techniques (e.g., resist patterning followed by etching), and may have a depth 127 and a width 129 that may take the form of any of the embodiments of the thickness 169 and the width 171, respectively, discussed above with reference to the magnet line 121. FIG. 32 is another cross-sectional view of the assembly 238, taken along the section C-C of FIG. 31. In some embodiments, the assembly 236 may be planarized to remove the hardmask 118, then additional insulating material 130 may be provided on the planarized surface before forming the trench 125; in such an embodiment, the hardmask 118 would not be present in the quantum dot device 100.

Figure 33:
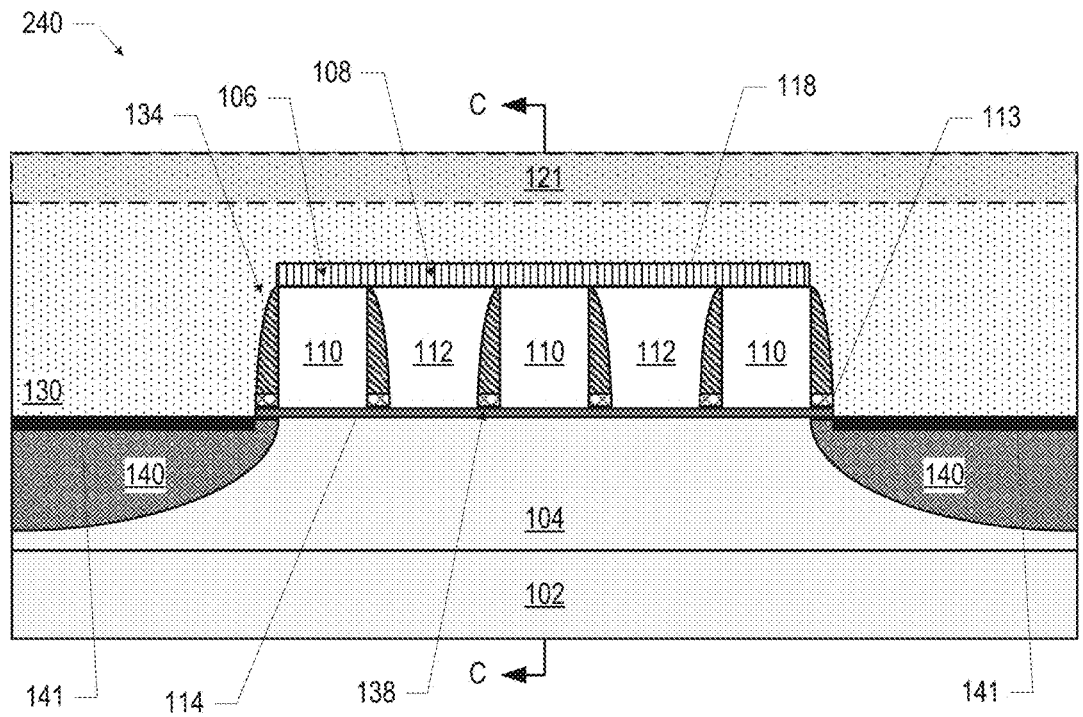
Figure 34:
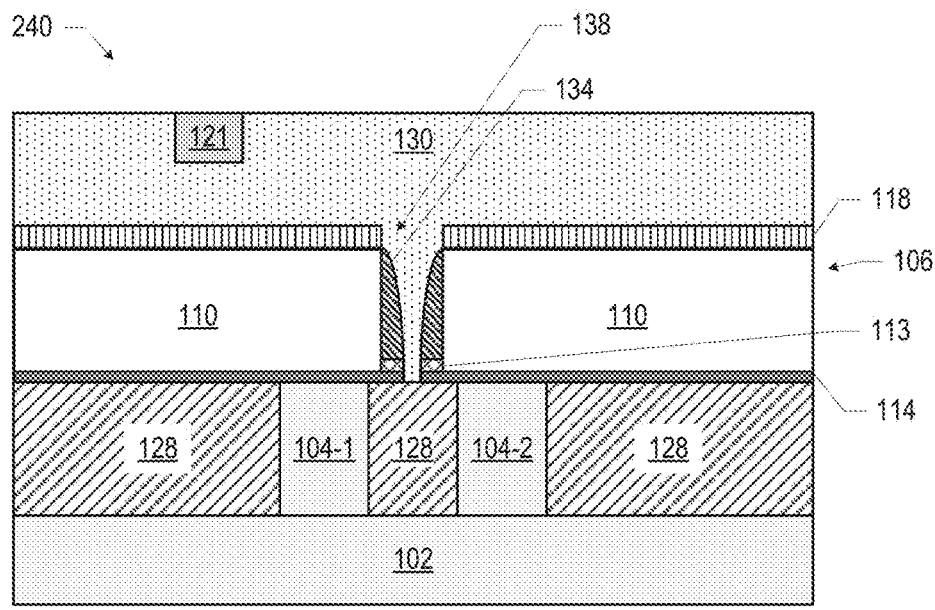

FIG. 33 is a cross-sectional view of an assembly 240 subsequent to filling the trench 125 of the assembly 238 (FIGS. 31 and 32) with a conductive material to form the magnet line 121. The magnet line 121 may be formed using any desired techniques (e.g., plating followed by planarization, or a semi-additive process), and may take the form of any of the embodiments disclosed herein. FIG. 34 is another cross-sectional view of the assembly 240, taken along the section C-C of FIG. 33.

Figure 35:
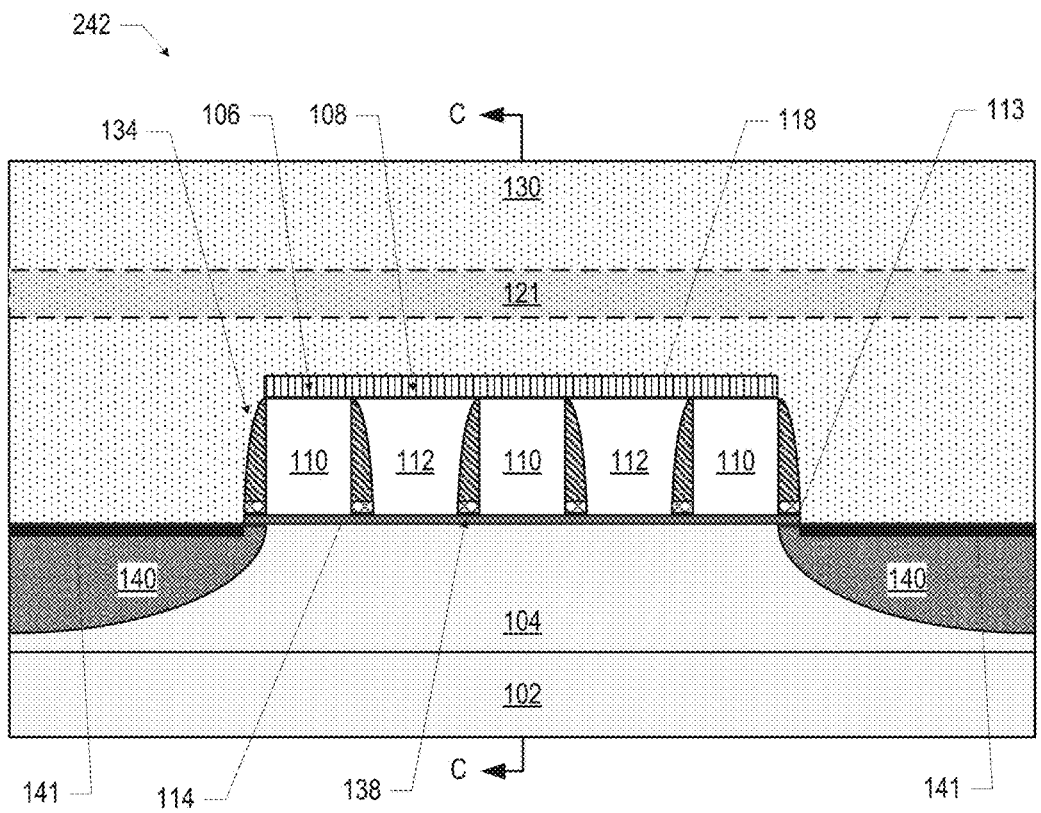
Figure 36:
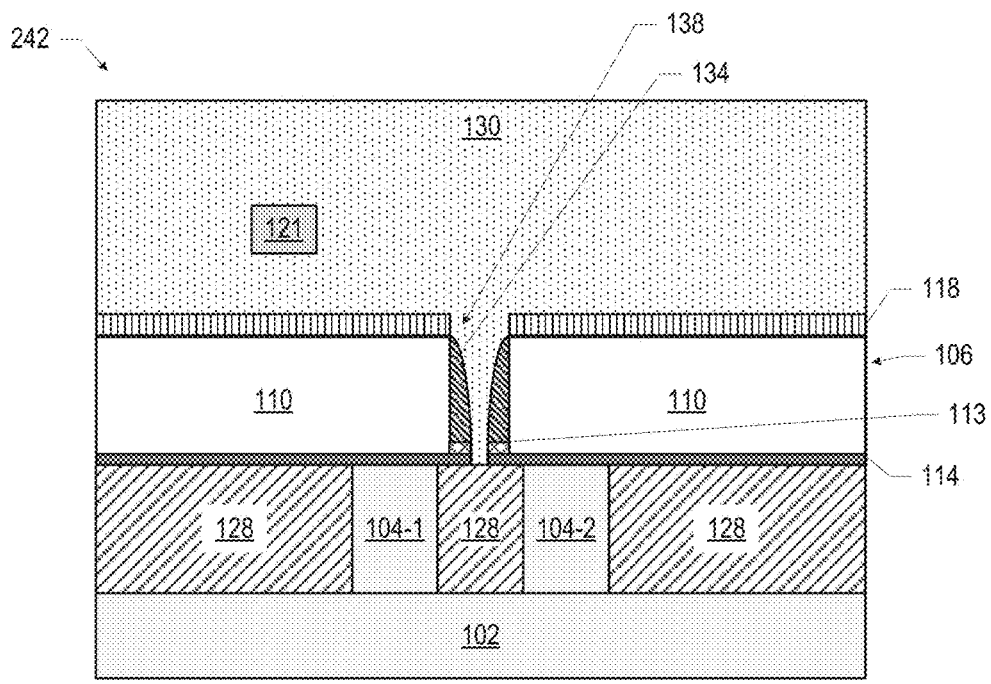

FIG. 35 is a cross-sectional view of an assembly 242 subsequent to providing additional insulating material 130 on the assembly 240 (FIGS. 33 and 34). The insulating material 130 provided on the assembly 240 may take any of the forms of the insulating material 130 discussed above. FIG. 36 is another cross-sectional view of the assembly 242, taken along the section C-C of FIG. 35.

Figure 37:
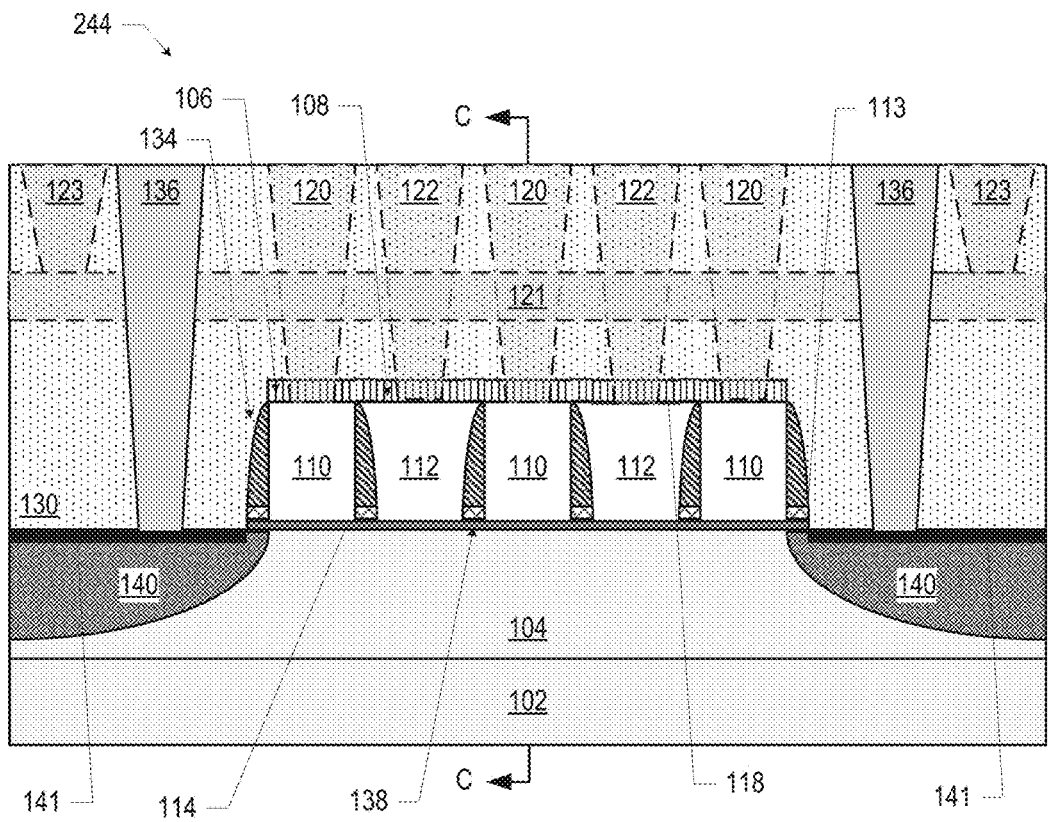
Figure 38:
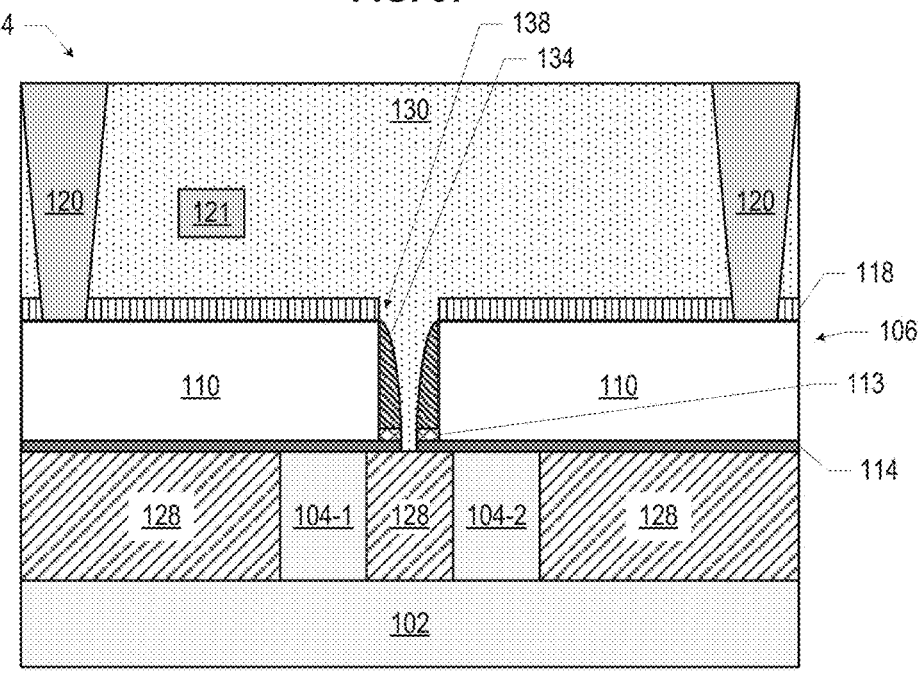

FIG. 37 is a cross-sectional view of an assembly 244 subsequent to forming, in the assembly 242 (FIGS. 35 and 36), conductive vias 120 through the insulating material 130 (and the hardmask 118) to contact the gate metal 110 of the gates 106, conductive vias 122 through the insulating material 130 (and the hardmask 118) to contact the gate metal 112 of the gates 108, conductive vias 136 through the insulating material 130 to contact the interface material 141 of the doped regions 140, and conductive vias 123 through the insulating material 130 to contact the magnet line 121. FIG. 38 is another cross-sectional view of the assembly 244, taken along the section C-C of FIG. 37. Further conductive vias and/or lines may be formed in the assembly 244 using conventional interconnect techniques, if desired. The resulting assembly 244 may take the form of the quantum dot device 100 discussed above with reference to FIGS. 1-3.

Figure 39:
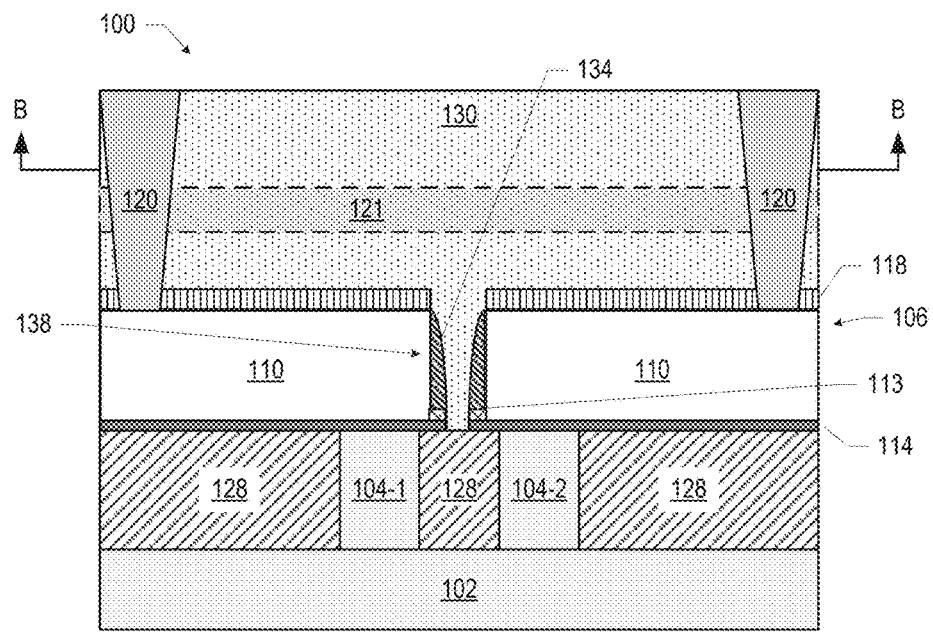
FIGS. 39-41 are cross-sectional views of other quantum dot devices, in accordance with various embodiments.
Figure 40:
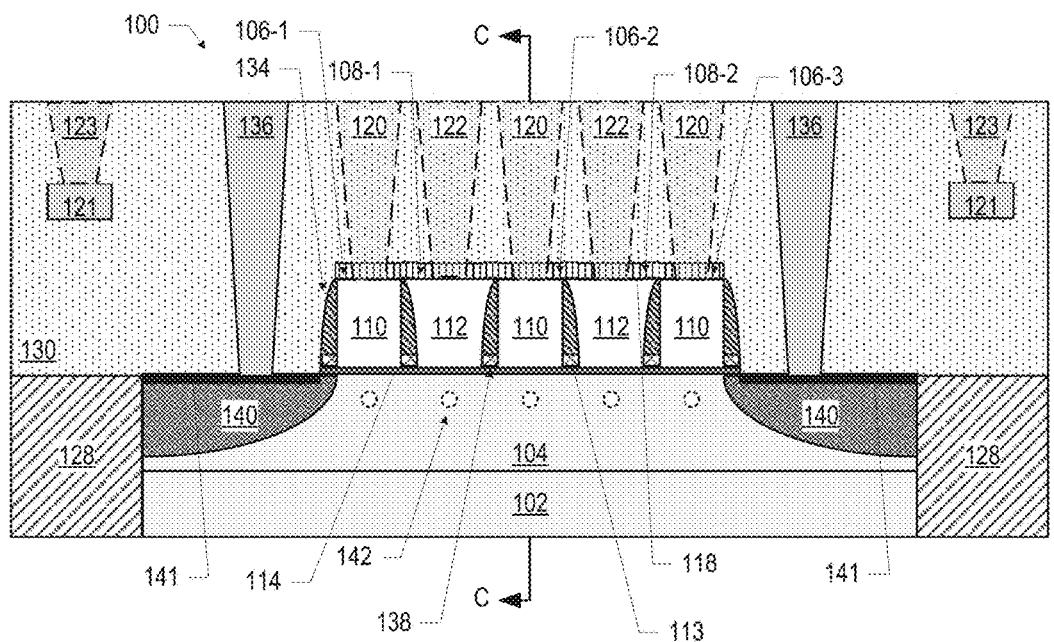
Figure 41:
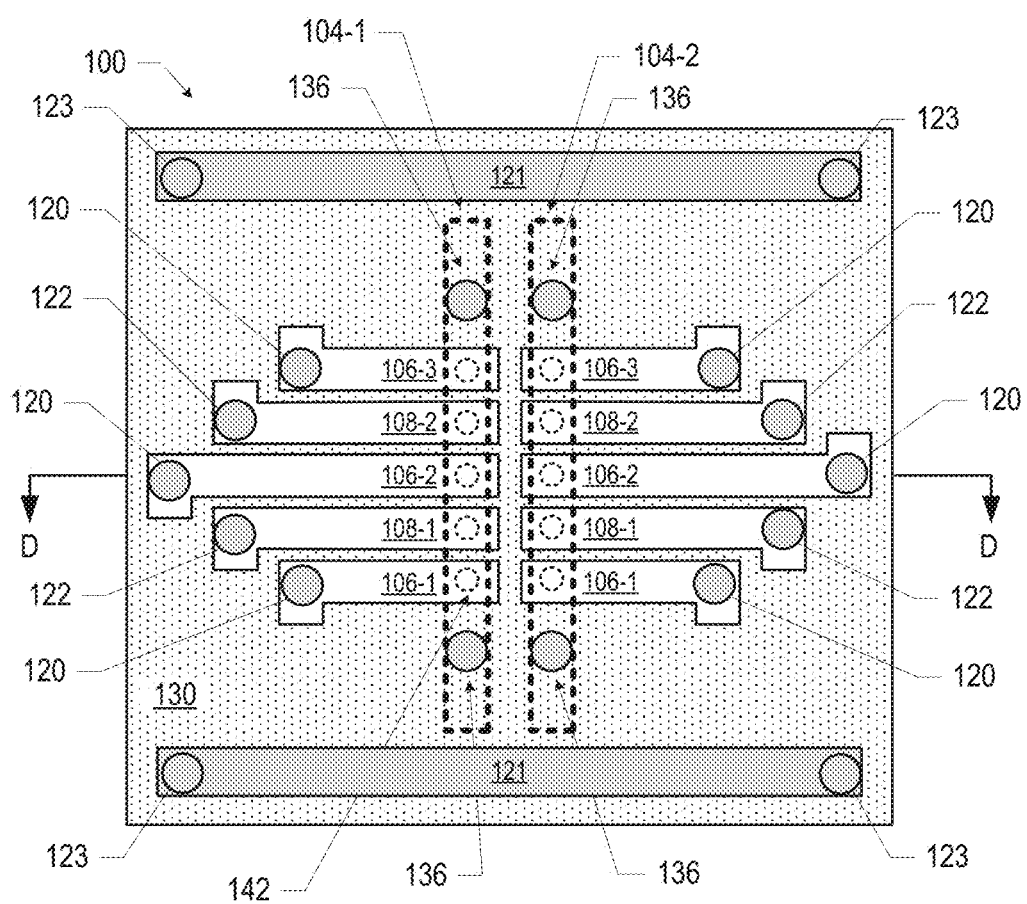

In the embodiment of the quantum dot device 100 illustrated in FIGS. 1-3, the magnet line 121 is oriented parallel to the longitudinal axes of the fins 104. In other embodiments, the magnet line 121 may not be oriented parallel to the longitudinal axes of the fins 104. For example, FIGS. 39-41 are various cross-sectional views of an embodiment of a quantum dot device 100 having multiple magnet lines 121, each proximate to the fins 104 and oriented perpendicular to the longitudinal axes of the fins 104. Other than orientation, the magnet lines 121 of the embodiment of FIGS. 39-41 may take the form of any of the embodiments of the magnet line 121 discussed above. The other elements of the quantum dot devices 100 of FIGS. 39-41 may take the form of any of those elements discussed herein. The manufacturing operations discussed above with reference to FIGS. 4-38 may be used to manufacture the quantum dot device 100 of FIGS. 39-41.

Although a single magnet line 121 is illustrated in FIGS. 1-3, multiple magnet lines 121 may be included in that embodiment of the quantum dot device 100 (e.g., multiple magnet lines 121 parallel to the longitudinal axes of the fins 104). For example, the quantum dot device 100 of FIGS. 1-3 may include a second magnet line 121 proximate to the fin 104-2 in a symmetric manner to the magnet line 121 illustrated proximate to the fin 104-1. In some embodiments, multiple magnet lines 121 may be included in a quantum dot device 100, and these magnet lines 121 may or may not be parallel to one another. For example, in some embodiments, a quantum dot device 100 may include two (or more) magnet lines 121 that are oriented perpendicular to each other (e.g., one or more magnet lines 121 oriented like those illustrated in FIGS. 1-3, and one or more magnet lines 121 oriented like those illustrated in FIGS. 39-41).

As discussed above, the base 102 and the fin 104 of a quantum dot device 100 may be formed from a substrate 144 and a quantum well stack 146 disposed on the substrate 144. The quantum well stack 146 may include a quantum well layer in which a 2DEG may form during operation of the quantum dot device 100. The quantum well stack 146 may take any of a number of forms, several of which are discussed below with reference to FIGS. 42-44. The various layers in the quantum well stacks 146 discussed below may be grown on the substrate 144 (e.g., using molecular beam epitaxy, CVD, or ALD). Although the singular term "layer" may be used to refer to various components of the quantum well stack 146 of FIGS. 42-44, any of the layers discussed below may include multiple materials arranged in any suitable manner. Layers other than the quantum well layer 152 in a quantum well stack 146 may have higher threshold voltages for conduction than the quantum well layer 152 so that when the quantum well layer 152 are biased at their threshold voltages, the quantum well layer 152 conducts and the other layers of the quantum well stack 146 do not. This may avoid parallel conduction in both the quantum well layer 152 and the other layers, and thus avoid compromising the strong mobility of the quantum well layer 152 with conduction in layers having inferior mobility.

Figure 42:
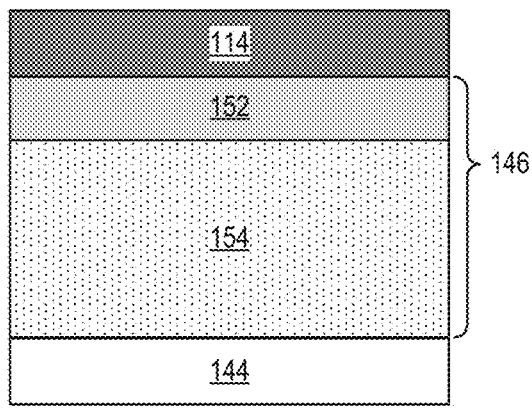
FIGS. 42-44 are cross-sectional views of example quantum well stacks and substrates that may be used in a quantum dot device, in accordance with various embodiments.

FIG. 42 is a cross-sectional view of a quantum well stack 146 on a substrate 144, and a gate dielectric 114 on the quantum well stack 146. The quantum well stack 146 may include a buffer layer 154 on the substrate 144, and a quantum well layer 152 on the buffer layer 154. In the embodiment of FIG. 42, the gate dielectric 114 may be directly on the quantum well layer 152. The quantum well layer 152 may be formed of a material such that, during operation of the quantum dot device 100, a 2DEG may form in the quantum well layer 152 proximate to the upper surface of the quantum well layer 152. As shown, the gate dielectric 114 may be disposed on the upper surface of the quantum well layer 152.

The quantum well layer 152 of the quantum well stacks 146 disclosed herein may include an isotopically purified material. As used herein, an "isotopically purified material" is a material whose composition of isotopes with nonzero nuclear spin is less than the natural abundance of those isotopes in the material. In other words, an isotopically purified material may include a lower atomic-percent of isotopes with nonzero nuclear spin than the natural abundance of those isotopies in the non-isotopically purified material. Isotopes with nonzero nuclear spin may cause a reduction of the electron spin coherence time in a quantum dot device 100 due to hyperfine coupling of the electron spin to the nuclear spin bath and intrinsic interactions between nuclear spins; reducing the presence of these isotopes in a quantum well layer 152 (and/or other layers in a quantum well stack 146) may improve qubit coherence and thus performance. The isotopically purified materials disclosed herein may be grown by centrifuging a precursor material to isolate different isotopes by mass, and then using only the desired isotopes as precursors for growth of the desired material. In some embodiments of the quantum well stacks 146 disclosed herein, an isotopically purified material (e.g., zinc, cadmium, tellurium, selenium, sulfur, iron, lead, tin, carbon, germanium, silicon, hafnium, zirconium, titanium, strontium, or yttrium, as discussed below) may include greater than 90 atomic-percent of stable isotopes with zero nuclear spin (and less than 10 atomic-percent of isotopes with nonzero nuclear spin).

In some embodiments, the quantum well layer 152 of a quantum well stack 146 may include or be formed of silicon. The silicon may be an isotopically purified silicon, having a lower 29Si content than the natural abundance of 29Si in silicon. For example, in some embodiments, the silicon included in a quantum well layer 152 may have a 29Si content that is less than 4 atomic-percent (e.g., less than 3 atomic-percent, less than 2 atomic-percent, less than 1 atomic-percent, or less than 0.1 atomic-percent). In some embodiments, the silicon included in a quantum well layer 152 may have a 28Si content that is greater than 93 atomic-percent (e.g., greater than 94 atomic-percent, greater than 95 atomic-percent, greater than 96 atomic-percent, greater than 97 atomic-percent, greater than 98 atomic-percent, or greater than 99 atomic-percent). Embodiments in which the quantum well layer 152 is formed of intrinsic silicon may be particularly advantageous for electron-type quantum dot devices 100.

In some embodiments, the quantum well layer 152 of a quantum well stack 146 may include or be formed of germanium. The germanium may be an isotopically purified germanium, having a lower 73Ge content than the natural abundance of 73Ge in silicon. For example, in some embodiments, the germanium included in a quantum well layer 152 may have a 73Ge content that is less than 7 atomic-percent (e.g., less than 6 atomic-percent, less than 5 atomic-percent, less than 4 atomic-percent, less than 3 atomic-percent, less than 2 atomic-percent, or less than 1 atomic-percent). In some embodiments, the germanium included in a quantum well layer 152 may have a 70Ge content that is greater than 21 atomic-percent (e.g., greater than 90 atomic-percent). In some embodiments, the germanium included in a quantum well layer 152 may have a 72Ge content that is greater than 28 atomic-percent (e.g., greater than 90 atomic-percent). In some embodiments, the germanium included in a quantum well layer 152 may have a 74Ge content that is greater than 37 atomic-percent (e.g., greater than 90 atomic-percent). In some embodiments, the germanium included in a quantum well layer 152 may have a 76Ge content that is greater than 8 atomic-percent (e.g., greater than 90 atomic-percent). Embodiments in which the quantum well layer 152 is formed of intrinsic germanium may be particularly advantageous for hole-type quantum dot devices 100. In some embodiments, the quantum well layer 152 may include isotopically purified silicon and isotopically purified germanium (e.g., silicon germanium grown from isotopically purified silicon and isotopically purified germanium precursors).

In some embodiments, the quantum well layer 152 of a quantum well stack 146 may include isotopically purified zinc. For example, in some embodiments, the zinc included in a quantum well layer 152 may have a 67Zn content that is less than 4 atomic-percent (e.g., less than 3 atomic-percent, less than 2 atomic-percent, or less than 1 atomic-percent). In some embodiments, the zinc included in a quantum well layer 152 may have a 64Zn content that is greater than 50 atomic-percent (e.g., greater than 90 atomic-percent). In some embodiments, the zinc included in a quantum well layer 152 may have a 66Zn content that is greater than 28 atomic-percent (e.g., greater than 90 atomic-percent).

In some embodiments, the quantum well layer 152 of a quantum well stack 146 may include isotopically purified cadmium. For example, in some embodiments, the cadmium included in a quantum well layer 152 may have a 111Cd content that is less than 12 atomic-percent (e.g., less than 10 atomic-percent, less than 5 atomic-percent, or less than 1 atomic-percent). In some embodiments, the cadmium included in a quantum well layer 152 may have a 113Cd content that is less than 12 atomic-percent (e.g., less than 10 atomic-percent, less than 5 atomic-percent, or less than 1 atomic-percent). In some embodiments, the cadmium included in a quantum well layer 152 may have a 114Cd content that is greater than 29 atomic-percent (e.g., greater than 90 atomic-percent).

In some embodiments, the quantum well layer 152 of a quantum well stack 146 may include isotopically purified tellurium. For example, in some embodiments, the tellurium included in a quantum well layer 152 may have a 123Te content that is less than 0.9 atomic-percent (e.g., less than 0.5 atomic-percent). In some embodiments, the tellurium included in a quantum well layer 152 may have a 125Te content that is less than 7 atomic-percent (e.g., less than 5 atomic-percent, less than 2 atomic-percent, or less than 1 atomic-percent). In some embodiments, the tellurium included in a quantum well layer 152 may have a 128Te content that is greater than 32 atomic-percent (e.g., greater than 90 atomic-percent). In some embodiments, the tellurium included in a quantum well layer 152 may have a 130Te content that is greater than 35 atomic-percent (e.g., greater than 90 atomic-percent).

In some embodiments, the quantum well layer 152 of a quantum well stack 146 may include isotopically purified selenium. For example, in some embodiments, the selenium included in a quantum well layer 152 may have a 77Se content that is less than 7 atomic-percent (e.g., less than 5 atomic-percent, less than 2 atomic-percent, or less than 1 atomic-percent). In some embodiments, the selenium included in a quantum well layer 152 may have a 78Se content that is greater than 24 atomic-percent (e.g., greater than 90 atomic-percent). In some embodiments, the selenium included in a quantum well layer 152 may have an 80Se content that is greater than 50 atomic-percent (e.g., greater than 90 atomic-percent).

In some embodiments, the quantum well layer 152 of a quantum well stack 146 may include isotopically purified sulfur. For example, in some embodiments, the sulfur included in a quantum well layer 152 may have a 33S content that is less than 0.8 atomic-percent (e.g., less than 0.5 atomic-percent, less than 0.2 atomic-percent, or less than 0.1 atomic-percent). In some embodiments, the sulfur included in a quantum well layer 152 may have a 32S content that is greater than 95 atomic-percent.

In some embodiments, the quantum well layer 152 of a quantum well stack 146 may include isotopically purified iron. For example, in some embodiments, the iron included in a quantum well layer 152 may have a 57Fe content that is less than 2 atomic-percent (e.g., less than 1 atomic-percent, or less than 0.5 atomic-percent). In some embodiments, the iron included in a quantum well layer 152 may have a 56Fe content that is greater than 92 atomic-percent.

In some embodiments, the quantum well layer 152 of a quantum well stack 146 may include isotopically purified lead. For example, in some embodiments, the lead included in a quantum well layer 152 may have a 207Pb content that is less than 22 atomic-percent (e.g., less than 10 atomic-percent, less than 2 atomic-percent, or less than 1 atomic-percent). In some embodiments, the lead included in a quantum well layer 152 may have a 208Pb content that is greater than 53 atomic-percent (e.g., greater than 90 atomic-percent).

In some embodiments, the quantum well layer 152 of a quantum well stack 146 may include isotopically purified tin. For example, in some embodiments, the tin included in a quantum well layer 152 may have a 119Sn content that is less than 8 atomic-percent (e.g., less than 5 atomic-percent, less than 2 atomic-percent, or less than 1 atomic-percent). In some embodiments, the tin included in a quantum well layer 152 may have a 117Sn content that is less than 7 atomic-percent (e.g., less than 5 atomic-percent, less than 2 atomic-percent, or less than 1 atomic-percent). In some embodiments, the tin included in a quantum well layer 152 may have a 115Sn content that is less than 0.3 atomic-percent (e.g., less than 0.2 atomic-percent). In some embodiments, the tin included in a quantum well layer 152 may have a 120Sn content that is greater than 33 atomic-percent (e.g., greater than 90 atomic-percent). In some embodiments, the tin included in a quantum well layer 152 may have a 118Sn content that is greater than 25 atomic-percent (e.g., greater than 90 atomic-percent).

In some embodiments, the quantum well layer 152 of a quantum well stack 146 may include isotopically purified carbon. For example, in some embodiments, the carbon included in a quantum well layer 152 may have a 13C content that is less than 1 atomic-percent (e.g., less than 0.5 atomic-percent, or less than 0.2 atomic-percent. In some embodiments, the carbon included in a quantum well layer 152 may have a 12C content that is greater than 99 atomic-percent.

In some embodiments, material layers that are adjacent or proximate to the quantum well layer 152 (e.g., other layers in a quantum well stack 146 or outside the quantum well stack 146) may also include an isotopically purified material to reduce electron spin dephasing in the quantum well layer 152 induced by nuclear spins outside the quantum well layer 152.

In some embodiments, the gate dielectric 114 (e.g., the gate dielectric 114 of FIG. 42) may include an isotopically purified material. For example, the gate dielectric 114 may include isotopically purified silicon (e.g., in accordance with any of the embodiments discussed above). In some embodiments, the gate dielectric 114 may include oxygen and isotopically purified silicon (e.g., as silicon oxide). In another example, the gate dielectric 114 may include isotopically purified germanium (e.g., in accordance with any of the embodiments discussed above). In some embodiments, the gate dielectric 114 may include oxygen and isotopically purified germanium (e.g., as germanium oxide).

In some embodiments, the gate dielectric 114 may include isotopically purified hafnium. For example, the hafnium included in a gate dielectric 114 may have a 177Hf content that is less than 18 atomic-percent (e.g., less than 10 atomic-percent, less than 5 atomic-percent, or less than 1 atomic-percent). In some embodiments, the hafnium included in a gate dielectric 114 may have a 179Hf content that is less than 13 atomic-percent (e.g., less than 10 atomic-percent, less than 5 atomic-percent, or less than 1 atomic-percent). In some embodiments, the hafnium included in a gate dielectric 114 may have a 178Hf content that is greater than 28 atomic-percent (e.g., greater than 90 atomic-percent). In some embodiments, the hafnium included in a gate dielectric 114 may have a 180Hf content that is greater than 36 atomic-percent. In some embodiments, the gate dielectric 114 may include oxygen and isotopically purified hafnium (e.g., as hafnium oxide) (e.g., greater than 90 atomic-percent).

In some embodiments, the gate dielectric 114 may include isotopically purified zirconium. For example, the zirconium included in a gate dielectric 114 may have a 91Zr content that is less than 11 atomic-percent (e.g., less than 10 atomic-percent, less than 5 atomic-percent, or less than 1 atomic-percent). In some embodiments, the zirconium included in a gate dielectric 114 may have a 90Zr content that is greater than 52 atomic-percent. In some embodiments, the gate dielectric 114 may include oxygen and isotopically purified zirconium (e.g., as zirconium oxide).

In some embodiments, the gate dielectric 114 may include isotopically purified titanium. For example, the titanium included in a gate dielectric 114 may have a 47Ti content that is less than 7 atomic-percent (e.g., less than 5 atomic-percent, less than 2 atomic-percent, or less than 1 atomic-percent). In some embodiments, the titanium included in a gate dielectric 114 may have a 49Ti content that is less than 5 atomic-percent (e.g., less than 2 atomic-percent, or less than 1 atomic-percent). In some embodiments, the titanium included in a gate dielectric 114 may have a 48Ti content that is greater than 74 atomic-percent (e.g., greater than 90 atomic-percent). In some embodiments, the gate dielectric 114 may include oxygen and isotopically purified titanium (e.g., as titanium oxide).

In some embodiments, the gate dielectric 114 may include isotopically purified strontium. For example, the strontium included in a gate dielectric 114 may have an 87Sr content that is less than 7 atomic-percent (e.g., less than 5 atomic-percent, less than 2 atomic-percent, or less than 1 atomic-percent). In some embodiments, the strontium included in a gate dielectric 114 may have an 88Sr content that is greater than 83 atomic-percent (e.g., greater than 90 atomic-percent). In some embodiments, the gate dielectric 114 may include oxygen and isotopically purified strontium (e.g., as strontium oxide).

In some embodiments, the gate dielectric 114 may include isotopically purified yttrium. For example, the yttrium included in a gate dielectric 114 may have a 171Y content that is less than 14 atomic-percent (e.g., less than 10 atomic-percent, less than 5 atomic-percent, or less than 1 atomic-percent). In some embodiments, the yttrium included in a gate dielectric 114 may have a 173Y content that is less than 16 atomic-percent (e.g., less than 10 atomic-percent, less than 5 atomic-percent, or less than 1 atomic-percent). In some embodiments, the yttrium included in a gate dielectric 114 may have a 174Y content that is greater than 32 atomic-percent (e.g., greater than 90 atomic-percent). In some embodiments, the yttrium included in a gate dielectric 114 may have a 172Y content that is greater than 22 atomic-percent (e.g., greater than 90 atomic-percent). In some embodiments, the gate dielectric 114 may include oxygen and isotopically purified yttrium (e.g., as yttrium oxide).

The buffer layer 154 may be formed of the same material as the quantum well layer 152, and may be present to trap defects that form in this material as it is grown on the substrate 144. In some embodiments, the quantum well layer 152 may be formed of isotopically purified silicon, and the buffer layer 154 may be formed of intrinsic silicon. In some embodiments, the quantum well layer 152 may be formed of isotopically purified germanium, and the buffer layer 154 may be formed of intrinsic germanium. In some embodiments, the buffer layer 154 may be grown under different conditions (e.g., deposition temperature or growth rate) from the quantum well layer 152. In particular, the quantum well layer 152 may be grown under conditions that achieve fewer defects than in the buffer layer 154. In some embodiments in which the buffer layer 154 includes silicon germanium, the silicon germanium of the buffer layer 154 may have a germanium content that varies from the substrate 144 to the quantum well layer 152; for example, the silicon germanium of the buffer layer 154 may have a germanium content that varies from zero percent at the substrate to a nonzero percent (e.g., 30 atomic-percent) at the quantum well layer 152.

As noted above, it may be advantageous for materials that are adjacent or proximate to the quantum well layer 152 to include isotopically purified materials to reduce electron spin dephasing. Thus, in some embodiments, at least the upper portion of the buffer layer 154 (e.g., the upper 50 nanometers to 100 nanometers of the buffer layer 154) may include an isotopically purified material (e.g., isotopically purified silicon or germanium).

Figure 43:
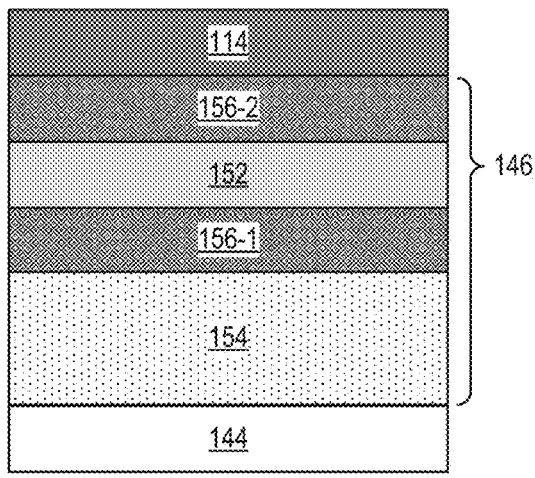

FIG. 43 is a cross-sectional view of an arrangement including a substrate 144, a quantum well stack 146, and a gate dielectric 114. The quantum well stack 146 of FIG. 43 may include a buffer layer 154, a barrier layer 156-1, a quantum well layer 152, and an additional barrier layer 156-2. The barrier layer 156-1 (156-2) may provide a potential barrier between the quantum well layer 152 and the buffer layer 154 (gate dielectric 114). In the embodiment of FIG. 43, the barrier layers 156 may include an isotopically purified material, such as any of the materials discussed above with reference to the quantum well layer 152. For example, the portions of the barrier layers 156 adjacent to the quantum well layer 152 (e.g., the 25 nanometers to 100 nanometers of the barrier layers 156 closest to the quantum well layer 152) may include an isotopically purified material (while the remainder of the barrier layers 156 may or may not include an isotopically purified material). In the embodiment of FIG. 43, the buffer layer 154 and/or the gate dielectric 114 may or may not include an isotopically purified material; more generally, the buffer layer 154 and/or the gate dielectric 114 of FIG. 43 may take the form of any suitable ones of the embodiments disclosed herein. In some embodiments in which the quantum well layer 152 includes silicon or germanium, the barrier layers 156 may include silicon germanium (e.g., isotopically purified silicon and isotopically purified germanium). The germanium content of this silicon germanium may be between 20 atomic-percent and 80 atomic-percent (e.g., between 30 atomic-percent and 70 atomic-percent).

In some embodiments of the arrangement of FIG. 43, the buffer layer 154 and the barrier layer 156-1 may be formed of silicon germanium. In some such embodiments, the silicon germanium of the buffer layer 154 may have a germanium content that varies from the substrate 144 to the barrier layer 156-1; for example, the silicon germanium of the buffer layer 154 may have a germanium content that varies from zero percent at the substrate to a nonzero percent (e.g., between 30 atomic-percent and 70 atomic-percent) at the barrier layer 156-1. The barrier layer 156-1 may in turn have a germanium content equal to the nonzero percent. In other embodiments, the buffer layer 154 may have a germanium content equal to the germanium content of the barrier layer 156-1 but may be thicker than the barrier layer 156-1 to absorb the defects that arise during growth. In some embodiments of the quantum well stack 146 of FIG. 43, the barrier layer 156-2 may be omitted.

Figure 44:
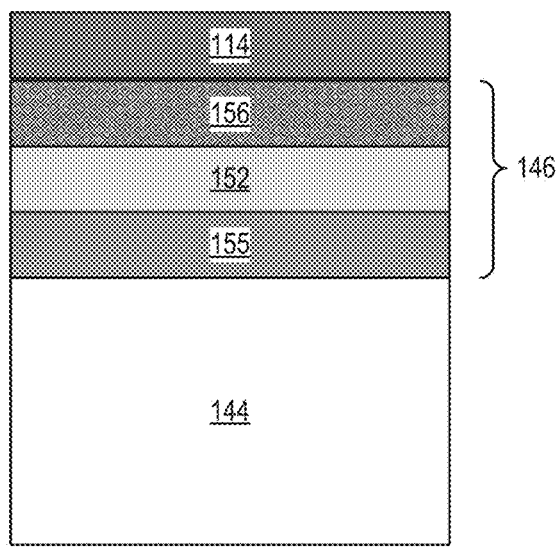

FIG. 44 is a cross-sectional view of another example quantum well stack 146 on an example substrate 144, with a gate dielectric 114 on the quantum well stack 146. The quantum well stack 146 of FIG. 45 may include an insulating layer 155 on the substrate 144, a quantum well layer 152 on the insulating layer 155, and a barrier layer 156 on the quantum well layer 152. The presence of the insulating layer 155 may help confine carriers to the quantum well layer 152, providing high valley splitting during operation.

The insulating layer 155 may include any suitable electrically insulating material. For example, in some embodiments, the insulating layer 155 may be an oxide (e.g., silicon oxide or hafnium oxide). In some embodiments, to improve qubit coherence in the quantum well layer 152, the insulating layer 155 may include an isotopically purified material (e.g., any of the materials discussed above with reference to the gate dielectric 114). The substrate 144, the quantum well layer 152, and the barrier layer 156 of FIG. 44 may take the form of any of the embodiments disclosed herein. In some embodiments, the quantum well layer 152 may be formed on the insulating layer 155 by a layer transfer technique. In some embodiments, the barrier layer 156 may be omitted from the quantum well stack 146 of FIG. 44.

The thicknesses (i.e., z-heights) of the layers in the quantum well stacks 146 of FIGS. 42-44 may take any suitable values. For example, in some embodiments, the thickness of the quantum well layer 152 may be between 5 nanometers and 15 nanometers (e.g., approximately equal to 10 nanometers). In some embodiments, the thickness of a buffer layer 154 may be between 0.3 microns and 4 microns (e.g., between 0.3 microns and 2 microns, or approximately 0.5 microns). In some embodiments, the thickness of the barrier layers 156 may be between 0 nanometers and 300 nanometers. In some embodiments, the thickness of the insulating layer 155 in the quantum well stack 146 of FIG. 45 may be between 5 nanometers and 200 nanometers.

The substrate 144 and the quantum well stack 146 may be distributed between the base 102 and the fins 104 of the quantum dot device 100, as discussed above. This distribution may occur in any of a number of ways. For example, FIGS. 45-51 illustrate example base/fin arrangements 158 that may be used in a quantum dot device 100, in accordance with various embodiments.

Figure 45:
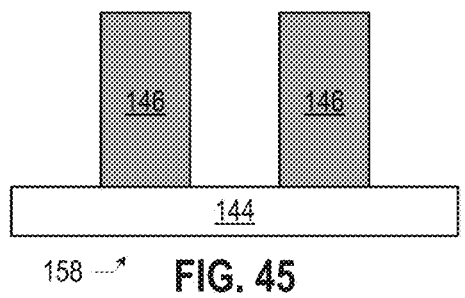
FIGS. 45-51 illustrate example base/fin arrangements that may be used in a quantum dot device, in accordance with various embodiments.

In the base/fin arrangement 158 of FIG. 45, the quantum well stack 146 may be included in the fins 104, but not in the base 102. The substrate 144 may be included in the base 102, but not in the fins 104. When the base/fin arrangement 158 of FIG. 45 is used in the manufacturing operations discussed with reference to FIGS. 5-6, the fin etching may etch through the quantum well stack 146, and stop when the substrate 144 is reached.

Figure 46:
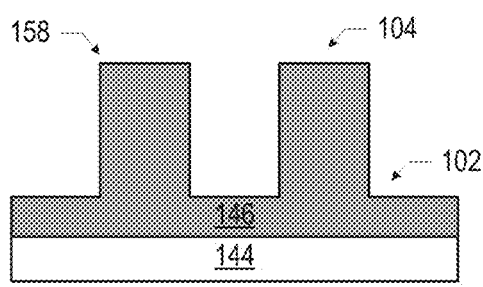
Figure 47:
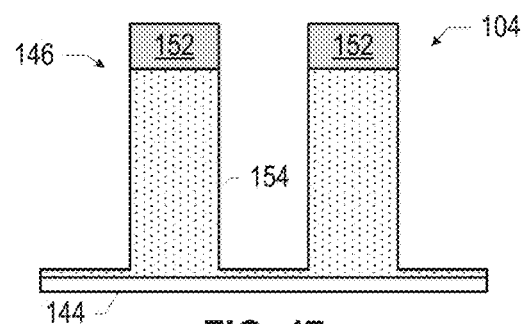

In the base/fin arrangement 158 of FIG. 46, the quantum well stack 146 may be included in the fins 104, as well as in a portion of the base 102. A substrate 144 may be included in the base 102 as well, but not in the fins 104. When the base/fin arrangement 158 of FIG. 46 is used in the manufacturing operations discussed with reference to FIGS. 5-6, the fin etching may etch partially through the quantum well stack 146, and stop before the substrate 144 is reached. FIG. 47 illustrates a particular embodiment of the base/fin arrangement 158 of FIG. 46. In the embodiment of FIG. 47, the quantum well stack 146 of FIG. 42 is used; the base 102 includes the substrate 144 and a portion of the buffer layer 154 of the quantum well stack 146, while the fins 104 include the remainder of the quantum well stack 146.

Figure 48:
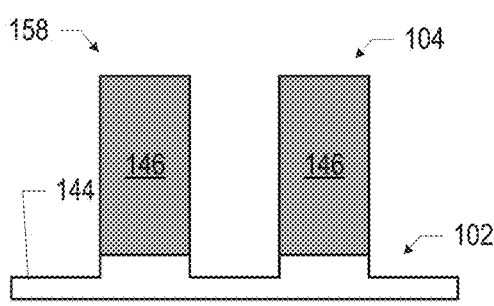
Figure 49:
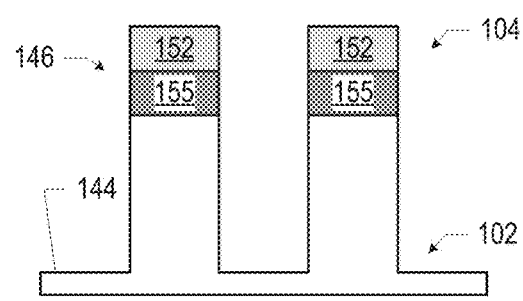

In the base/fin arrangement 158 of FIG. 48, the quantum well stack 146 may be included in the fins 104, but not the base 102. The substrate 144 may be partially included in the fins 104, as well as in the base 102. When the base/fin arrangement 158 of FIG. 48 is used in the manufacturing operations discussed with reference to FIGS. 5-6, the fin etching may etch through the quantum well stack 146 and into the substrate 144 before stopping. FIG. 49 illustrates a particular embodiment of the base/fin arrangement 158 of FIG. 48. In the embodiment of FIG. 49, the quantum well stack 146 of FIG. 45 is used; the fins 104 include the quantum well stack 146 and a portion of the substrate 144, while the base 102 includes the remainder of the substrate 144.

Figure 50:
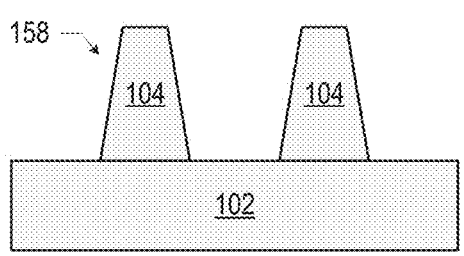
Figure 51:
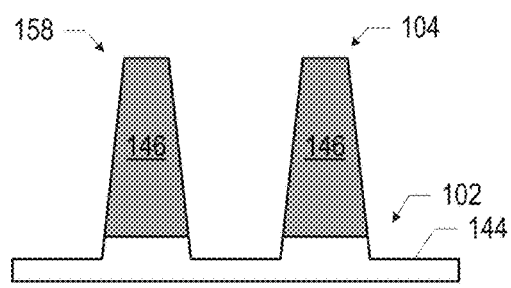

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 50, in some embodiments, the fins 104 may be tapered. In some embodiments, the fins 104 may taper by 3 nanometers to 10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 50. FIG. 51 illustrates a particular embodiment of the base/fin arrangement 158 of FIG. 50. In FIG. 51, the quantum well stack 146 is included in the tapered fins 104 while a portion of the substrate 144 is included in the tapered fins and a portion of the substrate 144 provides the base 102.

Figure 52:
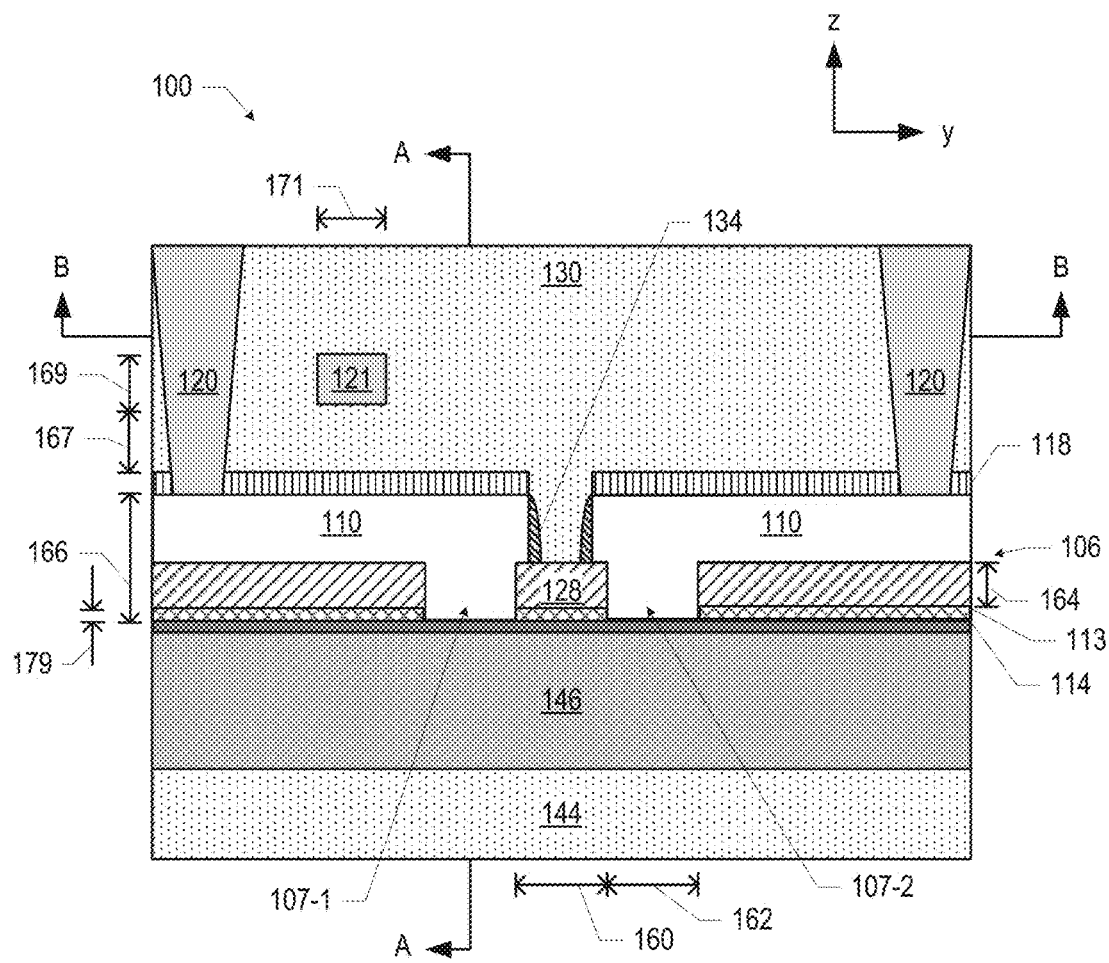
FIGS. 52-54 are cross-sectional views of a quantum dot device, in accordance with various embodiments.
Figure 53:
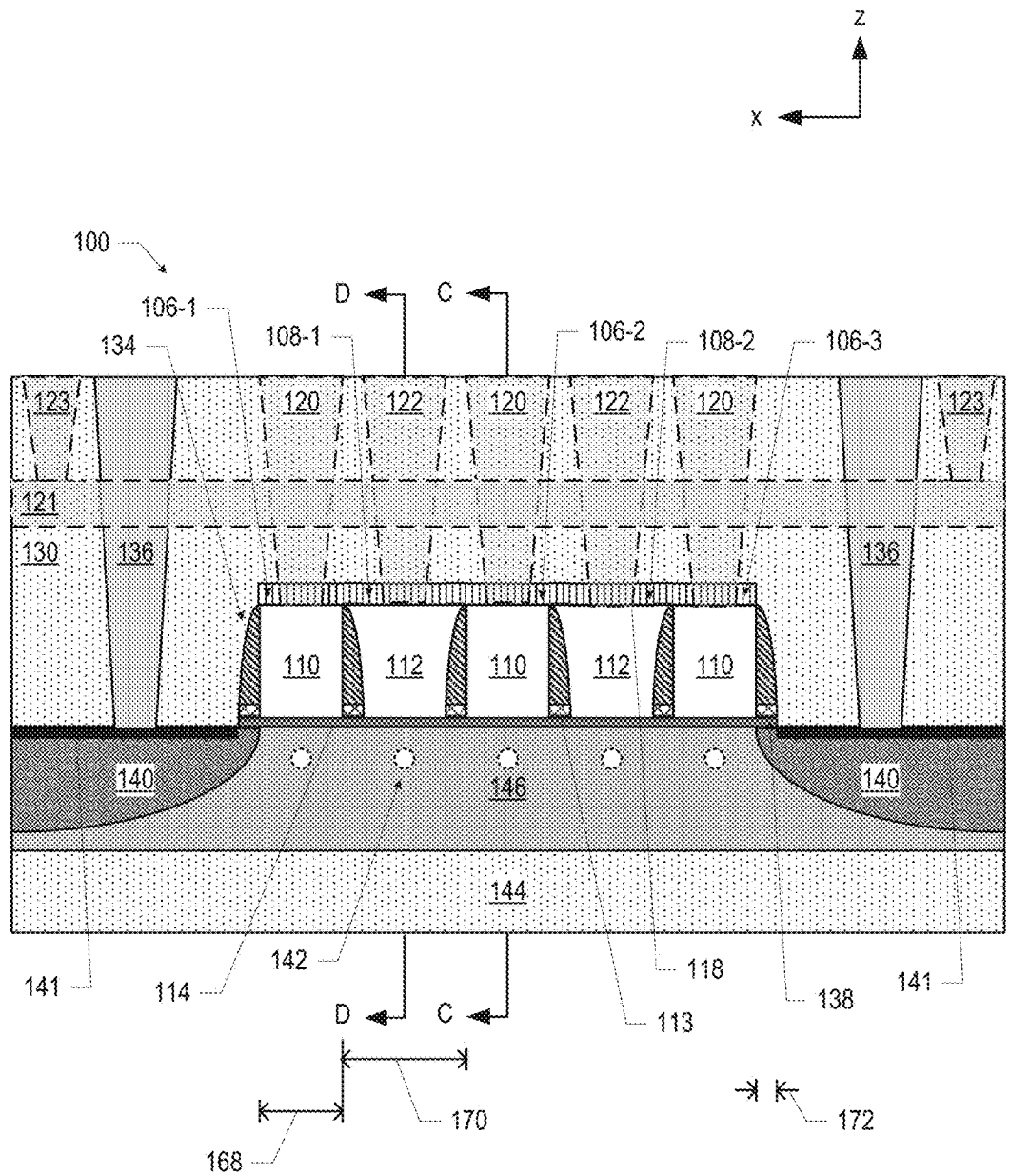
Figure 54:
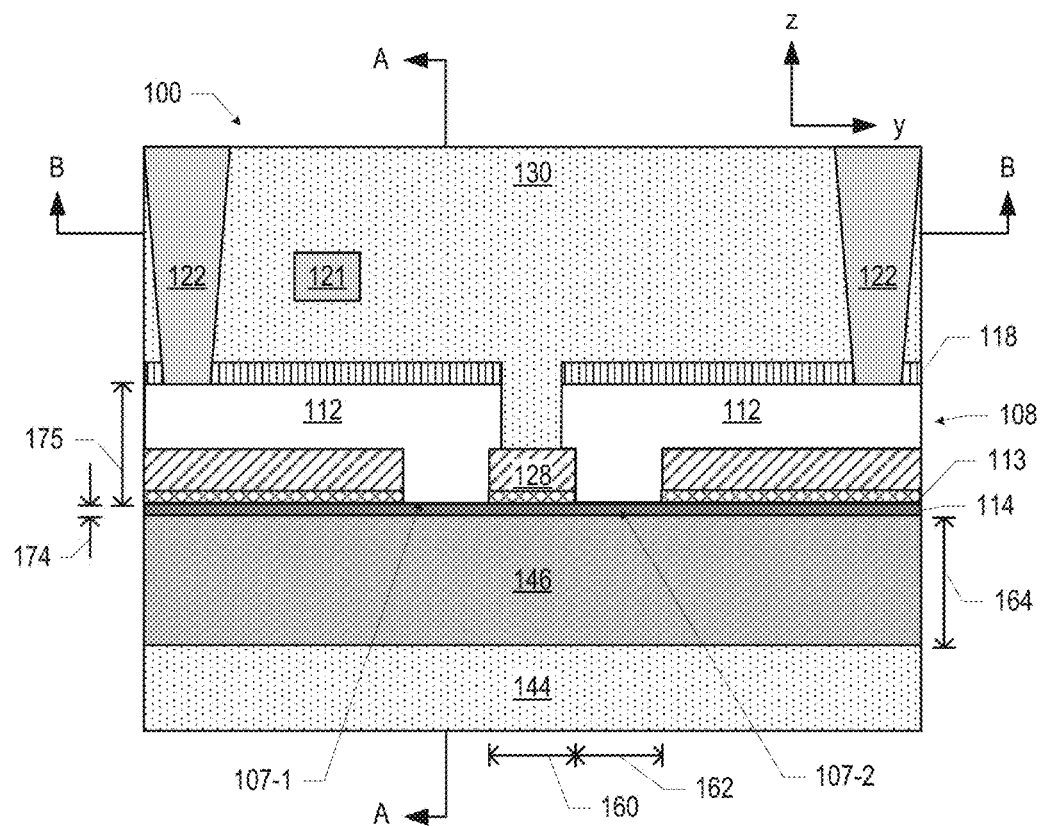

FIGS. 52-54 are cross-sectional views of another embodiment of a quantum dot device 100, in accordance with various embodiments. In particular, FIG. 53 illustrates the quantum dot device 100 taken along the section A-A of FIG. 52 (while FIG. 52 illustrates the quantum dot device 100 taken along the section C-C of FIG. 53), and FIG. 54 illustrates the quantum dot device 100 taken along the section D-D of FIG. 53 (while FIG. 53 illustrates the quantum dot device 100 taken along the section A-A of FIG. 54). The quantum dot device 100 of FIGS. 52-54, taken along the section B-B of FIG. 52, may be the same as illustrated in FIG. 3. Although FIG. 52 indicates that the cross-section illustrated in FIG. 53 is taken through the trench 107-1, an analogous cross-section taken through the trench 107-2 may be identical, and thus the discussion of FIG. 53 refers generally to the "trench 107."

The quantum dot device 100 may include a quantum well stack 146 disposed on a substrate 144. A layer of gate dielectric 114 may be disposed on the quantum well stack 146, a layer of shield dielectric 113 may be disposed on the layer of gate dielectric 114, and an insulating material 128 may be disposed on the layer of shield dielectric 113. Multiple trenches 107 in the insulating material 128 may extend towards the quantum well stack 146. In the embodiment illustrated in FIGS. 52-54, the gate dielectric 114 may provide the "bottom" of the trenches 107. The quantum well stack 146 of the quantum dot device 100 of FIGS. 52-54 may take the form of any of the quantum well stacks disclosed herein (e.g., as discussed above with reference to FIGS. 42-44). The various layers in the quantum well stack 146 of FIGS. 52-54 may be grown on the substrate 144 (e.g., using epitaxial processes).

Figure 78:
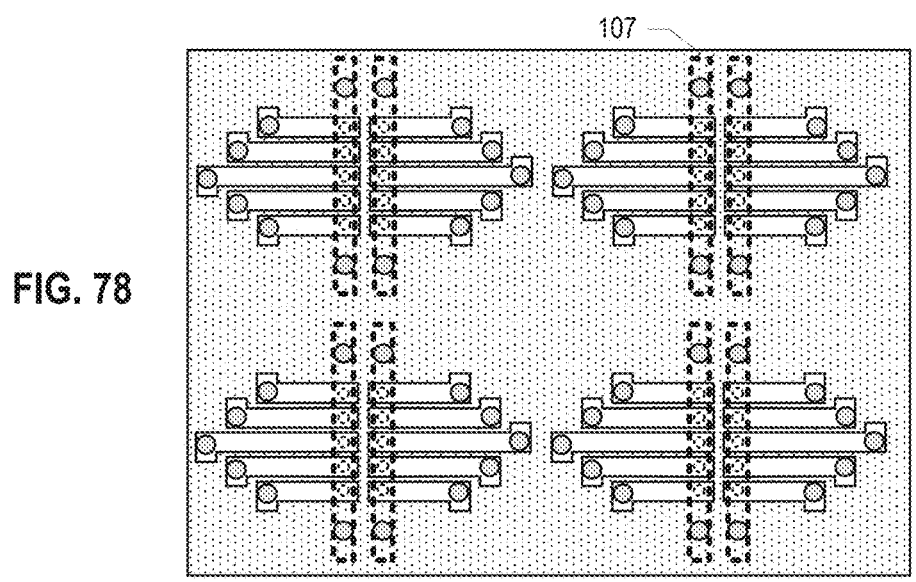
FIG. 78 illustrates an embodiment of a quantum dot device having multiple trenches arranged in a two-dimensional array, in accordance with various embodiments.

Although only two trenches, 107-1 and 107-2, are shown in FIGS. 52-54, this is simply for ease of illustration, and more than two trenches 107 may be included in the quantum dot device 100. In some embodiments, the total number of trenches 107 included in the quantum dot device 100 is an even number, with the trenches 107 organized into pairs including one active trench 107 and one read trench 107, as discussed in detail below. When the quantum dot device 100 includes more than two trenches 107, the trenches 107 may be arranged in pairs in a line (e.g., 2N trenches total may be arranged in a 1×2N line, or a 2×N line) or in pairs in a larger array (e.g., 2N trenches total may be arranged as a 4×N/2 array, a 6×N/3 array, etc.). For example, FIG. 78 illustrates a quantum dot device 100 including an example two-dimensional array of trenches 107. As illustrated in FIGS. 52 and 54, in some embodiments, multiple trenches 107 may be oriented in parallel. The discussion herein will largely focus on a single pair of trenches 107 for ease of illustration, but all the teachings of the present disclosure apply to quantum dot devices 100 with more trenches 107.

As discussed above with reference to FIGS. 1-3, in the quantum dot device 100 of FIGS. 52-54, a quantum well layer itself may provide a geometric constraint on the z-location of quantum dots in the quantum well stack 146. To control the x- and y-location of quantum dots in the quantum well stack 146, voltages may be applied to gates disposed at least partially in the trenches 107 above the quantum well stack 146 to adjust the energy profile along the trenches 107 in the x- and y-direction and thereby constrain the x- and y-location of quantum dots within quantum wells (discussed in detail below with reference to the gates 106/108). The dimensions of the trenches 107 may take any suitable values. For example, in some embodiments, the trenches 107 may each have a width 162 between 10 nanometers and 30 nanometers. In some embodiments, the trenches 107 may each have a vertical dimension 164 between 200 nanometers and 400 nanometers (e.g., between 250 nanometers and 350 nanometers, or equal to 300 nanometers). The insulating material 128 may be a dielectric material (e.g., an interlayer dielectric), such as silicon oxide. In some embodiments, the insulating material 128 may be a CVD or flowable CVD oxide. In some embodiments, the trenches 107 may be spaced apart by a distance 160 between 50 nanometers and 500 nanometers.

Multiple gates may be disposed at least partially in each of the trenches 107. In the embodiment illustrated in FIG. 53, three gates 106 and two gates 108 are shown as distributed at least partially in a single trench 107. This particular number of gates is simply illustrative, and any suitable number of gates may be used. Additionally, as discussed below with reference to FIG. 79, multiple groups of gates (like the gates illustrated in FIG. 53) may be disposed at least partially in the trench 107.

As shown in FIG. 53, the gate 108-1 may be disposed between the gates 106-1 and 106-2, and the gate 108-2 may be disposed between the gates 106-2 and 106-3. The gates 106 may include a gate metal 110, and the gates 108 may include a gate metal 112. A layer of gate dielectric 114 may be shared between multiple ones of the gates 106 and 108, as shown. The gate metal 110 of a gate 106 may be spaced apart from the gate metal 112 of an adjacent gate 108 by a gate wall 138. The gate walls 138 may include two different dielectric materials. For example, a gate wall 138 may include a shield dielectric 113 and a spacer 134. The shield dielectric 113 may be disposed between the gate dielectric 114 and the spacer 134. As illustrated in FIG. 53, the spacers 134 may be thicker closer to the quantum well stack 146 and thinner farther away from the quantum well stack 146. In some embodiments, the spacers 134 may have a convex shape.

The spacers 134 may be formed of any suitable material, such as any of the materials discussed above. The shield dielectric 113 may be formed of any suitable material, such as any of the materials discussed above.

Each of the gates 106/108 may include a gate dielectric 114; as noted above, the gate dielectric 114 for all of the gates 106/108 may be provided by a common layer of gate dielectric 114 disposed between the quantum well stack 146 and the insulating material 128. In some embodiments, the gate dielectric 114 may be a multilayer gate dielectric (e.g., with multiple materials used to improve the interface between the trench 107 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114. In some embodiments, the gate dielectric 114 may include an isotopically purified material. For example, the gate dielectric 114 may be an oxide grown thermally on an isotopically purified material.

Each of the gates 106 may include a gate metal 110. The gate metal 110 may be disposed on the gate dielectric 114, and the gate dielectric 114 may be disposed between the gate metal 110 and the quantum well stack 146. As shown in FIG. 52, in some embodiments, the gate metal 110 of a gate 106 may extend over the insulating material 128 and into a trench 107 in the insulating material 128. In some embodiments, the gate metal 110 may be a superconductor, such as aluminum, titanium nitride (e.g., deposited via ALD), or niobium titanium nitride. The sides of the gate metal 110 may be substantially parallel, as shown in FIG. 53, and gate walls 138 may be disposed on the sides of the gate metal 110 along the longitudinal axis of the trench 107. The gate metal 110 may contact the spacers 134 and the shield dielectric 113 of adjacent gate walls 138.

Each of the gates 108 may include a gate metal 112. The gate metal 112 may be disposed on the gate dielectric 114, and the gate dielectric 114 may be disposed between the gate metal 112 and the quantum well stack 146. As shown in FIG. 54, in some embodiments, the gate metal 112 of a gate 108 may extend over the insulating material 128 and into a trench 107 in the insulating material 128. In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via ALD), or niobium titanium nitride. The gate metal 112 may contact the spacers 134 and the shield dielectric 113 of adjacent gate walls 138.

In some embodiments, a hardmask 118 may extend over the gates 106/108. The hardmask 118 may be formed of silicon nitride, silicon carbide, or another suitable material. In some embodiments, the hardmask 118 may not be present in the quantum dot device 100 (e.g., a hardmask like the hardmask 118 may be removed during processing, as discussed below).

The gate metal 112 of the gate 108-1 may extend between the proximate gate walls 138 on the sides of the gate metals 110 of the gate 106-1 and the gate 106-2 along the longitudinal axis of the trench 107, as shown in FIG. 53. Thus, the gate metal 112 of the gate 108-1 may have a shape that is substantially complementary to the shape of the adjacent gate walls 138, as shown. Similarly, the gate metal 112 of the gate 108-2 may extend between the proximate gate walls 138 on the sides of the gate metals 110 of the gate 106-2 and the gate 106-3 along the longitudinal axis of the trench 107. As illustrated in FIG. 54, in some embodiments, no spacers 134 or shield dielectric 113 may be disposed between the gate metal 112 and the sidewalls of the trench 107 in the y-direction; in other embodiments (e.g., as discussed below with reference to FIGS. 75 and 76), spacers 134 and shield dielectric 113 may also be disposed between the gate metal 112 and the sidewalls of the trench 107 in the y-direction.

The dimensions of the gates 106/108 may take any suitable values. For example, in some embodiments, the z-height 166 of the gate metal 110 in the trench 107 may be between 225 nanometers and 375 nanometers (e.g., approximately 300 nanometers); the z-height 175 of the gate metal 112 may be in the same range. This z-height 166 of the gate metal 110 in the trench 107 may represent the sum of the z-height of the insulating material 128 (e.g., between 200 nanometers and 300 nanometers) and the thickness of the gate metal 110 on top of the insulating material 128 (e.g., between 25 nanometers and 75 nanometers, or approximately 50 nanometers). In some embodiments, the length 168 of the gate metal 110 (i.e., in the x-direction) may be between 20 nanometers and 40 nanometers (e.g., 30 nanometers). In some embodiments, the thickness 179 of the shield dielectric 113 may be between 1 nanometer and 8 nanometers (e.g., between 3 nanometers and 8 nanometers). In some embodiments, the thickness 174 of the gate dielectric 114 may be between 2 nanometers and 20 nanometers. Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 53) may have a greater length 168 than the "inner" gates 106 (e.g., the gate 106-2 in the embodiment illustrated in FIG. 53). For example, in some embodiments, the outermost gates 106 may have a length 168 between 100 nanometers and 500 nanometers. Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140. In some embodiments, during operation of the quantum dot device 100, a 2DEG may form under the outermost gates 106; this 2DEG may separate the "active" device region (under the gates 106/108) from the doped region 140 (which has a large density of implanted charge carriers).

In some embodiments, the distance 170 between adjacent ones of the gates 106 (e.g., as measured from the gate metal 110 of one gate 106 to the gate metal 110 of an adjacent gate 106 in the x-direction, as illustrated in FIG. 53) may be between 40 nanometers and 100 nanometers (e.g., 50 nanometers). In some embodiments, the thickness 172 of the spacers 134 may be between 1 nanometer and 10 nanometers (e.g., between 3 nanometers and 5 nanometers, between 4 nanometers and 6 nanometers, or between 4 nanometers and 7 nanometers). The length of the gate metal 112 (i.e., in the x-direction) may depend on the dimensions of the gates 106 and the gate walls 138, as illustrated in FIG. 53. As indicated in FIGS. 52 and 54, the gates 106 in one trench 107 may extend over the insulating material 128 between that trench 107 and an adjacent trench 107, but may be isolated from their counterpart gates by the intervening insulating material 130 and spacers 134. The gates 108 in one trench 107 may extend over the insulating material 128 between that trench 107 and an adjacent trench 107, but may be isolated from their counterpart gates by the intervening insulating material 130.

As shown in FIG. 53, the gates 106 and 108 may be alternatingly arranged in the x-direction. During operation of the quantum dot device 100, voltages may be applied to the gates 106/108 to adjust the potential energy in the quantum well stack 146 to create quantum wells of varying depths in which quantum dots 142 may form, as discussed above with reference to the quantum dot device 100 of FIGS. 1-3. Only one quantum dot 142 is labeled with a reference numeral in FIG. 53 for ease of illustration, but five are indicated as dotted circles below each trench 107.

The quantum well stack 146 of the quantum dot device 100 of FIGS. 52-54 may include doped regions 140 that may serve as a reservoir of charge carriers for the quantum dot device 100, in accordance with any of the embodiments discussed above. The quantum dot devices 100 discussed with reference to FIGS. 52-54 may be used to form electron-type or hole-type quantum dots 142, as discussed above with reference to FIGS. 1-3.

Conductive vias and lines may make contact with the gates 106/108 of the quantum dot device 100 of FIGS. 52-54, and to the doped regions 140, to enable electrical connection to the gates 106/108 and the doped regions 140 to be made in desired locations. As shown in FIGS. 52-54, the gates 106 may extend both "vertically" and "horizontally" away from the quantum well stack 146, and conductive vias 120 may contact the gates 106 (and are drawn in dashed lines in FIG. 53 to indicate their location behind the plane of the drawing). The conductive vias 120 may extend through the hardmask 118 to contact the gate metal 110 of the gates 106. The gates 108 may similarly extend away from the quantum well stack 146, and conductive vias 122 may contact the gates 108 (also drawn in dashed lines in FIG. 53 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 of FIGS. 52-54 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

In some embodiments, the quantum dot device 100 of FIGS. 52-54 may include one or more magnet lines 121. For example, a single magnet line 121 is illustrated in FIGS. 52-54, proximate to the trench 107-1. The magnet line(s) 121 of the quantum dot device of FIGS. 52-54 may take the form of any of the embodiments of the magnet lines 121 discussed herein. For example, the magnet line 121 may be formed of a conductive material, and may be used to conduct current pulses that generate magnetic fields to influence the spin states of one or more of the quantum dots 142 that may form in the quantum well stack 146. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnetic field to which the spin of a qubit may couple. The magnet line 121 may provide any suitable combination of these embodiments, or any other appropriate functionality.

In some embodiments, the magnet line 121 of FIGS. 52-54 may be formed of copper. In some embodiments, the magnet line 121 may be formed of a superconductor, such as aluminum. The magnet line 121 illustrated in FIGS. 52-54 is non-coplanar with the trenches 107, and is also non-coplanar with the gates 106/108. In some embodiments, the magnet line 121 may be spaced apart from the gates 106/108 by a distance 167. The distance 167 may take any suitable value (e.g., based on the desired strength of magnetic field interaction with particular quantum dots 142); in some embodiments, the distance 167 may be between 25 nanometers and 1 micron (e.g., between 50 nanometers and 200 nanometers).

In some embodiments, the magnet line 121 of FIGS. 52-54 may be formed of a magnetic material. For example, a magnetic material (such as cobalt) may be deposited in a trench in the insulating material 130 to provide a permanent magnetic field in the quantum dot device 100.

The magnet line 121 of FIGS. 52-54 may have any suitable dimensions. For example, the magnet line 121 may have a thickness 169 between 25 nanometers and 100 nanometers. The magnet line 121 may have a width 171 between 25 nanometers and 100 nanometers. In some embodiments, the width 171 and thickness 169 of a magnet line 121 may be equal to the width and thickness, respectively, of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIGS. 52-54 are substantially linear, but this need not be the case; the magnet lines 121 disclosed herein may take any suitable shape. Conductive vias 123 may contact the magnet line 121.

The conductive vias 120, 122, 136, and 123 may be electrically isolated from each other by an insulating material 130, all of which may take any of the forms discussed above with reference to FIGS. 1-3. The particular arrangement of conductive vias shown in FIGS. 52-54 is simply illustrative, and any electrical routing arrangement may be implemented.

As discussed above, the structure of the trench 107-1 may be the same as the structure of the trench 107-2; similarly, the construction of gates 106/108 in and around the trench 107-1 may be the same as the construction of gates 106/108 in and around the trench 107-2. The gates 106/108 associated with the trench 107-1 may be mirrored by corresponding gates 106/108 associated with the parallel trench 107-2, and the insulating material 130 may separate the gates 106/108 associated with the different trenches 107-1 and 107-2. In particular, quantum dots 142 formed in the quantum well stack 146 under the trench 107-1 (under the gates 106/108) may have counterpart quantum dots 142 in the quantum well stack 146 under the trench 107-2 (under the corresponding gates 106/108). In some embodiments, the quantum dots 142 under the trench 107-1 may be used as "active" quantum dots in the sense that these quantum dots 142 act as qubits and are controlled (e.g., by voltages applied to the gates 106/108 associated with the trench 107-1) to perform quantum computations. The quantum dots 142 associated with the trench 107-2 may be used as "read" quantum dots in the sense that these quantum dots 142 may sense the quantum state of the quantum dots 142 under the trench 107-1 by detecting the electric field generated by the charge in the quantum dots 142 under the trench 107-1, and may convert the quantum state of the quantum dots 142 under the trench 107-1 into electrical signals that may be detected by the gates 106/108 associated with the trench 107-2. Each quantum dot 142 under the trench 107-1 may be read by its corresponding quantum dot 142 under the trench 107-2. Thus, the quantum dot device 100 enables both quantum computation and the ability to read the results of a quantum computation.

The quantum dot devices 100 disclosed herein may be manufactured using any suitable techniques. In some embodiments, the manufacture of the quantum dot device 100 of FIGS. 52-54 may begin as described above with reference to FIGS. 4-5; however, instead of forming fins 104 in the quantum well stack 146 of the assembly 202, manufacturing may proceed as illustrated in FIGS. 55-74 (and described below). Although the particular manufacturing operations discussed below with reference to FIGS. 55-74 are illustrated as manufacturing a particular embodiment of the quantum dot device 100, these operations may be applied to manufacture many different embodiments of the quantum dot device 100, as discussed herein. Any of the elements discussed below with reference to FIGS. 55-74 may take the form of any of the embodiments of those elements discussed above (or otherwise disclosed herein).

Figure 55:
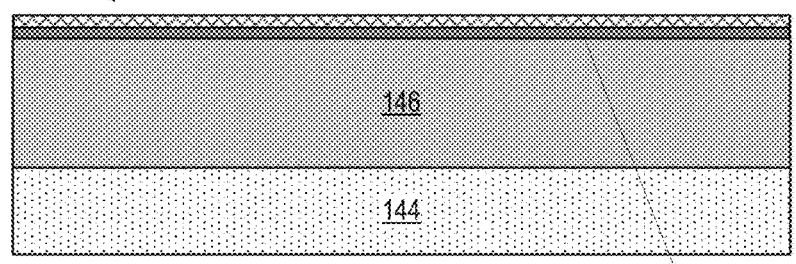
FIGS. 55-74 illustrate various example stages in the manufacture of a quantum dot device, in accordance with various embodiments.

FIG. 55 is a cross-sectional view of an assembly 1204 subsequent to providing a layer of gate dielectric 114 on the quantum well stack 146 of the assembly 202 (FIG. 5), and a layer of shield dielectric 113 on the layer of gate dielectric 114. In some embodiments, the gate dielectric 114 may be grown thermally, or another technique may be used (e.g., CVD, ALD, or PVD).

Figure 56:
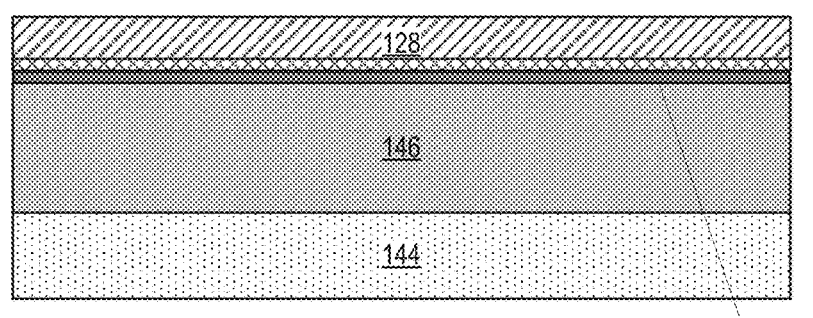

FIG. 56 is a cross-sectional view of an assembly 1206 subsequent to providing an insulating material 128 on the assembly 1204 (FIG. 55). Any suitable material may be used as the insulating material 128 to electrically insulate the trenches 107 from each other, as discussed above. As noted above, in some embodiments, the insulating material 128 may be a dielectric material, such as silicon oxide.

Figure 57:
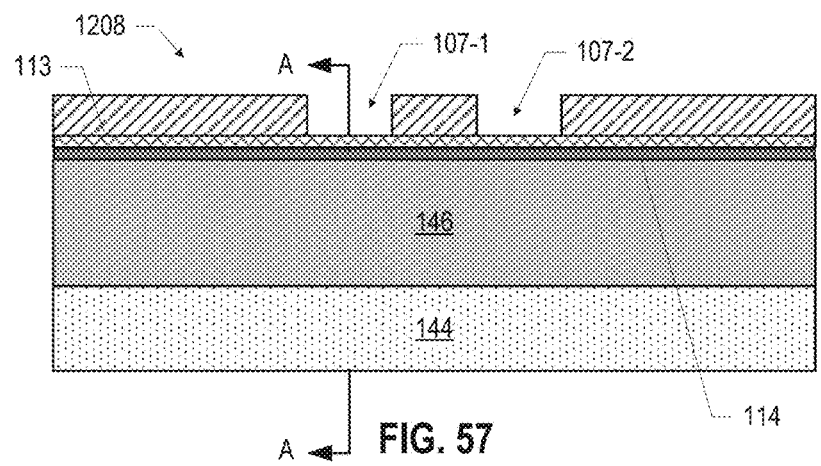
Figure 58:
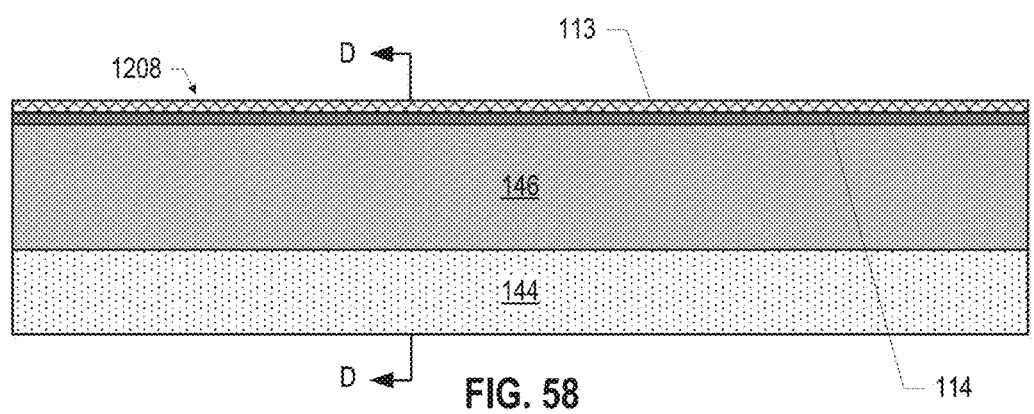
Figure 59:
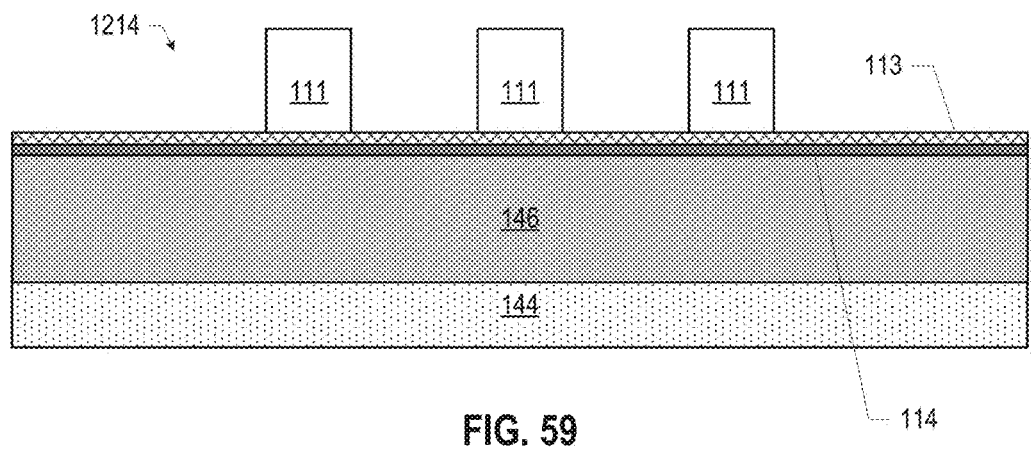
Figure 60:
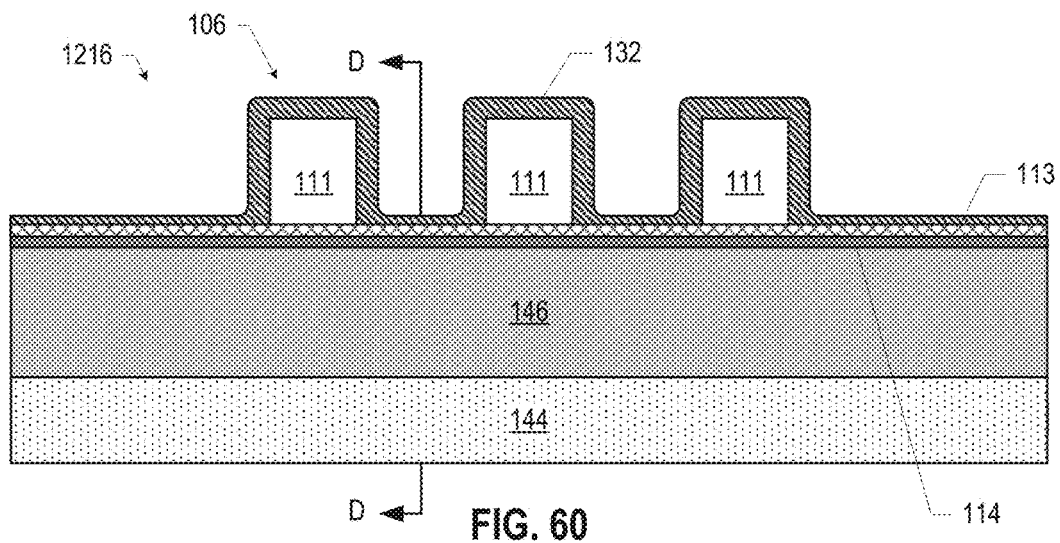

FIG. 57 is a cross-sectional view of an assembly 1208 subsequent to forming trenches 107 in the insulating material 128 of the assembly 1206 (FIG. 56). The trenches 107 may extend down to the shield dielectric 113, and may be formed in the assembly 1206 by patterning and then etching the assembly 1206 using any suitable conventional lithographic process known in the art. For example, a hardmask may be provided on the insulating material 128, and a photoresist may be provided on the hardmask; the photoresist may be patterned to identify the areas in which the trenches 107 are to be formed, the hardmask may be etched in accordance with the patterned photoresist, and the insulating material 128 may be etched in accordance with the etched hardmask (after which the remaining hardmask and photoresist may be removed). In some embodiments, a combination of dry and wet etch chemistry may be used to form the trenches 107 in the insulating material 128, and the appropriate chemistry may depend on the materials included in the assembly 1208, as known in the art. Although the trenches 107 illustrated in FIG. 57 (and other accompanying drawings) are shown as having substantially parallel sidewalls, in some embodiments, the trenches 107 may be tapered, narrowing towards the quantum well stack 146. FIG. 58 is a view of the assembly 1208 taken along the section A-A of FIG. 57, through a trench 107 (while FIG. 57 illustrates the assembly 1208 taken along the section D-D of FIG. 58). FIGS. 59-60 maintain the perspective of FIG. 58.

FIG. 59 is a cross-sectional view of an assembly 1214 subsequent to depositing a dummy material 111 on the shield dielectric 113 of the assembly 1208 (FIGS. 57 and 58), and then patterning the dummy material 111. These operations may be performed in accordance with any of the embodiments discussed above with reference to FIGS. 12-13. As shown, the shield dielectric 113 and the gate dielectric 114 may remain in the assembly 1214.

Figure 61:
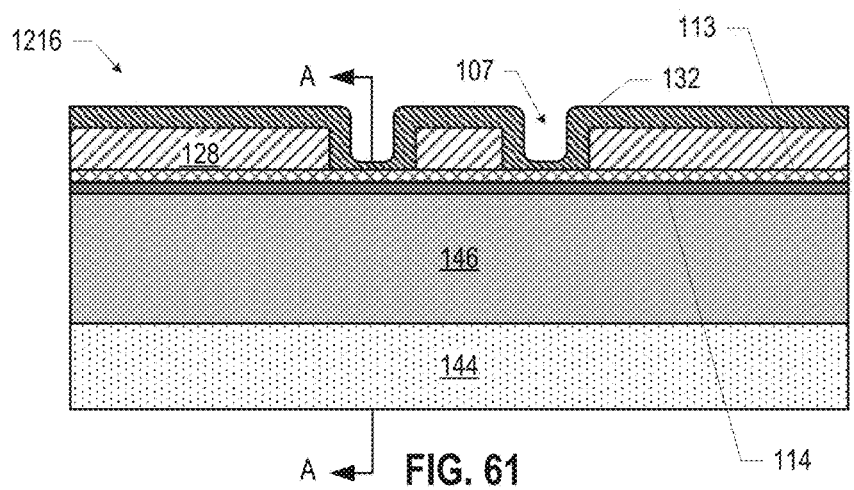

FIG. 60 is a cross-sectional view of an assembly 1216 subsequent to providing spacer material 132 on the assembly 1214 (FIG. 59). FIG. 61 is a view of the assembly 1216 taken along the section D-D of FIG. 60 (while FIG. 60 illustrates the assembly 1216 taken along the section A-A of FIG. 61, along a trench 107). The spacer material 132 may include any of the materials discussed above with reference to the spacers 134, for example, and may be deposited using any suitable technique. For example, the spacer material 132 may be a nitride material (e.g., silicon nitride) deposited by CVD or ALD. As illustrated in FIGS. 60 and 61, the spacer material 132 may be conformally deposited on the assembly 1214.

Figure 62:
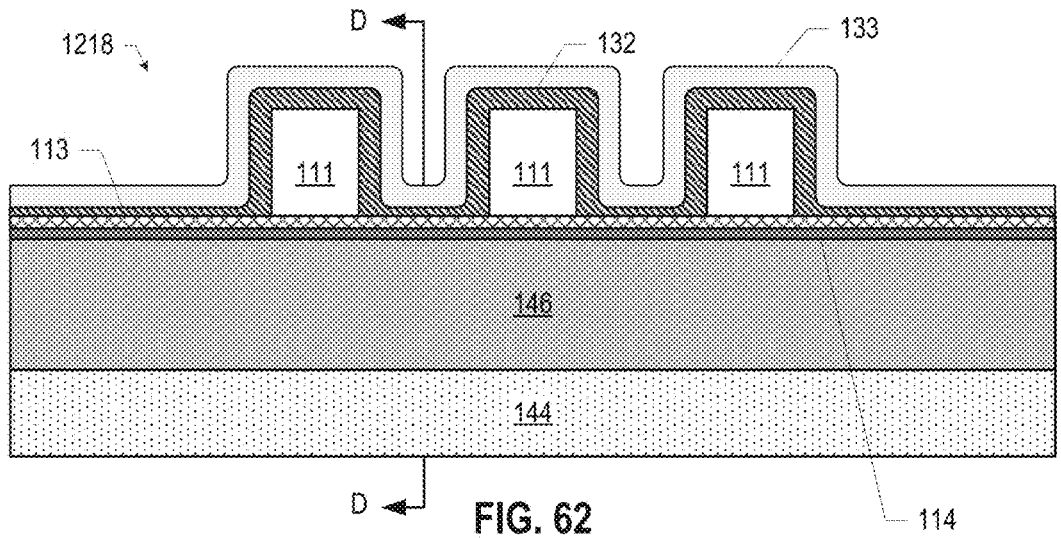
Figure 63:
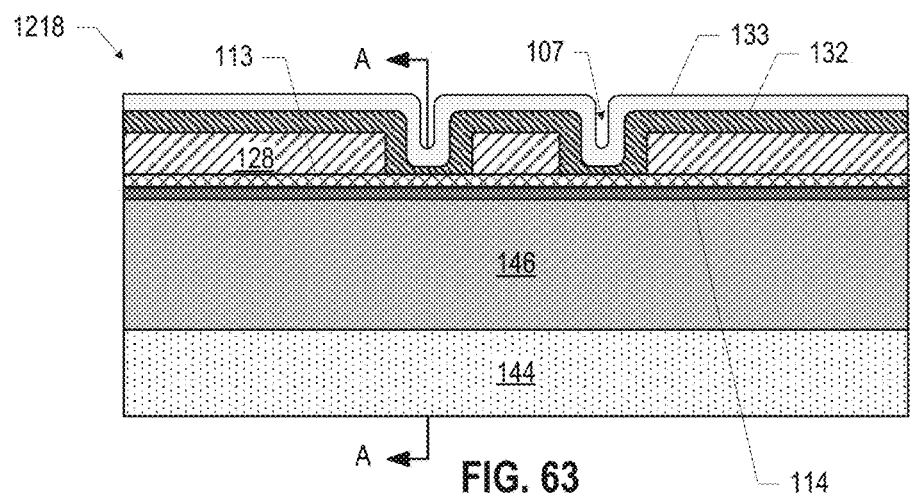

FIG. 62 is a cross-sectional view of an assembly 1218 subsequent to providing capping material 133 on the assembly 1216 (FIGS. 60 and 61). FIG. 63 is a view of the assembly 1218 taken along the section D-D of FIG. 62 (while FIG. 62 illustrates the assembly 1218 taken along the section A-A of FIG. 63, along a trench 107). The capping material 133 may be any suitable material; for example, the capping material 133 may be silicon oxide deposited by CVD or ALD. As illustrated in FIGS. 62 and 63, the capping material 133 may be conformally deposited on the assembly 1216.

Figure 64:
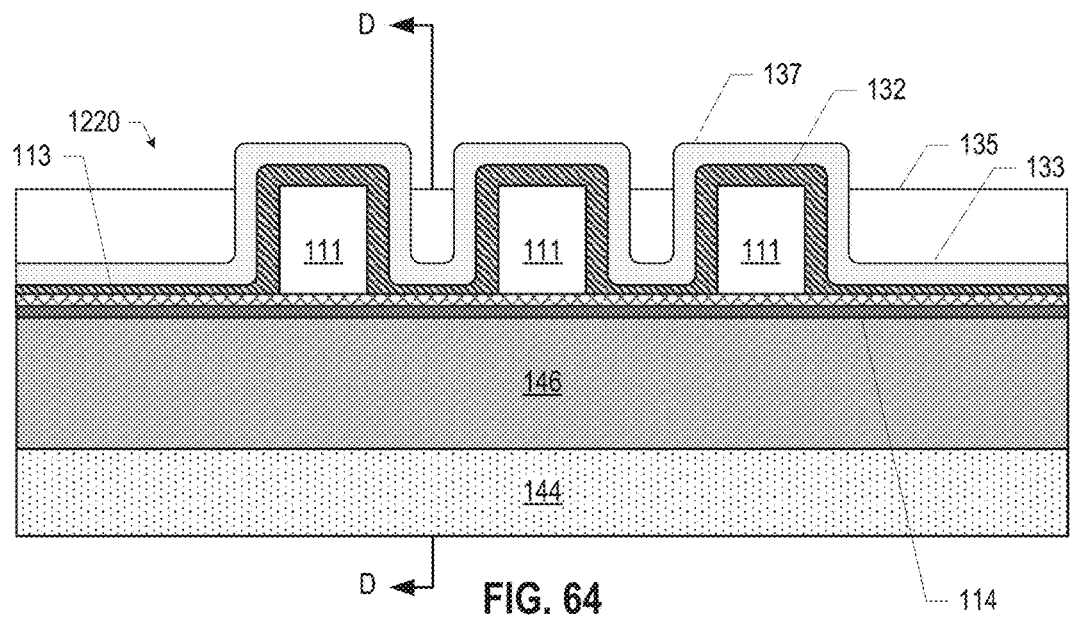
Figure 65:
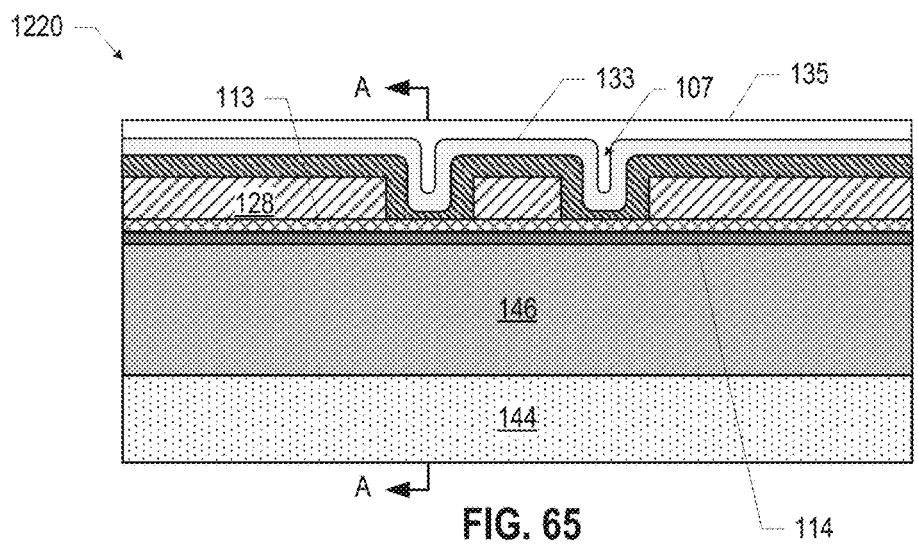

FIG. 64 is a cross-sectional view of an assembly 1220 subsequent to providing a sacrificial material 135 on the assembly 1218 (FIGS. 62 and 63). FIG. 65 is a view of the assembly 1220 taken along the section D-D of FIG. 64 (while FIG. 64 illustrates the assembly 1220 taken along the section A-A of FIG. 65, through a trench 107). The sacrificial material 135 may be deposited on the assembly 1218 to completely cover the capping material 133, then the sacrificial material 135 may be recessed to expose portions 137 of the capping material 133. In particular, the portions 137 of capping material 133 disposed near the top of the portions of the dummy material 111 may not be covered by the sacrificial material 135. As illustrated in FIG. 65, all of the capping material 133 disposed in the region between adjacent portions of the dummy material 111 may be covered by the sacrificial material 135. The recessing of the sacrificial material 135 may be achieved by any etching technique, such as a dry etch. The sacrificial material 135 may be any suitable material, such as a bottom anti-reflective coating (BARC).

Figure 66:
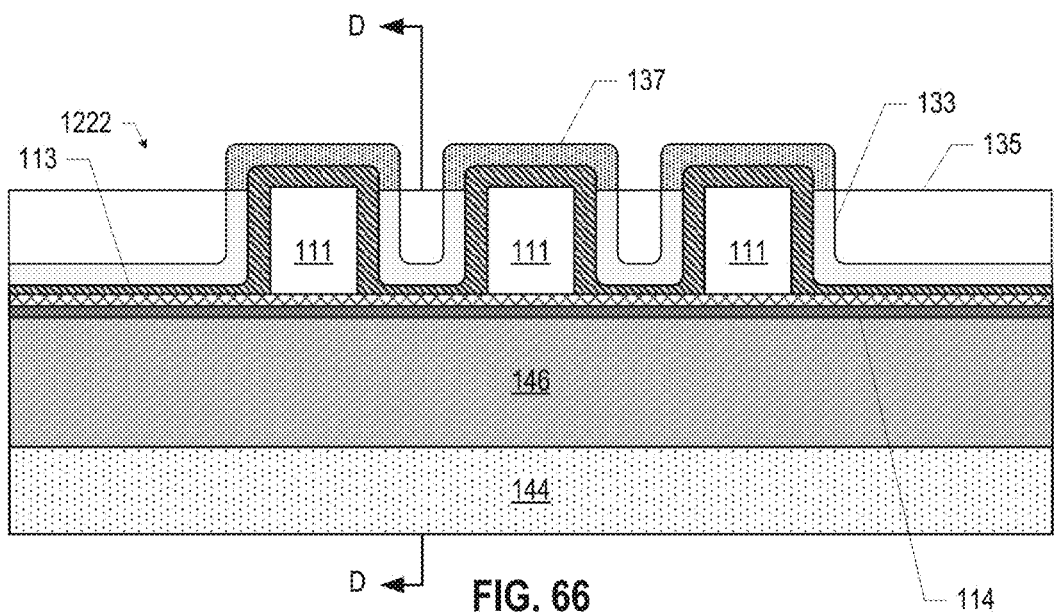
Figure 67:
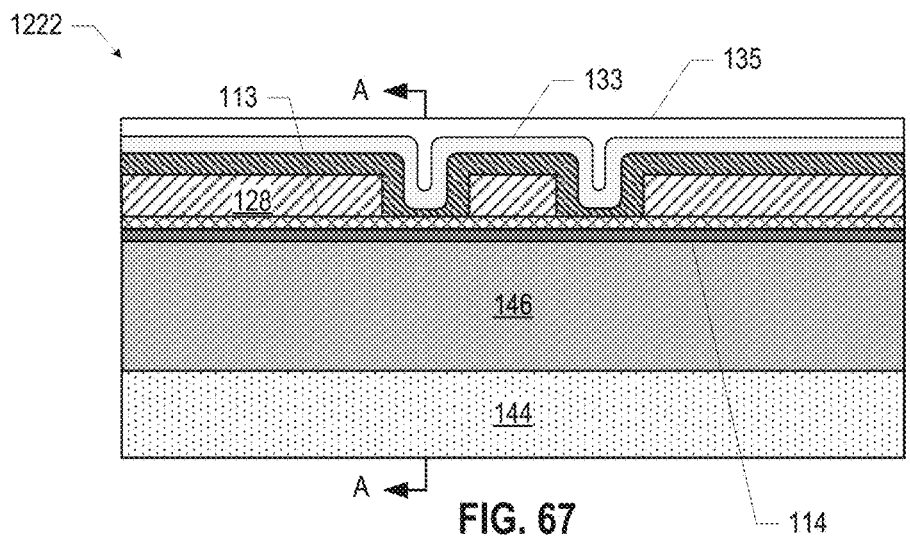

FIG. 66 is a cross-sectional view of an assembly 1222 subsequent to treating the exposed portions 137 of the capping material 133 of the assembly 1220 (FIGS. 64 and 65) to change the etching characteristics of the exposed portions 137 relative to the rest of the capping material 133. FIG. 67 is a view of the assembly 1222 taken along the section D-D of FIG. 66 (while FIG. 66 illustrates the assembly 1222 taken along the section A-A of FIG. 67, through a trench 107). In some embodiments, this treatment may include performing a high-dose ion implant in which the implant dose is high enough to cause a compositional change in the portions 137 and achieve a desired change in etching characteristics.

Figure 68:
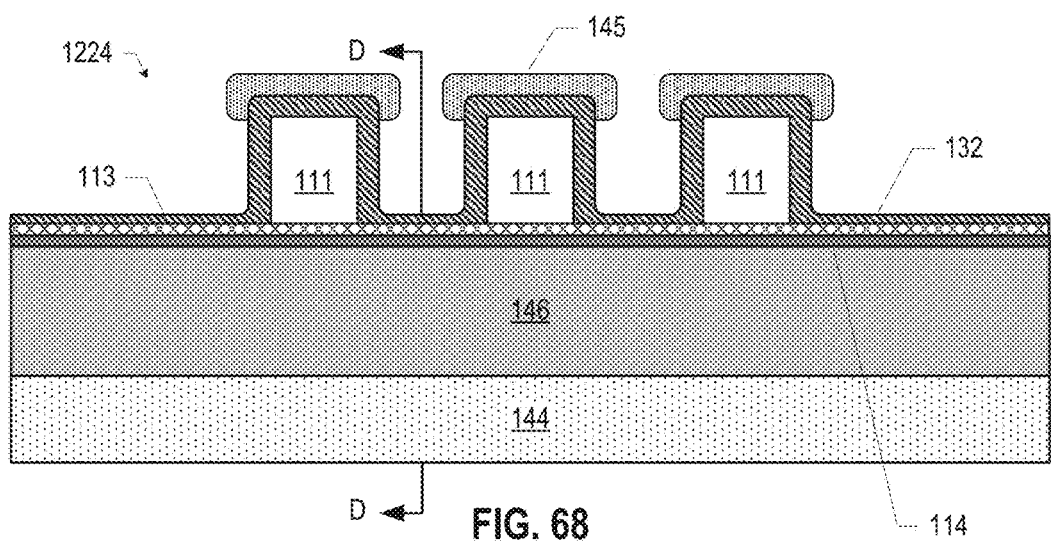
Figure 69:
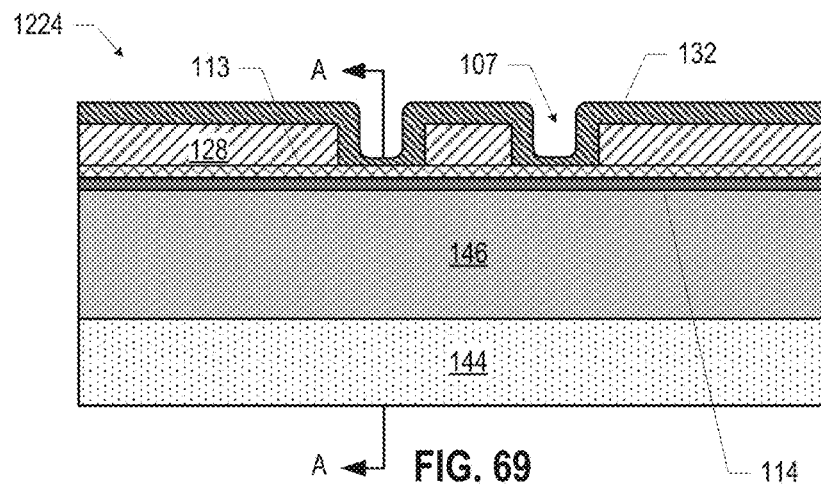

FIG. 68 is a cross-sectional view of an assembly 1224 subsequent to removing the sacrificial material 135 and the unexposed capping material 133 of the assembly 1222 (FIGS. 66 and 67). FIG. 69 is a view of the assembly 1224 taken along the section D-D of FIG. 68 (while FIG. 68 illustrates the assembly 1224 taken along the section A-A of FIG. 69, through a trench 107). The sacrificial material 135 may be removed using any suitable technique (e.g., by ashing, followed by a cleaning step), and the untreated capping material 133 may be removed using any suitable technique (e.g., by etching). In embodiments in which the capping material 133 is treated by ion implantation (e.g., as discussed above with reference to FIGS. 66 and 67), a high temperature anneal may be performed to incorporate the implanted ions in the portions 137 of the capping material 133 before removing the untreated capping material 133. The remaining treated capping material 133 in the assembly 1224 may provide capping structures 145 disposed proximate to the "tops" of the portions of dummy material 111 and extending over the spacer material 132 disposed on the "sides" of the portions of the dummy material 111.

Figure 70:
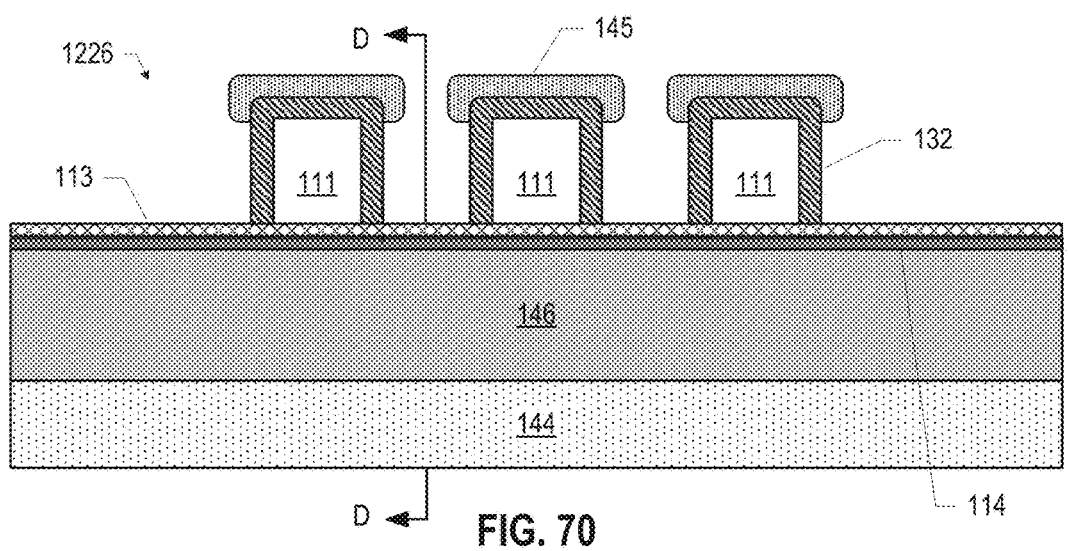
Figure 71:
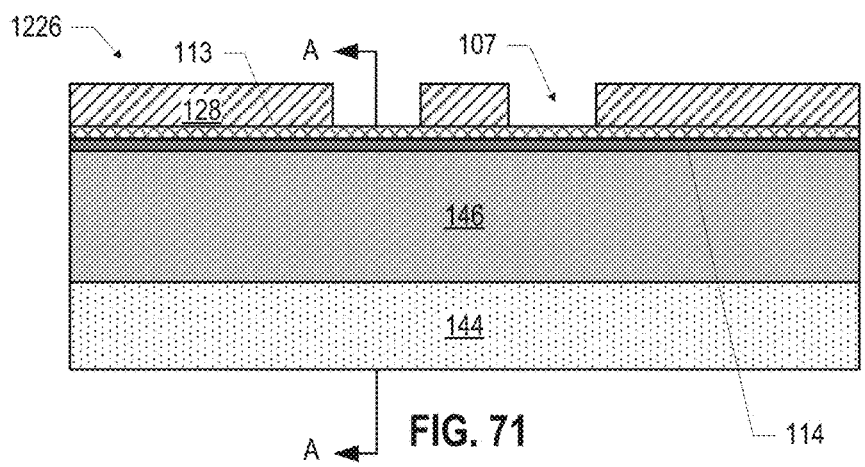
Figure 72:
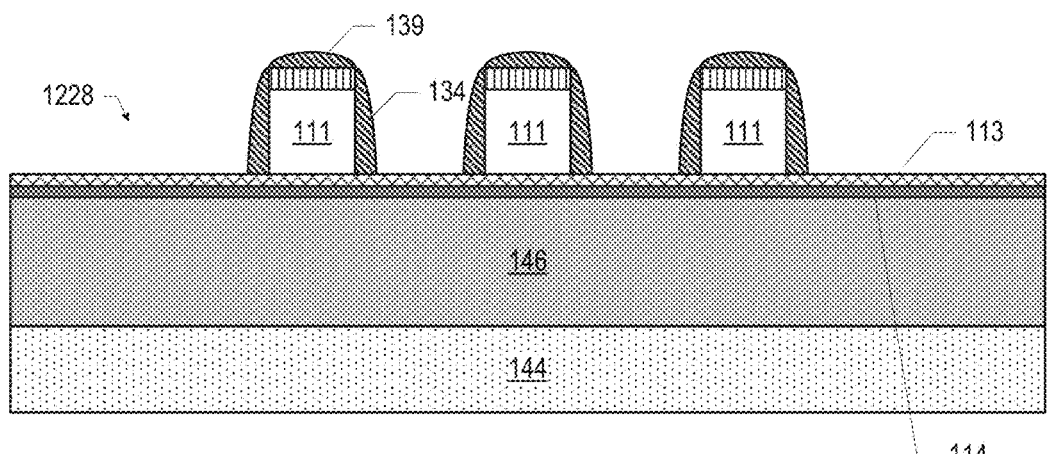
Figure 73:
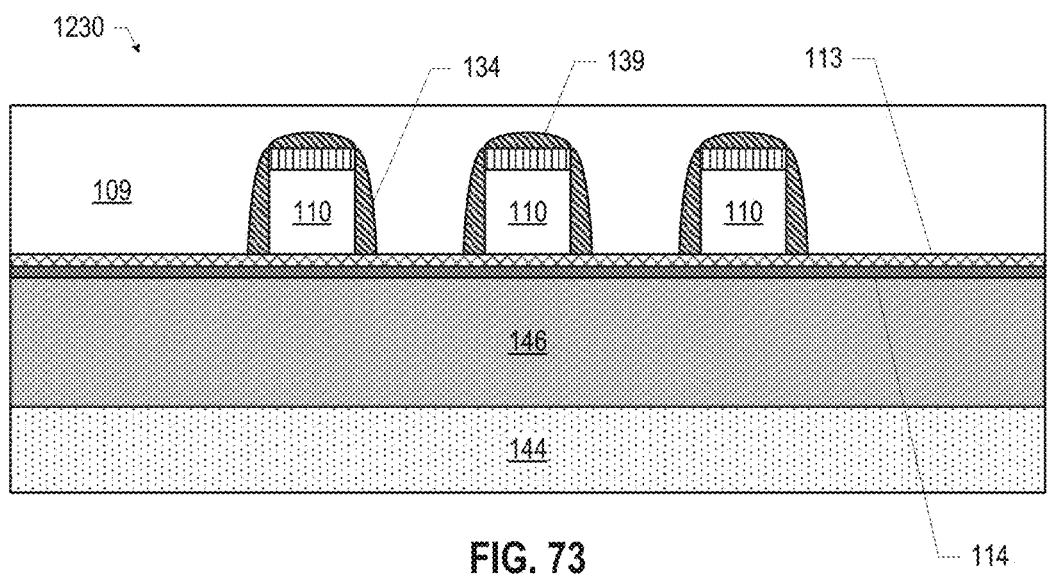
Figure 74:
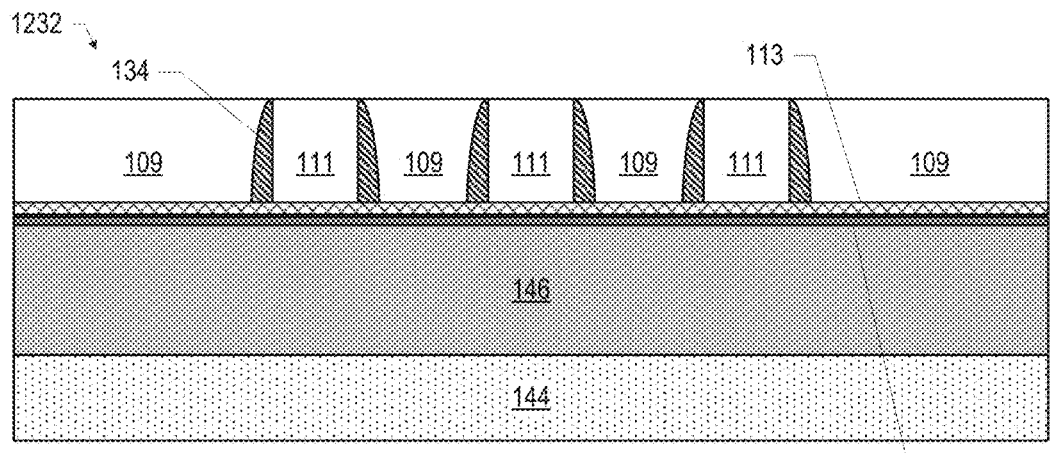

FIG. 70 is a cross-sectional view of an assembly 1226 subsequent to directionally etching the spacer material 132 of the assembly 1224 (FIGS. 68 and 69) that isn't protected by a capping structure 145, leaving spacer material 132 on the sides and top of the portions of dummy material 111. FIG. 71 is a view of the assembly 1226 taken along the section D-D of FIG. 70 (while FIG. 70 illustrates the assembly 1226 taken along the section A-A of FIG. 71, through a trench 107). The etching of the spacer material 132 may be an anisotropic etch, etching the spacer material 132 "downward" to remove the spacer material 132 in some of the area between the portions of dummy material 111 (as illustrated in FIGS. 70 and 71), while leaving the spacer material 132 on the sides and tops of the portions of dummy material 111. In some embodiments, the anisotropic etch may be a dry etch. FIGS. 72-74 maintain the cross-sectional perspective of FIG. 70.

FIG. 72 is a cross-sectional view of an assembly 1228 subsequent to removing the capping structures 145 from the assembly 1226 (FIGS. 70 and 71). The capping structures 145 may be removed using any suitable technique (e.g., a wet etch). The spacer material 132 that remains in the assembly 1228 may include spacers 134 disposed on the sides of the portions of dummy material 111, and portions 139 disposed on the top of the portions of dummy material 111.

FIG. 73 is a cross-sectional view of an assembly 1230 subsequent to providing a dummy material 109 on the assembly 1228 (FIG. 72). The dummy material 109 may fill the areas between adjacent ones of the portions of dummy material 111, and may extend over the tops of the portions of dummy material 111 and over the spacer material portions 139. The dummy material 109 of the assembly 1230 may fill the trenches 107 and extend over the insulating material 128.

FIG. 74 is a cross-sectional view of an assembly 1232 subsequent to planarizing the assembly 1230 (FIG. 73) to remove the dummy material 109 above the dummy material 111, as well as to remove the spacer material portions 139. In some embodiments, the assembly 1230 may be planarized using a CMP technique. The assembly 1232 may be further processed substantially as discussed above with reference to FIGS. 17-38 to form the quantum dot device 100 of FIGS. 52-54.

In the embodiment of the quantum dot device 100 illustrated in FIGS. 52-54, the magnet line 121 is oriented parallel to the longitudinal axes of the trenches 107. In other embodiments, the magnet line 121 of the quantum dot device 100 of FIGS. 52-54 may not be oriented parallel to the longitudinal axes of the trenches 107; for example, any of the magnet line arrangements discussed above with reference to FIGS. 39-41 may be used.

Although a single magnet line 121 is illustrated in FIGS. 52-54, multiple magnet lines 121 may be included in that embodiment of the quantum dot device 100 (e.g., multiple magnet lines 121 parallel to the longitudinal axes of the trenches 107). For example, the quantum dot device 100 of FIGS. 52-54 may include a second magnet line 121 proximate to the trench 107-2 in a symmetric manner to the magnet line 121 illustrated proximate to the trench 107-1. In some embodiments, multiple magnet lines 121 may be included in a quantum dot device 100, and these magnet lines 121 may or may not be parallel to one another. For example, in some embodiments, a quantum dot device 100 may include two (or more) magnet lines 121 that are oriented perpendicular to each other.

Figure 75:
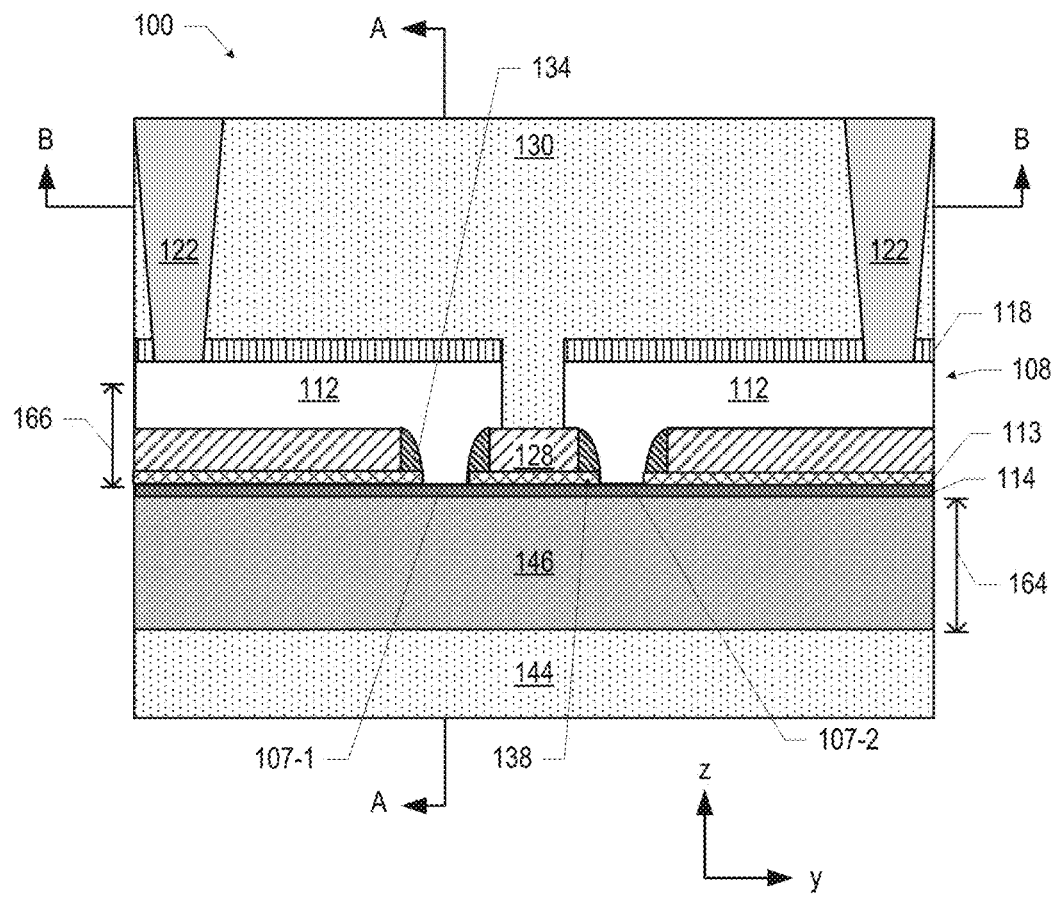
FIG. 75 is a cross-sectional view of an example quantum dot device, in accordance with various embodiments.
Figure 76:
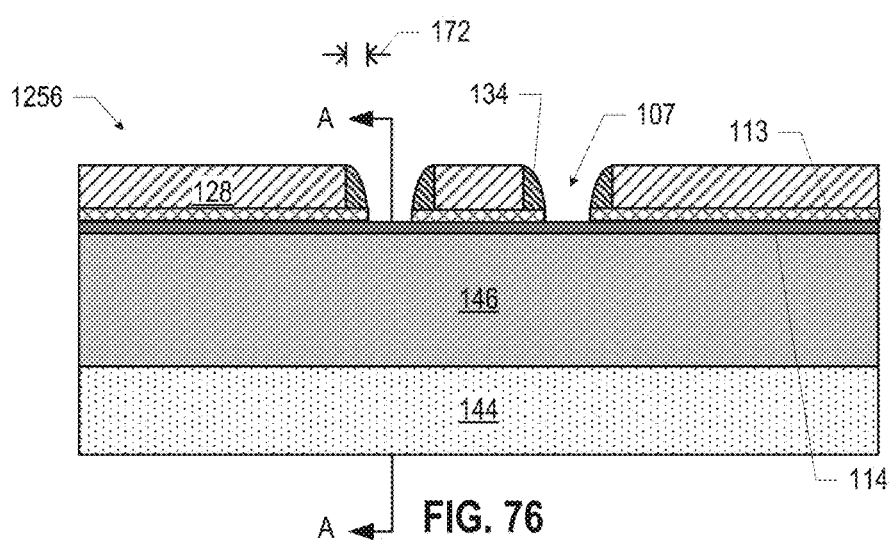
FIG. 76 is a cross-sectional view of an alternative example stage in the manufacture of the quantum dot device of FIG. 75, in accordance with various embodiments.

As discussed above, in the embodiment illustrated in FIGS. 52-54 (and FIGS. 55-74), there may not be any substantial spacer material or shield dielectric 113 between the gate metal 112 and the proximate sidewalls of the trench 107 in the y-direction. In other embodiments, gate walls 138 (including spacers 134 and shield dielectric 113) may also be disposed between the gate metal 112 and the sidewalls of the trench 107 in the y-direction. A cross-sectional view of such an embodiment is shown in FIG. 75 (analogous to the cross-sectional view of FIG. 54). To manufacture such a quantum dot device 100, the operations discussed above with reference to FIGS. 62-71 may not be performed; instead, the spacer material 132 and the shield dielectric 113 of the assembly 1216 of FIGS. 60 and 61 may be anisotropically etched (as discussed with reference to FIGS. 70 and 71) to form the gate walls 138 on the sides of the gate metal 110 and on the sidewalls of the trench 107. FIG. 76 is a cross-sectional view of an assembly 1256 that may be formed by such a process (taking the place of the assembly 1226 of FIG. 71); the view along the section A-A of the assembly 1256 may be similar to FIG. 72, but may not include the spacer material portions 139. The assembly 1256 may be further processed as discussed above to form a quantum dot device 100.

Figure 77:
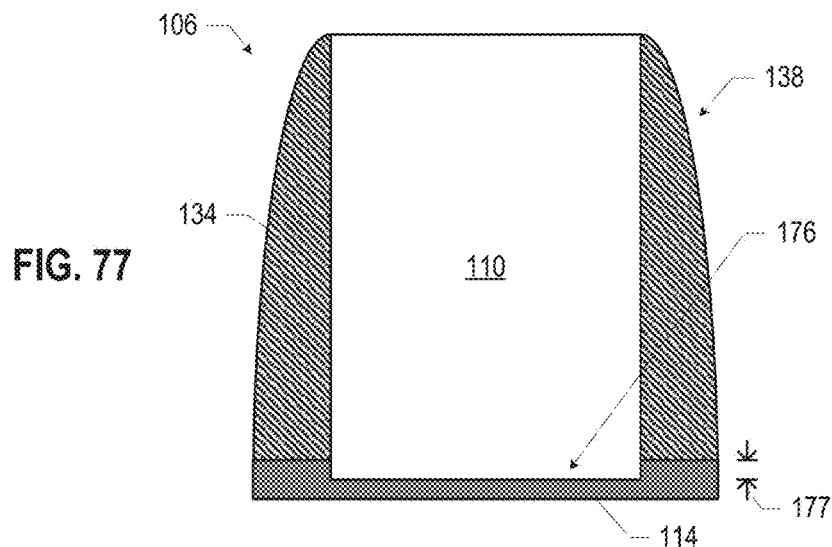
FIG. 77 is a cross-sectional view of a portion of a quantum dot device, in accordance with various embodiments.

Many of the embodiments discussed herein have included a shield dielectric 113. In other embodiments, no shield dielectric 113 may be included in a quantum dot device 100, and the gate walls 138 may be provided by the spacers 134. In some embodiments in which a shield dielectric 113 is not present, a highly selective etch process may be used to pattern and remove the dummy materials 109 and 111 such that the underlying gate dielectric 114 is not compromised or is minimally compromised. In some embodiments, such an etch process may result in the formation of a shallow recess in the layer of gate dielectric 114, corresponding to the locations at which a dummy material 109/111 has been etched away. FIG. 77 is a side cross-sectional view of a gate 106 of a quantum dot device 100 (which may include fins 104 or trenches 107, in accordance with any of the embodiments disclosed herein) having such a recess 176 in the layer of gate dielectric 114. The gate metal 110 may extend into the recess 176, as shown. The gate metal 112 of a gate 108 may similarly extend into a recess. In some embodiments, the depth 177 of the recess 176 may be between 5 Angstroms and 3 nanometers.

In still other embodiments, a shield dielectric 113 may be present in a quantum dot device 100 (e.g., in accordance with any of the embodiments disclosed herein), and the underlying gate dielectric 114 may also include recesses 176 corresponding to the locations of the gate metal 110/112. These recesses 176 may be formed during the etch of the shield dielectric 113, for example.

As noted above, a quantum dot device 100 may include multiple trenches 107 arranged in an array of any desired size. For example, FIG. 78 is a top cross-sectional view, like the view of FIG. 3, of a quantum dot device 100 having multiple trenches 107 arranged in a two-dimensional array. Magnet lines 121 are not depicted in FIG. 78, although they may be included in any desired arrangements. In the particular example illustrated in FIG. 78, the trenches 107 may be arranged in pairs, each pair including an "active" trench 107 and a "read" trench 107, as discussed above. The particular number and arrangement of trenches 107 in FIG. 78 is simply illustrative, and any desired arrangement may be used. Similarly, a quantum dot device 100 may include multiple sets of fins 104 (and accompanying gates, as discussed above with reference to FIGS. 1-3) arranged in a two-dimensional array.

Figure 79:
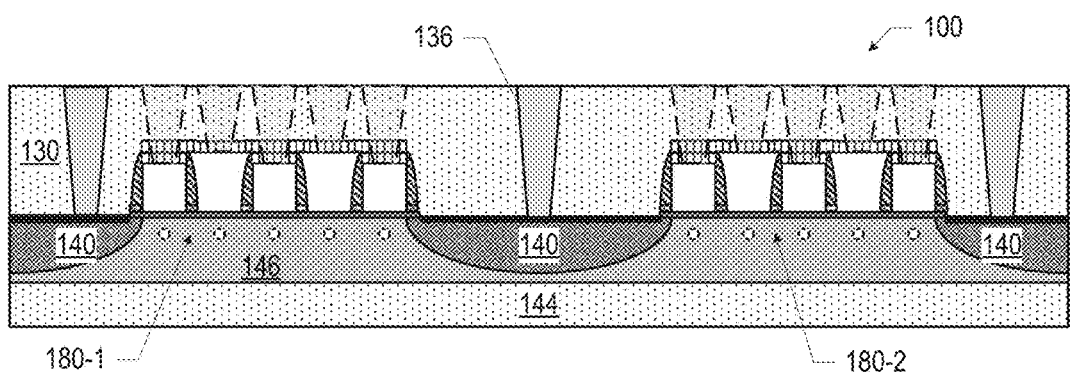
FIG. 79 illustrates an embodiment of a quantum dot device having multiple groups of gates in a single trench on a quantum well stack, in accordance with various embodiments.

As noted above, a single trench 107 may include multiple groups of gates 106/108, spaced apart along the trench by a doped region 140. FIG. 79 is a cross-sectional view of an example of such a quantum dot device 100 having multiple groups of gates 180 at least partially disposed in a single trench 107 above a quantum well stack 146, in accordance with various embodiments. Each of the groups 180 may include gates 106/108 (not labeled in FIG. 79 for ease of illustration) that may take the form of any of the embodiments of the gates 106/108 discussed herein. A doped region 140 (and its interface material 141) may be disposed between two adjacent groups 180 (labeled in FIG. 79 as groups 180-1 and 180-2), and may provide a common reservoir for both groups 180. In some embodiments, this "common" doped region 140 may be electrically contacted by a single conductive via 136. The particular number of gates 106/108 illustrated in FIG. 79, and the particular number of groups 180, is simply illustrative, and a trench 107 may include any suitable number of gates 106/108 arranged in any suitable number of groups 180. The quantum dot device 100 of FIG. 79 may also include one or more magnet lines 121, arranged as desired. Similarly, in embodiments of the quantum dot device 100 that include fins, a single fin 104 may include multiple groups of gates 106/108, spaced apart along the fin.

Figure 80:
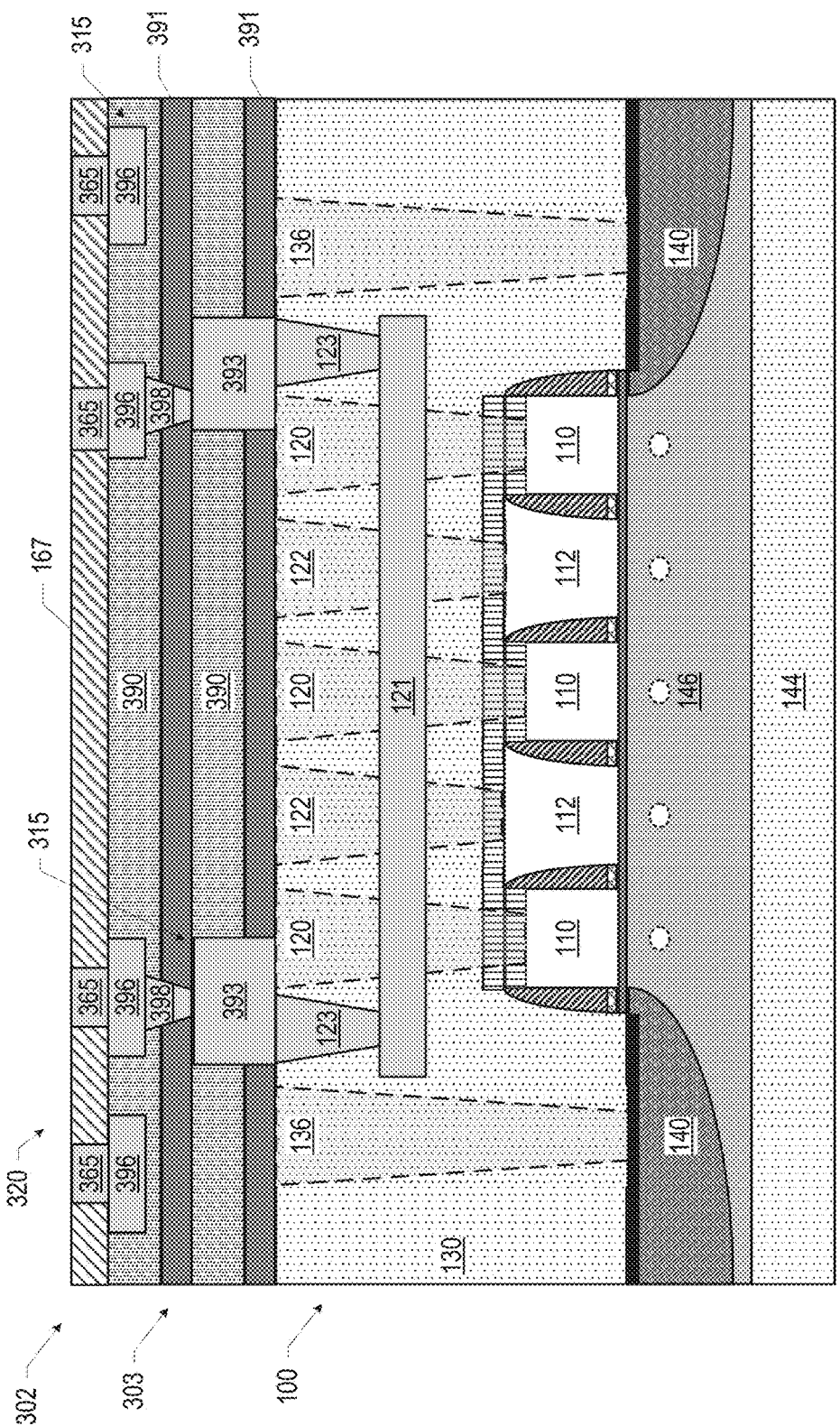
FIG. 80 is a cross-sectional view of a quantum dot device with multiple interconnect layers, in accordance with various embodiments.
Figure 81:
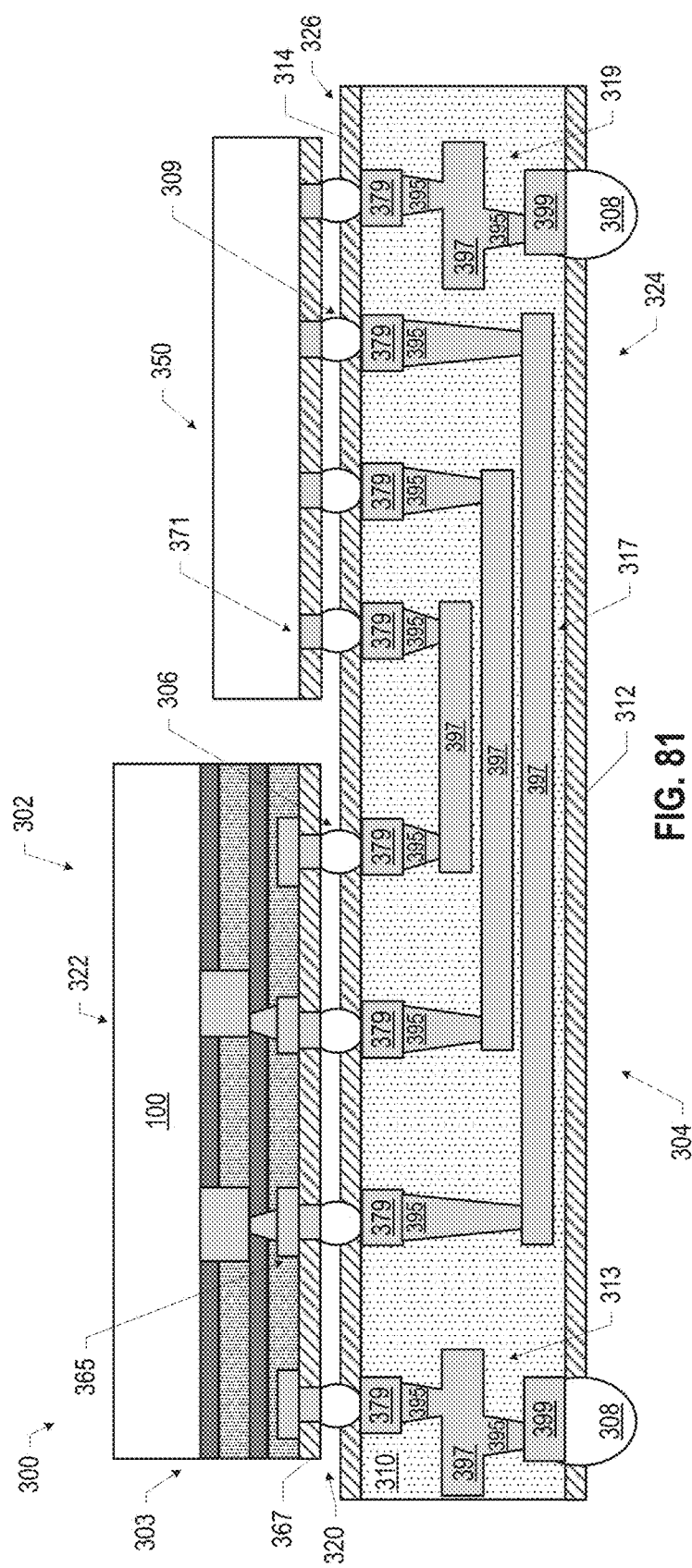
FIG. 81 is a cross-sectional view of a quantum dot device package, in accordance with various embodiments.

In some embodiments, the quantum dot device 100 may be included in a die and coupled to a package substrate to form a quantum dot device package. For example, FIG. 80 is a side cross-sectional view of a die 302 including the quantum dot device 100 of FIG. 53 and conductive pathway layers 303 disposed thereon, while FIG. 81 is a side cross-sectional view of a quantum dot device package 300 in which the die 302 and another die 350 are coupled to a package substrate 304 (e.g., in a system-on-a-chip (SoC) arrangement). Details of the quantum dot device 100 are omitted from FIG. 81 for economy of illustration. As noted above, the particular quantum dot device 100 illustrated in FIGS. 80 and 81 may take a form similar to the embodiments illustrated in FIGS. 2 and 53, but any of the quantum dot devices 100 disclosed herein may be included in a die (e.g., the die 302) and coupled to a package substrate (e.g., the package substrate 304). In particular, any number of fins 104 or trenches 107, gates 106/108, doped regions 140, magnet lines 121, and other components discussed herein with reference to various embodiments of the quantum dot device 100 may be included in the die 302.

The die 302 may include a first face 320 and an opposing second face 322. The base 102 may be proximate to the second face 322, and conductive pathways 315 from various components of the quantum dot device 100 may extend to conductive contacts 365 disposed at the first face 320. The conductive pathways 315 may include conductive vias, conductive lines, and/or any combination of conductive vias and lines. For example, FIG. 80 illustrates an embodiment in which one conductive pathway 315 (extending between a magnet line 121 and associated conductive contact 365) includes a conductive via 123, a conductive line 393, a conductive via 398, and a conductive line 396. More or fewer structures may be included in the conductive pathways 315, and analogous conductive pathways 315 may be provided between ones of the conductive contacts 365 and the gates 106/108, doped regions 140, or other components of the quantum dot device 100. In some embodiments, conductive lines of the die 302 (and the package substrate 304, discussed below) may extend into and out of the plane of the drawing, providing conductive pathways to route electrical signals to and/or from various elements in the die 302.

The conductive vias and/or lines that provide the conductive pathways 315 in the die 302 may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of oxide material 390 and layers of nitride material 391 may insulate various structures in the conductive pathways 315 from proximate structures, and/or may serve as etch stops during fabrication. In some embodiments, an adhesion layer (not shown) may be disposed between conductive material and proximate insulating material of the die 302 to improve mechanical adhesion between the conductive material and the insulating material.

The gates 106/108, the doped regions 140, and the quantum well stack 146 (as well as the proximate conductive vias/lines) may be referred to as part of the "device layer" of the quantum dot device 100. The conductive lines 393 may be referred to as a Metal 1 or "M1" interconnect layer, and may couple the structures in the device layer to other interconnect structures. The conductive vias 398 and the conductive lines 396 may be referred to as a Metal 2 or "M2" interconnect layer, and may be formed directly on the M1 interconnect layer.

A solder resist material 367 may be disposed around the conductive contacts 365, and, in some embodiments, may extend onto the conductive contacts 365. The solder resist material 367 may be a polyimide or similar material, or may be any appropriate type of packaging solder resist material. In some embodiments, the solder resist material 367 may be a liquid or dry film material including photoimageable polymers. In some embodiments, the solder resist material 367 may be non-photoimageable (and openings therein may be formed using laser drilling or masked etch techniques). The conductive contacts 365 may provide the contacts to couple other components (e.g., a package substrate 304, as discussed below, or another component) to the conductive pathways 315 in the quantum dot device 100, and may be formed of any suitable conductive material (e.g., a superconducting material). For example, solder bonds may be formed on the one or more conductive contacts 365 to mechanically and/or electrically couple the die 302 with another component (e.g., a circuit board), as discussed below. The conductive contacts 365 illustrated in FIG. 80 take the form of bond pads, but other first-level interconnect structures may be used (e.g., posts) to route electrical signals to/from the die 302, as discussed below.

The combination of the conductive pathways and the proximate insulating material (e.g., the insulating material 130, the oxide material 390, and the nitride material 391) in the die 302 may provide an interlayer dielectric (ILD) stack of the die 302. As noted above, interconnect structures may be arranged within the quantum dot device 100 to route electrical signals according to a wide variety of designs (in particular, the arrangement is not limited to the particular configuration of interconnect structures depicted in FIG. 80 or any of the other accompanying figures, and may include more or fewer interconnect structures). During operation of the quantum dot device 100, electrical signals (such as power and/or input/output (I/O) signals) may be routed to and/or from the gates 106/108, the magnet line(s) 121, and/or the doped regions 140 (and/or other components) of the quantum dot device 100 through the interconnects provided by conductive vias and/or lines, and through the conductive pathways of the package substrate 304 (discussed below).

Example superconducting materials that may be used for the structures in the conductive pathways 313, 317, 319 (discussed below), and 315, and/or conductive contacts of the die 302 and/or the package substrate 304, may include aluminum, niobium, tin, titanium, osmium, zinc, molybdenum, tantalum, vanadium, or composites of such materials (e.g., niobium titanium, niobium aluminum, or niobium tin). In some embodiments, the conductive contacts 365, 379, and/or 399 may include aluminum, and the first-level interconnects 306 and/or the second-level interconnects 308 may include an indium-based solder.

As noted above, the quantum dot device package 300 of FIG. 81 may include a die 302 (including one or more quantum dot devices 100) and a die 350. As discussed in detail below, the quantum dot device package 300 may include electrical pathways between the die 302 and the die 350 so that the dies 302 and 350 may communicate during operation. In some embodiments, the die 350 may be a non-quantum logic device that may provide support or control functionality for the quantum dot device(s) 100 of the die 302. For example, as discussed further below, in some embodiments, the die 350 may include a switching matrix to control the writing and reading of data from the die 302 (e.g., using any known word line/bit line or other addressing architecture). In some embodiments, the die 350 may control the voltages (e.g., microwave pulses) applied to the gates 106/108, and/or the doped regions 140, of the quantum dot device(s) 100 included in the die 302. In some embodiments, the die 350 may include magnet line control logic to provide microwave pulses to the magnet line(s) 121 of the quantum dot device(s) 100 in the die 302. The die 350 may include any desired control circuitry to support operation of the die 302. By including this control circuitry in a separate die, the manufacture of the die 302 may be simplified and focused on the needs of the quantum computations performed by the quantum dot device(s) 100, and conventional manufacturing and design processes for control logic (e.g., switching array logic) may be used to form the die 350.

Although a singular "die 350" is illustrated in FIG. 81 and discussed herein, the functionality provided by the die 350 may, in some embodiments, be distributed across multiple dies 350 (e.g., multiple dies coupled to the package substrate 304, or otherwise sharing a common support with the die 302). Similarly, one or more dies providing the functionality of the die 350 may support one or more dies providing the functionality of the die 302; for example, the quantum dot device package 300 may include multiple dies having one or more quantum dot devices 100, and a die 350 may communicate with one or more such "quantum dot device dies."

The die 350 may take any of the forms discussed below with reference to the non-quantum processing device 2028 of FIG. 85. Mechanisms by which the control logic of the die 350 may control operation of the die 302 may be take the form of an entirely hardware embodiment or an embodiment combining software and hardware aspects. For example, the die 350 may implement an algorithm executed by one or more processing units, e.g. one or more microprocessors. In various embodiments, aspects of the present disclosure may take the form of a computer program product embodied in one or more computer readable medium(s), preferably non-transitory, having computer readable program code embodied (e.g., stored) in or coupled to the die 350. In various embodiments, such a computer program may, for example, be downloaded (updated) to the die 350 (or attendant memory) or be stored upon manufacturing of the die 350. In some embodiments, the die 350 may include at least one processor and at least one memory element, along with any other suitable hardware and/or software to enable its intended functionality of controlling operation of the die 302 as described herein. A processor of the die 350 may execute software or an algorithm to perform the activities discussed herein. A processor of the die 350 may be communicatively coupled to other system elements via one or more interconnects or buses (e.g., through one or more conductive pathways 319). Such a processor may include any combination of hardware, software, or firmware providing programmable logic, including by way of non-limiting example, a microprocessor, a digital signal processor (DSP), a field-programmable gate array (FPGA), a programmable logic array (PLA), an application-specific integrated circuit (ASIC), or a virtual machine processor. The processor of the die 350 may be communicatively coupled to the memory element of the die 350, for example, in a direct-memory access (DMA) configuration. A memory element of the die 350 may include any suitable volatile or nonvolatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. In some embodiments, the memory element and the processor of the "die 350" may themselves be provided by separate physical dies that are in electrical communication. The information being tracked or sent to the die 350 could be provided in any database, register, control list, cache, or storage structure, all of which can be referenced at any suitable timeframe. The die 350 can further include suitable interfaces for receiving, transmitting, and/or otherwise communicating data or information in a network environment (e.g., via the conductive pathways 319).

In some embodiments, the die 350 may be configured to apply appropriate voltages to any one of the gates 106/108 (acting as, e.g., plunger gates, barrier gates, and/or accumulation gates) in order to initialize and manipulate the quantum dots 142, as discussed above. For example, by controlling the voltage applied to a gate 106/108 acting as a plunger gate, the die 350 may modulate the electric field underneath that gate to create an energy valley between the tunnel barriers created by adjacent barrier gates. In another example, by controlling the voltage applied to a gate 106/108 acting as a barrier gate, the die 350 may change the height of the tunnel barrier. When a barrier gate is used to set a tunnel barrier between two plunger gates, the barrier gate may be used to transfer charge carriers between quantum dots 142 that may be formed under these plunger gates. When a barrier gate is used to set a tunnel barrier between a plunger gate and an accumulation gate, the barrier gate may be used to transfer charge carriers in and out of the quantum dot array via the accumulation gate. The term "accumulation gate" may refer to a gate used to form a 2DEG in an area that is between the area where the quantum dots 142 may be formed and a charge carrier reservoir (e.g., the doped regions 140). Changing the voltage applied to the accumulation gate may allow the die 350 to control the number of charge carriers in the area under the accumulation gate. For example, changing the voltage applied to the accumulation gate may reduce the number of charge carriers in the area under the gate so that single charge carriers can be transferred from the reservoir into the quantum well layer 152, and vice versa. In some embodiments, the "outermost" gates 106 in a quantum dot device 100 may serve as accumulation gates. In some embodiments, these outermost gates 106 may have a greater length 168 than "inner" gates 106.

As noted above, the die 350 may provide electrical signals to control spins of charge carriers in quantum dots 142 of the quantum dot device(s) 100 of the die 302 by controlling a magnetic field generated by one or more magnet line(s) 121. In this manner, the die 350 may initialize and manipulate spins of the charge carriers in the quantum dots 142 to implement qubit operations. If the magnetic field for a die 302 is generated by a microwave transmission line, then the die 350 may set/manipulate the spins of the charge carriers by applying appropriate pulse sequences to manipulate spin precession. Alternatively, the magnetic field for a quantum dot device 100 of the die 302 may be generated by a magnet with one or more pulsed gates; the die 350 may apply the pulses to these gates.

In some embodiments, the die 350 may be configured to determine the values of the control signals applied to the elements of the die 302 (e.g. determine the voltages to be applied to the various gates 106/108) to achieve desired quantum operations (communicated to the die 350 through the package substrate 304 via the conductive pathways 319). In other embodiments, the die 350 may be preprogrammed with at least some of the control parameters (e.g. with the values for the voltages to be applied to the various gates 106/108) during the initialization of the die 350.

In the quantum dot device package 300 (FIG. 81), first-level interconnects 306 may be disposed between the first face 320 of the die 302 and the second face 326 of a package substrate 304. Having first-level interconnects 306 disposed between the first face 320 of the die 302 and the second face 326 of the package substrate 304 (e.g., using solder bumps as part of flip chip packaging techniques) may enable the quantum dot device package 300 to achieve a smaller footprint and higher die-to-package-substrate connection density than could be achieved using conventional wirebond techniques (in which conductive contacts between the die 302 and the package substrate 304 are constrained to be located on the periphery of the die 302). For example, a die 302 having a square first face 320 with side length N may be able to form only 4N wirebond interconnects to the package substrate 304, versus $N^2$ flip chip interconnects (utilizing the entire "full field" surface area of the first face 320). Additionally, in some applications, wirebond interconnects may generate unacceptable amounts of heat that may damage or otherwise interfere with the performance of the quantum dot device 100. Using solder bumps as the first-level interconnects 306 may enable the quantum dot device package 300 to have much lower parasitic inductance relative to using wirebonds to couple the die 302 and the package substrate 304, which may result in an improvement in signal integrity for high speed signals communicated between the die 302 and the package substrate 304. Similarly, first-level interconnects 309 may be disposed between conductive contacts 371 of the die 350 and conductive contacts 379 at the second face 326 of the package substrate 304, as shown, to couple electronic components (not shown) in the die 350 to conductive pathways in the package substrate 304.

The package substrate 304 may include a first face 324 and an opposing second face 326. Conductive contacts 399 may be disposed at the first face 324, and conductive contacts 379 may be disposed at the second face 326. Solder resist material 314 may be disposed around the conductive contacts 379, and solder resist material 312 may be disposed around the conductive contacts 399; the solder resist materials 314 and 312 may take any of the forms discussed above with reference to the solder resist material 367. In some embodiments, the solder resist material 312 and/or the solder resist material 314 may be omitted. Conductive pathways may extend through the insulating material 310 between the first face 324 and the second face 326 of the package substrate 304, electrically coupling various ones of the conductive contacts 399 to various ones of the conductive contacts 379, in any desired manner. The insulating material 310 may be a dielectric material (e.g., an ILD), and may take the form of any of the embodiments of the insulating material 130 disclosed herein, for example. The conductive pathways may include one or more conductive vias 395 and/or one or more conductive lines 397, for example.

For example, the package substrate 304 may include one or more conductive pathways 313 to electrically couple the die 302 to conductive contacts 399 on the first face 324 of the package substrate 304; these conductive pathways 313 may be used to allow the die 302 to electrically communicate with a circuit component to which the quantum dot device package 300 is coupled (e.g., a circuit board or interposer, as discussed below). The package substrate 304 may include one or more conductive pathways 319 to electrically couple the die 350 to conductive contacts 399 on the first face 324 of the package substrate 304; these conductive pathways 319 may be used to allow the die 350 to electrically communicate with a circuit component to which the quantum dot device package 300 is coupled (e.g., a circuit board or interposer, as discussed below).

The package substrate 304 may include one or more conductive pathways 317 to electrically couple the die 302 to the die 350 through the package substrate 304. In particular, the package substrate 304 may include conductive pathways 317 that couple different ones of the conductive contacts 379 on the second face 326 of the package substrate 304 so that, when the die 302 and the die 350 are coupled to these different conductive contacts 379, the die 302 and the die 350 may communicate through the package substrate 304. Although the die 302 and the die 350 are illustrated in FIG. 81 as being disposed on the same second face 326 of the package substrate 304, in some embodiments, the die 302 and the die 350 may be disposed on different faces of the package substrate 304 (e.g., one on the first face 324 and one on the second face 326), and may communicate via one or more conductive pathways 317.

In some embodiments, the conductive pathways 317 may be microwave transmission lines. Microwave transmission lines may be structured for the effective transmission of microwave signals, and may take the form of any microwave transmission lines known in the art. For example, a conductive pathway 317 may be a coplanar waveguide, a stripline, a microstrip line, or an inverted microstrip line. The die 350 may provide microwave pulses along the conductive pathways 317 to the die 302 to provide electron spin resonance (ESR) pulses to the quantum dot device(s) 100 to manipulate the spin states of the quantum dots 142 that form therein. In some embodiments, the die 350 may generate a microwave pulse that is transmitted over a conductive pathway 317 and induces a magnetic field in the magnet line(s) 121 of a quantum dot device 100 and causes a transition between the spin-up and spin-down states of a quantum dot 142. In some embodiments, the die 350 may generate a microwave pulse that is transmitted over a conductive pathway 317 and induces a magnetic field in a gate 106/108 to cause a transition between the spin-up and spin-down states of a quantum dot 142. The die 350 may enable any such embodiments, or any combination of such embodiments.

The die 350 may provide any suitable control signals to the die 302 to enable operation of the quantum dot device(s) 100 included in the die 302. For example, the die 350 may provide voltages (through the conductive pathways 317) to the gates 106/108, and thereby tune the energy profile in the quantum well stack 146.

In some embodiments, the quantum dot device package 300 may be a cored package, one in which the package substrate 304 is built on a carrier material (not shown) that remains in the package substrate 304. In such embodiments, the carrier material may be a dielectric material that is part of the insulating material 310; laser vias or other through-holes may be made through the carrier material to allow conductive pathways 313 and/or 319 to extend between the first face 324 and the second face 326.

In some embodiments, the package substrate 304 may be or may otherwise include a silicon interposer, and the conductive pathways 313 and/or 319 may be through-silicon vias. Silicon may have a desirably low coefficient of thermal expansion compared with other dielectric materials that may be used for the insulating material 310, and thus may limit the degree to which the package substrate 304 expands and contracts during temperature changes relative to such other materials (e.g., polymers having higher coefficients of thermal expansion). A silicon interposer may also help the package substrate 304 achieve a desirably small line width and maintain high connection density to the die 302 and/or the die 350.

Limiting differential expansion and contraction may help preserve the mechanical and electrical integrity of the quantum dot device package 300 as the quantum dot device package 300 is fabricated (and exposed to higher temperatures) and used in a cooled environment (and exposed to lower temperatures). In some embodiments, thermal expansion and contraction in the package substrate 304 may be managed by maintaining an approximately uniform density of the conductive material in the package substrate 304 (so that different portions of the package substrate 304 expand and contract uniformly), using reinforced dielectric materials as the insulating material 310 (e.g., dielectric materials with silicon dioxide fillers), or utilizing stiffer materials as the insulating material 310 (e.g., a prepreg material including glass cloth fibers). In some embodiments, the die 350 may be formed of semiconductor materials or compound semiconductor materials (e.g., group III-group V compounds) to enable higher efficiency amplification and signal generation to minimize the heat generated during operation and reduce the impact on the quantum operations of the die 302. In some embodiments, the metallization in the die 350 may use superconducting materials (e.g., titanium nitride, niobium, niobium nitride, and niobium titanium nitride) to minimize heating.

The conductive contacts 365 of the die 302 may be electrically coupled to the conductive contacts 379 of the package substrate 304 via the first-level interconnects 306, and the conductive contacts 371 of the die 350 may be electrically coupled to the conductive contacts 379 of the package substrate 304 via the first-level interconnects 309. In some embodiments, the first-level interconnects 306/309 may include solder bumps or balls (as illustrated in FIG. 81); for example, the first-level interconnects 306/309 may be flip chip (or controlled collapse chip connection, "C4") bumps disposed initially on the die 302/die 350 or on the package substrate 304. Second-level interconnects 308 (e.g., solder balls or other types of interconnects) may couple the conductive contacts 399 on the first face 324 of the package substrate 304 to another component, such as a circuit board (not shown). Examples of arrangements of electronics packages that may include an embodiment of the quantum dot device package 300 are discussed below with reference to FIG. 83. The die 302 and/or the die 350 may be brought in contact with the package substrate 304 using a pick-and-place apparatus, for example, and a reflow or thermal compression bonding operation may be used to couple the die 302 and/or the die 350 to the package substrate 304 via the first-level interconnects 306 and/or the first-level interconnects 309, respectively.

The conductive contacts 365, 371, 379, and/or 399 may include multiple layers of material that may be selected to serve different purposes. In some embodiments, the conductive contacts 365, 371, 379, and/or 399 may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, the conductive contacts 365, 371, 379, and/or 399 may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal surface from oxidation before assembly, and the barrier metal may limit the diffusion of solder from the adjacent interconnects into the aluminum.

In some embodiments, the structures and materials in the quantum dot device 100 may be damaged if the quantum dot device 100 is exposed to the high temperatures that are common in conventional integrated circuit processing (e.g., greater than 100 degrees Celsius, or greater than 200 degrees Celsius). In particular, in embodiments in which the first-level interconnects 306/309 include solder, the solder may be a low temperature solder (e.g., a solder having a melting point below 100 degrees Celsius) so that it can be melted to couple the conductive contacts 365/371 and the conductive contacts 379 without having to expose the die 302 to higher temperatures and risk damaging the quantum dot device 100. Examples of solders that may be suitable include indium-based solders (e.g., solders including indium alloys). When low temperature solders are used, however, these solders may not be fully solid during handling of the quantum dot device package 300 (e.g., at room temperature or temperatures between room temperature and 100 degrees Celsius), and thus the solder of the first-level interconnects 306/309 alone may not reliably mechanically couple the die 302/die 350 and the package substrate 304 (and thus may not reliably electrically couple the die 302/die 350 and the package substrate 304). In some such embodiments, the quantum dot device package 300 may further include a mechanical stabilizer to maintain mechanical coupling between the die 302/die 350 and the package substrate 304, even when solder of the first-level interconnects 306/309 is not solid. Examples of mechanical stabilizers may include an underfill material disposed between the die 302/die 350 and the package substrate 304, a corner glue disposed between the die 302/die 350 and the package substrate 304, an overmold material disposed around the die 302/die 350 on the package substrate 304, and/or a mechanical frame to secure the die 302/die 350 and the package substrate 304.

In some embodiments of the quantum dot device package 300, the die 350 may not be included in the package 300; instead, the die 350 may be electrically coupled to the die 302 through another type of common physical support. For example, the die 350 may be separately packaged from the die 302 (e.g., the die 350 may be mounted to its own package substrate), and the two packages may be coupled together through an interposer, a printed circuit board, a bridge, a package-on-package arrangement, or in any other manner. Examples of device assemblies that may include the die 302 and the die 350 in various arrangements are discussed below with reference to FIG. 83.

FIGS. 82A-B are top views of a wafer 450 and dies 452 that may be formed from the wafer 450; the dies 452 may be included in any of the quantum dot device packages (e.g., the quantum dot device package 300) disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each die 452 is separated from the others to provide discrete "chips" of the semiconductor product. A die 452 may include one or more quantum dot devices 100 and/or supporting circuitry to route electrical signals to the quantum dot devices 100 (e.g., interconnects including conductive vias and lines), as well as any other integrated circuit (IC) components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 85) or other logic that is configured to store information in the memory devices or execute instructions stored in the memory array.

FIG. 83 is a cross-sectional side view of a device assembly 400 that may include any of the embodiments of the quantum dot device packages 300 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board. In some embodiments, the die 302 and the die 350 (FIG. 81) may be separately packaged and coupled together via the circuit board 402 (e.g., the conductive pathways 317 may run through the circuit board 402).

The device assembly 400 illustrated in FIG. 83 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 81), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. For example, the coupling components 418 may be the second-level interconnects 308. Although a single package 420 is shown in FIG. 83, multiple packages may be coupled to the interposer 404; indeed, additional interposers may be coupled to the interposer 404. The interposer 404 may provide an intervening substrate used to bridge the circuit board 402 and the package 420. The package 420 may be a quantum dot device package 300 or may be a conventional IC package, for example. In some embodiments, the package 420 may take the form of any of the embodiments of the quantum dot device package 300 disclosed herein, and may include a quantum dot device die 302 coupled to a package substrate 304 (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 83, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404. In some embodiments, a quantum dot device package 300 including the die 302 and the die 350 (FIG. 81) may be one of the packages disposed on an interposer like the interposer 404. In some embodiments, the die 302 and the die 350 (FIG. 81) may be separately packaged and coupled together via the interposer 404 (e.g., the conductive pathways 317 may run through the interposer 404).

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-group V compounds and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420.

The package 424 may be a quantum dot device package 300 (e.g., including the die 302 and the die 350, or just the die 302) or may be a conventional IC package, for example. In some embodiments, the package 424 may take the form of any of the embodiments of the quantum dot device package 300 disclosed herein, and may include a quantum dot device die 302 coupled to a package substrate 304 (e.g., by flip chip connections).

The device assembly 400 illustrated in FIG. 83 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a quantum dot device package 300 or may be a conventional IC package, for example. In some embodiments, one or both of the packages 426 and 432 may take the form of any of the embodiments of the quantum dot device package 300 disclosed herein, and may include a die 302 coupled to a package substrate 304 (e.g., by flip chip connections). In some embodiments, a quantum dot device package 300 including the die 302 and the die 350 (FIG. 81) may be one of the packages in a package-on-package structure like the package-on-package structure 434. In some embodiments, the die 302 and the die 350 (FIG. 81) may be separately packaged and coupled together using a package-on-package structure like the package-on-package structure 434 (e.g., the conductive pathways 317 may run through a package substrate of one or both of the packages of the dies 302 and 350).

Figure 84:
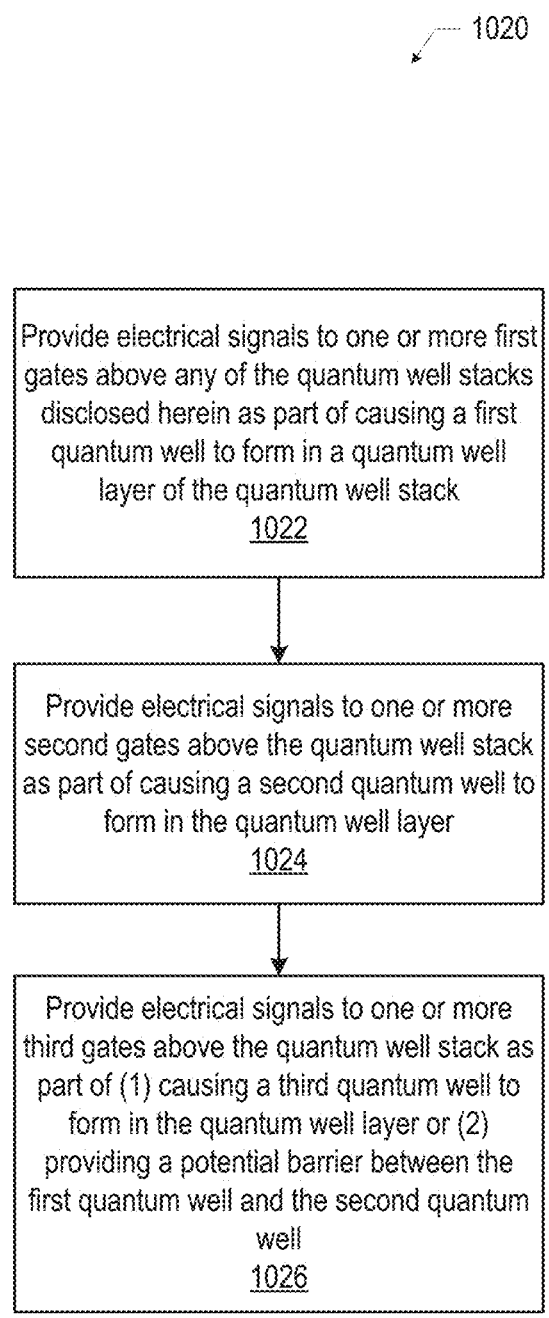
FIG. 84 is a flow diagram of an illustrative method of operating a quantum dot device, in accordance with various embodiments.

A number of techniques are disclosed herein for operating a quantum dot device 100. FIG. 84 is a flow diagram of a particular illustrative method 1020 of operating a quantum dot device, in accordance with various embodiments. Although the operations discussed below with reference to the method 1020 are illustrated in a particular order and depicted once each, these operations may be repeated or performed in a different order (e.g., in parallel), as suitable. Additionally, various operations may be omitted, as suitable. Various operations of the method 1020 may be illustrated with reference to one or more of the embodiments discussed above, but the method 1020 may be used to operate any suitable quantum dot device (including any suitable ones of the embodiments disclosed herein).

At 1022, electrical signals may be provided to one or more first gates disposed above a quantum well stack as part of causing a first quantum well to form in a quantum well layer in the quantum well stack. The quantum well stack may take the form of any of the embodiments disclosed herein (e.g., the quantum well stacks 146 discussed above with reference to FIGS. 42-44), and may be included in any of the quantum dot devices 100 disclosed herein. For example, a voltage may be applied to a gate 108-11 as part of causing a first quantum well (for a first quantum dot 142) to form in the quantum well stack 146 below the gate 108-11.

At 1024, electrical signals may be provided to one or more second gates disposed above the quantum well stack as part of causing a second quantum well to form in the quantum well layer. For example, a voltage may be applied to the gate 108-12 as part of causing a second quantum well (for a second quantum dot 142) to form in the quantum well stack 146 below the gate 108-12.

At 1026, electrical signals may be provided to one or more third gates disposed above the quantum well stack as part of (1) causing a third quantum well to form in the quantum well layer or (2) providing a potential barrier between the first quantum well and the second quantum well. For example, a voltage may be applied to the gate 106-12 as part of (1) causing a third quantum well (for a third quantum dot 142) to form in the quantum well stack 146 below the gate 106-12 (e.g., when the gate 106-12 acts as a "plunger"gate) or (2) providing a potential barrier between the first quantum well (under the gate 108-11) and the second quantum well (under the gate 108-12) (e.g., when the gate 106-12 acts as a "barrier" gate).

Figure 85:
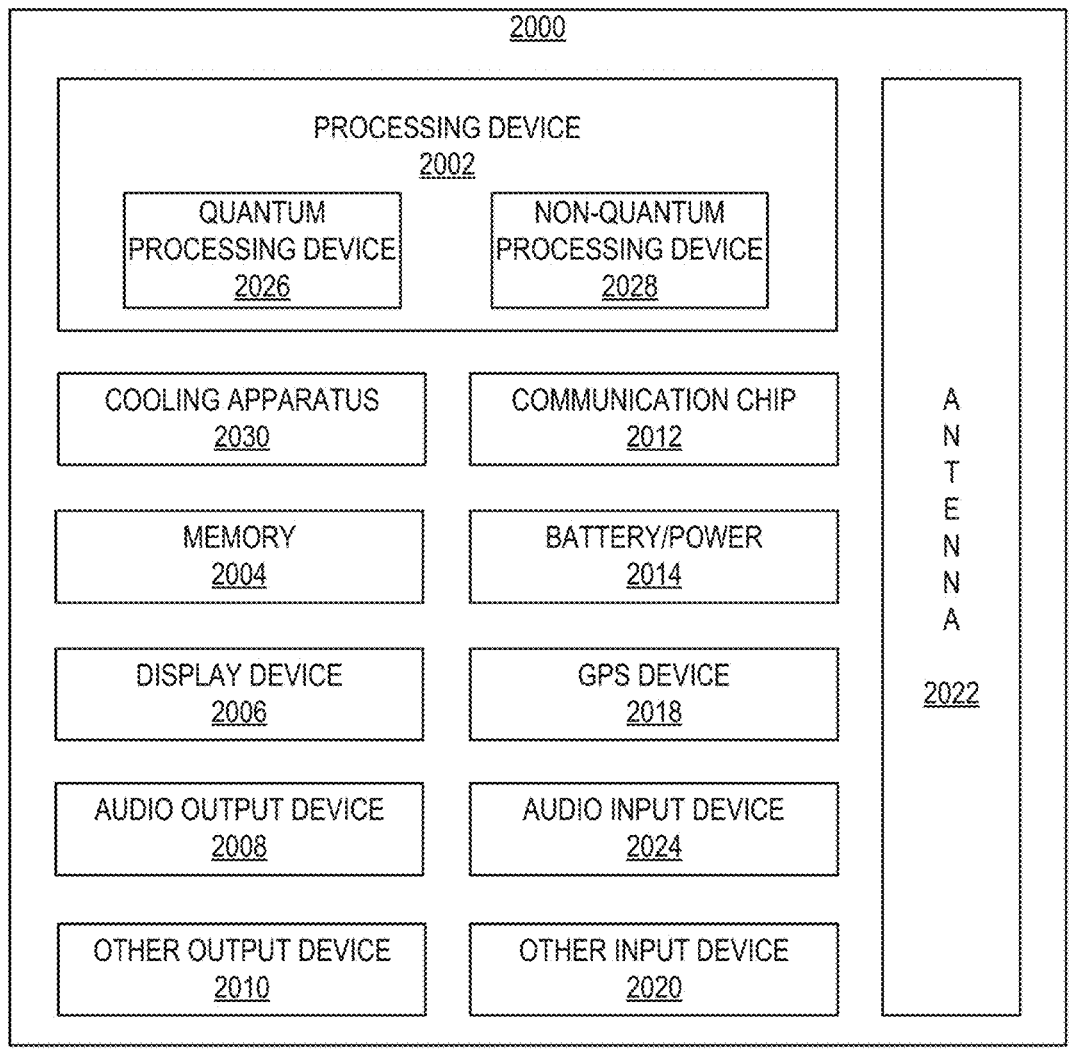
FIG. 85 is a block diagram of an example quantum computing device that may include any of the quantum dot devices disclosed herein, in accordance with various embodiments.

FIG. 85 is a block diagram of an example quantum computing device 2000 that may include any of the quantum dot devices disclosed herein. A number of components are illustrated in FIG. 85 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard). In some embodiments, various ones of these components may be fabricated onto a single SoC die. Additionally, in various embodiments, the quantum computing device 2000 may not include one or more of the components illustrated in FIG. 85, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters. For example, the quantum processing device 2026 may include circuitry (e.g., a current source) to provide current pulses to one or more magnet lines 121 included in the quantum dot device 100.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more DSPs, ASICs, central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., ROM), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-M RAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a GPS device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a quantum dot device, including: a quantum well stack; a layer of gate dielectric above the quantum well stack; a first gate metal and a second gate metal above the layer of gate dielectric; and a gate wall between the first gate metal and the second gate metal, wherein the gate wall is above the layer of gate dielectric, and the gate wall includes a first dielectric material and a second dielectric material different from the first dielectric material.

Example 2 may include the subject matter of Example 1, and may further specify that the second dielectric material includes silicon nitride.

Example 3 may include the subject matter of any of Examples 1-2, and may further specify that the first dielectric material is an etch stop material.

Example 4 may include the subject matter of any of Examples 1-3, and may further specify that the first dielectric material includes silicon carbide.

Example 5 may include the subject matter of any of Examples 1-3, and may further specify that the first dielectric material includes silicon nitride.

Example 6 may include the subject matter of any of Examples 1-5, and may further specify that the second dielectric material is a spacer.

Example 7 may include the subject matter of Example 6, and may further specify that the first dielectric material is between the second dielectric material and the layer of gate dielectric.

Example 8 may include the subject matter of Example 7, and may further specify that a thickness of the first dielectric material is between 3 nanometers and 8 nanometers.

Example 9 may include the subject matter of any of Examples 1-5, and may further specify that the first dielectric material is between the second dielectric material and the layer of gate dielectric.

Example 10 may include the subject matter of Example 9, and may further specify that a thickness of the first dielectric material is between 3 nanometers and 8 nanometers.

Example 11 may include the subject matter of any of Examples 1-5, and may further specify that the first gate metal is in contact with the first dielectric material and the second dielectric material, and the second gate metal is in contact with the first dielectric material and the second dielectric material.

Example 12 may include the subject matter of any of Examples 1-11, and may further specify that the layer of gate dielectric has a thickness between 3 nanometers and 20 nanometers.

Example 13 may include the subject matter of any of Examples 1-12, and may further specify that the layer of gate dielectric includes silicon oxide.

Example 14 may include the subject matter of any of Examples 1-13, and may further specify that the quantum well stack includes a quantum well layer, and the quantum well layer includes an isotopically purified material.

Example 15 may include the subject matter of Example 14, and may further specify that the isotopically purified material includes silicon.

Example 16 may include the subject matter of Example 15, and may further specify that the silicon includes 29Si in an amount less than 4 atomic-percent.

Example 17 may include the subject matter of Example 14, and may further specify that the layer of gate dielectric is on the quantum well layer.

Example 18 may include the subject matter of Example 14, and may further specify that the layer of gate dielectric includes isotopically purified silicon oxide.

Example 19 may include the subject matter of any of Examples 1-18, and may further specify that the layer of gate dielectric includes a recess, and the first gate metal is at least partially in the recess.

Example 20 may include the subject matter of Example 19, and may further specify that the recess has a depth between 5 Angstroms and 3 nanometers.

Example 21 may include the subject matter of any of Examples 1-20, and may further specify that the quantum well stack is at least partially included in a fin.

Example 22 may include the subject matter of any of Examples 1-20, and may further specify that the first gate metal and the second gate metal are at least partially disposed in a trench in an insulating material above the quantum well stack.

Example 23 is a method of operating a quantum dot device, including: providing electrical signals to one or more first gates above a quantum well stack as part of causing a first quantum well to form in a quantum well layer in the quantum well stack; providing electrical signals to one or more second gates above the quantum well stack as part of causing a second quantum well to form in the quantum well layer in the quantum well stack; and providing electrical signals to one or more third gates above the quantum well stack to (1) cause a third quantum well to form in the quantum well layer in the quantum well stack or (2) provide a potential barrier between the first quantum well and the second quantum well; wherein the first, second, and third gates individually include gate metal that is above a layer of gate dielectric, at least two of the first, second, or third gates have a gate wall between them, the gate wall includes a first dielectric material and a second dielectric material, and the first dielectric material is at least partially between the second dielectric material and the layer of gate dielectric.

Example 24 may include the subject matter of Example 23, and may further specify that the layer of gate dielectric includes an isotopically purified material.

Example 25 may include the subject matter of any of Examples 23-24, and may further include: populating the first quantum well with a quantum dot.

Example 26 is a method of manufacturing a quantum dot device, including: forming a quantum well stack; forming a layer of gate dielectric above the quantum well stack; forming a layer of shield dielectric on the layer of gate dielectric; depositing a dummy material above the layer of shield dielectric; patterning the dummy material into dummy gate metal portions; and forming spacers on sidewalls of the dummy gate metal portions, wherein the spacers are on the layer of shield dielectric.

Example 27 may include the subject matter of Example 26, and may further specify that the dummy material is a first dummy material, and the method further includes: depositing a second dummy material between the spacers; after depositing the second dummy material, removing the first dummy material; after removing the first dummy material, removing exposed portions of the layer of shield dielectric; and after removing exposed portions of the layer of shield dielectric, depositing a gate metal.

Example 28 may include the subject matter of Example 27, and may further specify that the exposed portions are first exposed portions, the gate metal is a first gate metal, and the method further includes: after depositing the first gate metal, removing the second dummy material; after removing the second dummy material, removing second exposed portions of the layer of shield dielectric; and after removing the second exposed portions of the layer of shield dielectric, depositing a second gate metal.

Example 29 may include the subject matter of Example 27, and may further include: forming recesses in the layer of gate dielectric at locations corresponding to the locations of the exposed portions of the layer of shield dielectric; wherein the gate metal is at least partially in the recesses.

Example 30 may include the subject matter of Example 26, and may further specify that the layer of shield dielectric includes silicon carbide or silicon nitride.

Example 31 may include the subject matter of any of Examples 26-30, and may further specify that the layer of gate dielectric includes an isotopically purified material.

Example 32 may include the subject matter of any of Examples 26-31, and may further specify that the spacers include silicon nitride.

Example 33 is a quantum computing device, including: a quantum processing device, wherein the quantum processing device includes a quantum well stack, the quantum processing device further includes a plurality of gates above the quantum well stack to control quantum dot formation in the quantum well stack, a layer of gate dielectric shared by at least two gates of the plurality of gates, a gate wall on the layer of gate dielectric between at least two gates, wherein the gate wall includes a first dielectric material and a second dielectric material different from the first dielectric material; and a non-quantum processing device, coupled to the quantum processing device, to control voltages applied to the plurality of gates.

Example 34 may include the subject matter of Example 33, and may further include: a memory device to store data generated by quantum dots formed in the quantum well stack during operation of the quantum processing device.

Example 35 may include the subject matter of Example 34, and may further specify that the memory device is to store instructions for a quantum computing algorithm to be executed by the quantum processing device.

Example 36 may include the subject matter of any of Examples 33-35, and may further include: a cooling apparatus to maintain a temperature of the quantum processing device below 5 Kelvin.

Example 37 may include the subject matter of any of Examples 33-36, and may further specify that the first dielectric material is between the second dielectric material and the layer of gate dielectric.

Example 38 may include the subject matter of any of Examples 33-37, and may further specify that the layer of gate dielectric includes an isotopically purified material.

Example 39 is a quantum dot device, including: a quantum well stack; a layer of gate dielectric above the quantum well stack; a first gate metal and a second gate metal above the layer of gate dielectric; and a gate wall between the first gate metal and the second gate metal; wherein the layer of gate dielectric includes a recess, and the first gate metal is at least partially in the recess.

Example 40 may include the subject matter of Example 39, and may further specify that the recess has a depth between 5 Angstroms and 3 nanometers.

Example 41 may include the subject matter of any of Examples 39-40, and may further specify that the gate wall includes a spacer.

Example 42 may include the subject matter of any of Examples 39-41, and may further specify that the gate wall includes silicon nitride.

Example 43 may include the subject matter of any of Examples 39-42, and may further specify that the layer of gate dielectric has a thickness between 3 nanometers and 20 nanometers.

Example 44 may include the subject matter of any of Examples 39-43, and may further specify that the layer of gate dielectric includes silicon oxide.

Example 45 may include the subject matter of any of Examples 39-44, and may further specify that the quantum well stack includes a quantum well layer, and the quantum well layer includes an isotopically purified material.

Example 46 may include the subject matter of Example 45, and may further specify that the isotopically purified material includes silicon.

Example 47 may include the subject matter of Example 46, and may further specify that the silicon includes 29Si in an amount less than 4 atomic-percent.

Example 48 may include the subject matter of any of Examples 45-47, and may further specify that the layer of gate dielectric is on the quantum well layer.

Example 49 may include the subject matter of any of Examples 45-47, and may further specify that the layer of gate dielectric includes isotopically purified silicon oxide.

Example 50 may include the subject matter of any of Examples 39-49, and may further specify that the quantum well stack is at least partially included in a fin.

Example 51 may include the subject matter of any of Examples 39-49, and may further specify that the first gate metal and the second gate metal are at least partially disposed in a trench in an insulating material above the quantum well stack.

The invention claimed is:

1. A quantum dot device, comprising:
   a quantum well stack;
   a layer of gate dielectric above the quantum well stack;
   a first gate metal and a second gate metal above the layer of gate dielectric; and
   a gate wall between the first gate metal and the second gate metal, wherein the gate wall is above the layer of gate dielectric, and the gate wall includes a first dielectric material and a second dielectric material different from the first dielectric material.

2. The quantum dot device of claim 1, wherein the second dielectric material includes silicon nitride.

3. The quantum dot device of claim 1, wherein the first dielectric material includes silicon carbide.

4. The quantum dot device of claim 1, wherein the first dielectric material includes silicon nitride.

5. The quantum dot device of claim 1, wherein the first dielectric material is between the second dielectric material and the layer of gate dielectric.

6. The quantum dot device of claim 1, wherein the first dielectric material is between the second dielectric material and the layer of gate dielectric.

7. The quantum dot device of claim 1, wherein the first gate metal is in contact with the first dielectric material and the second dielectric material, and the second gate metal is in contact with the first dielectric material and the second dielectric material.

8. The quantum dot device of claim 1, wherein the layer of gate dielectric includes silicon oxide.

9. The quantum dot device of claim 1, wherein the quantum well stack includes a quantum well layer, and the quantum well layer includes an isotopically purified material.

10. The quantum dot device of claim 9, wherein the isotopically purified material includes silicon.

11. The quantum dot device of claim 1, wherein the layer of gate dielectric includes a recess, and the first gate metal is at least partially in the recess.

12. The quantum dot device of claim 1, wherein the quantum well stack is at least partially included in a fin.

13. The quantum dot device of claim 1, wherein the first gate metal and the second gate metal are at least partially disposed in a trench in an insulating material above the quantum well stack.

14. A quantum computing device, comprising:
   a quantum processing device, wherein the quantum processing device includes a quantum well stack, the quantum processing device further includes a plurality of gates above the quantum well stack to control quantum dot formation in the quantum well stack, a layer of gate dielectric shared by at least two gates of the plurality of gates, a gate wall on the layer of gate dielectric between at least two gates, wherein the gate wall includes a first dielectric material and a second dielectric material different from the first dielectric material; and
   a non-quantum processing device, coupled to the quantum processing device, to control voltages applied to the plurality of gates.

15. The quantum computing device of claim 14, further comprising:
   a memory device to store data generated by quantum dots formed in the quantum well stack during operation of the quantum processing device.

16. The quantum computing device of claim 15, wherein the memory device is to store instructions for a quantum computing algorithm to be executed by the quantum processing device.

17. A quantum dot device, comprising:
   a quantum well stack;
   a layer of gate dielectric above the quantum well stack;
   a first gate metal and a second gate metal above the layer of gate dielectric; and
   a gate wall between the first gate metal and the second gate metal;
   wherein the layer of gate dielectric includes a recess, and the first gate metal is at least partially in the recess.

18. The quantum dot device of claim 17, wherein the recess has a depth between 5 Angstroms and 3 nanometers.

19. The quantum dot device of claim 17, wherein the gate wall includes a spacer.

20. The quantum dot device of claim 17, wherein the gate wall includes silicon nitride.

21. The quantum dot device of claim 17, wherein the layer of gate dielectric has a thickness between 3 nanometers and 20 nanometers.

* * * * *